United States Patent
Lin et al.

(10) Patent No.: US 7,446,419 B1
(45) Date of Patent: Nov. 4, 2008

(54) SEMICONDUCTOR CHIP ASSEMBLY WITH WELDED METAL PILLAR OF STACKED METAL BALLS

(75) Inventors: Charles W. C. Lin, Singapore (SG); Chia-Chung Wang, Hsinchu (TW)

(73) Assignee: Bridge Semiconductor Corporation, Taipei (TW)

( * ) Notice: Subject to any disclaimer, the term of this patent is extended or adjusted under 35 U.S.C. 154(b) by 159 days.

(21) Appl. No.: 11/588,012

(22) Filed: Oct. 26, 2006

Related U.S. Application Data

(63) Continuation-in-part of application No. 11/472,703, filed on Jun. 22, 2006, now Pat. No. 7,268,421, which is a continuation of application No. 10/985,579, filed on Nov. 10, 2004, now Pat. No. 7,071,573, application No. 11/588,012.

(60) Provisional application No. 60/784,041, filed on Mar. 20, 2006.

(51) Int. Cl.
*H01L 23/48* (2006.01)

(52) U.S. Cl. ........................ 257/777; 438/106

(58) Field of Classification Search .............. 257/777; 438/106
See application file for complete search history.

(56) References Cited

U.S. PATENT DOCUMENTS

| | | | |
|---|---|---|---|
| 4,442,967 A | 4/1984 | van de Pas et al. | 228/159 |
| 4,661,192 A | 4/1987 | McShane | 156/292 |
| 4,717,066 A | 1/1988 | Goldenberg et al. | 228/179 |
| 4,750,666 A | 6/1988 | Neugebauer et al. | 228/160 |
| 4,807,021 A | 2/1989 | Okumura | 357/75 |
| 4,925,083 A | 5/1990 | Farassat et al. | 228/102 |
| 4,937,653 A | 6/1990 | Blonder et al. | 357/68 |
| 4,955,523 A | 9/1990 | Calomagno et al. | 228/179 |
| 4,970,571 A | 11/1990 | Yamakawa et al. | 357/71 |
| 4,984,358 A | 1/1991 | Nelson | 29/830 |
| 5,014,111 A | 5/1991 | Tsuda et al. | 357/68 |
| 5,060,843 A | 10/1991 | Yasuzato et al. | 228/179 |
| 5,074,947 A | 12/1991 | Estes et al. | 156/307.3 |
| 5,090,119 A | 2/1992 | Tsuda et al. | 29/843 |
| 5,106,461 A | 4/1992 | Volfson et al. | 205/125 |
| 5,116,463 A | 5/1992 | Lin et al. | 156/653 |

(Continued)

FOREIGN PATENT DOCUMENTS

EP 0 718 882 A1 6/1996

(Continued)

OTHER PUBLICATIONS

Markstein et al., "Controlling the Variables in Stencil Printing," Electronic Packaging & Production, Feb. 1997, pp. 48-56.

(Continued)

*Primary Examiner*—Thao Le
(74) *Attorney, Agent, or Firm*—David M. Sigmond

(57) ABSTRACT

A semiconductor chip assembly includes a semiconductor chip that includes a conductive pad, a conductive trace that includes a routing line and a metal pillar, a connection joint that electrically connects the routing line and the pad, and an encapsulant. The chip and the metal pillar are embedded in the encapsulant, the routing line extends laterally beyond the metal pillar towards the chip, and the metal pillar is welded to the routing line and includes stacked metal balls that are welded together.

150 Claims, 48 Drawing Sheets

U.S. PATENT DOCUMENTS

| | | | |
|---|---|---|---|
| 5,137,845 A | 8/1992 | Lochon et al. | 437/183 |
| 5,167,992 A | 12/1992 | Lin et al. | 427/437 |
| 5,172,851 A | 12/1992 | Matsushita et al. | 228/179 |
| 5,196,371 A | 3/1993 | Kulesza et al. | 437/183 |
| 5,209,817 A | 5/1993 | Ahmad et al. | 156/643 |
| 5,237,130 A | 8/1993 | Kulesza et al. | 174/260 |
| 5,260,234 A | 11/1993 | Long | 437/203 |
| 5,261,593 A | 11/1993 | Casson et al. | 228/180.22 |
| 5,275,330 A | 1/1994 | Isaacs et al. | 228/180.2 |
| 5,284,796 A | 2/1994 | Nakanishi et al. | 437/183 |
| 5,293,067 A | 3/1994 | Thompson et al. | 257/668 |
| 5,294,038 A | 3/1994 | Nakano et al. | 228/179.1 |
| 5,327,010 A | 7/1994 | Uenaka et al. | 257/679 |
| 5,334,804 A | 8/1994 | Love et al. | 174/267 |
| 5,346,750 A | 9/1994 | Hatakeyama et al. | 428/209 |
| 5,355,283 A | 10/1994 | Marrs et al. | 361/760 |
| 5,358,621 A | 10/1994 | Oyama | 205/123 |
| 5,364,004 A | 11/1994 | Davidson | 228/1.1 |
| 5,397,921 A | 3/1995 | Karnezos | 257/779 |
| 5,407,864 A | 4/1995 | Kim | 437/203 |
| 5,424,245 A | 6/1995 | Gurtler et al. | 437/183 |
| 5,438,477 A | 8/1995 | Pasch | 361/689 |
| 5,439,162 A | 8/1995 | George et al. | 228/180.22 |
| 5,447,886 A | 9/1995 | Rai | 437/183 |
| 5,454,161 A | 10/1995 | Beilin et al. | 29/852 |
| 5,454,928 A | 10/1995 | Rogers et al. | 205/125 |
| 5,475,236 A | 12/1995 | Yoshizaki | 257/48 |
| 5,477,933 A | 12/1995 | Nguyen | 174/262 |
| 5,478,007 A | 12/1995 | Marrs | 228/180.22 |
| 5,483,421 A | 1/1996 | Gedney et al. | 361/771 |
| 5,484,647 A | 1/1996 | Nakatani et al. | 428/209 |
| 5,485,949 A | 1/1996 | Tomura et al. | 228/180.5 |
| 5,487,218 A | 1/1996 | Bhatt et al. | 29/852 |
| 5,489,804 A | 2/1996 | Pasch | 257/778 |
| 5,493,096 A | 2/1996 | Koh | 219/121.71 |
| 5,508,229 A | 4/1996 | Baker | 437/183 |
| 5,525,065 A | 6/1996 | Sobhani | 439/67 |
| 5,536,973 A | 7/1996 | Yamaji | 257/737 |
| 5,542,601 A | 8/1996 | Fallon et al. | 228/119 |
| 5,547,740 A | 8/1996 | Higdon et al. | 428/209 |
| 5,556,810 A | 9/1996 | Fujitsu | 437/209 |
| 5,556,814 A | 9/1996 | Inoue et al. | 437/230 |
| 5,564,181 A | 10/1996 | Dineen et al. | 29/841 |
| 5,572,069 A | 11/1996 | Schneider | 257/690 |
| 5,576,052 A | 11/1996 | Arledge et al. | 427/98 |
| 5,583,073 A | 12/1996 | Lin et al. | 439/183 |
| 5,595,943 A | 1/1997 | Itabashi et al. | 437/230 |
| 5,599,744 A | 2/1997 | Koh et al. | 437/195 |
| 5,611,140 A | 3/1997 | Kulesza et al. | 29/832 |
| 5,611,884 A | 3/1997 | Bearinger et al. | 156/325 |
| 5,613,296 A | 3/1997 | Kurino et al. | 29/852 |
| 5,614,114 A | 3/1997 | Owen | 219/121.66 |
| 5,615,477 A | 4/1997 | Sweitzer | 29/840 |
| 5,619,791 A | 4/1997 | Lambrecht, Jr. et al. | 29/852 |
| 5,627,405 A | 5/1997 | Chillara | 257/668 |
| 5,627,406 A | 5/1997 | Pace | 257/700 |
| 5,633,204 A | 5/1997 | Tago et al. | 438/614 |
| 5,637,920 A | 6/1997 | Loo | 257/700 |
| 5,641,113 A | 6/1997 | Somaki et al. | 228/180.22 |
| 5,645,628 A | 7/1997 | Endo et al. | 106/1.23 |
| 5,646,067 A | 7/1997 | Gaul | 437/180 |
| 5,648,686 A | 7/1997 | Hirano et al. | 257/778 |
| 5,654,584 A | 8/1997 | Fujitsu | 257/666 |
| 5,656,858 A | 8/1997 | Kondo et al. | 257/737 |
| 5,663,598 A | 9/1997 | Lake et al. | 257/737 |
| 5,665,652 A | 9/1997 | Shimizu | 438/127 |
| 5,666,008 A | 9/1997 | Tomita et al. | 257/778 |
| 5,669,545 A | 9/1997 | Pham et al. | 228/1.1 |
| 5,674,785 A | 10/1997 | Akram et al. | 437/217 |
| 5,674,787 A | 10/1997 | Zhao et al. | 437/230 |
| 5,682,061 A | 10/1997 | Khandros et al. | 257/666 |
| 5,686,353 A | 11/1997 | Yagi et al. | 437/183 |
| 5,691,041 A | 11/1997 | Frankeny et al. | 428/209 |
| 5,722,162 A | 3/1998 | Chou et al. | 29/852 |
| 5,723,369 A | 3/1998 | Barber | 438/106 |
| 5,731,223 A | 3/1998 | Padmanabhan | 437/183 |
| 5,736,456 A | 4/1998 | Akram | 438/614 |
| 5,739,585 A | 4/1998 | Akram et al. | 257/698 |
| 5,744,827 A | 4/1998 | Jeong et al. | 257/686 |
| 5,744,859 A | 4/1998 | Ouchida | 257/668 |
| 5,757,071 A | 5/1998 | Bhansali | 257/697 |
| 5,757,081 A | 5/1998 | Chang et al. | 257/778 |
| 5,764,486 A | 6/1998 | Pendse | 361/774 |
| 5,774,340 A | 6/1998 | Chang et al. | 361/771 |
| 5,789,271 A | 8/1998 | Akram | 438/18 |
| 5,798,285 A | 8/1998 | Bentlage et al. | 438/108 |
| 5,801,072 A | 9/1998 | Barber | 438/107 |
| 5,801,447 A | 9/1998 | Hirano et al. | 257/778 |
| 5,803,340 A | 9/1998 | Yeh et al. | 228/56.3 |
| 5,804,771 A | 9/1998 | McMahon et al. | 174/255 |
| 5,808,360 A | 9/1998 | Akram | 257/738 |
| 5,811,879 A | 9/1998 | Akram | 257/723 |
| 5,813,115 A | 9/1998 | Misawa et al. | 29/832 |
| 5,817,541 A | 10/1998 | Averkiou et al. | 438/107 |
| 5,822,856 A | 10/1998 | Bhatt et al. | 29/832 |
| 5,834,844 A | 11/1998 | Akagawa et al. | 257/734 |
| 5,854,507 A | 12/1998 | Miremadi et al. | 257/686 |
| 5,861,666 A | 1/1999 | Bellaar | 257/686 |
| 5,863,816 A | 1/1999 | Cho | 438/123 |
| 5,870,289 A | 2/1999 | Tokuda et al. | 361/779 |
| 5,883,435 A | 3/1999 | Geffken et al. | 257/758 |
| 5,925,931 A | 7/1999 | Yamamoto | 257/737 |
| 5,973,393 A | 10/1999 | Chia et al. | 257/690 |
| 5,994,222 A | 11/1999 | Smith et al. | 438/689 |
| 6,001,671 A | 12/1999 | Fjelstad | 438/112 |
| 6,012,224 A | 1/2000 | DiStefano et al. | 29/840 |
| 6,013,877 A | 1/2000 | Degani et al. | 174/264 |
| 6,017,812 A | 1/2000 | Yonezawa et al. | 438/613 |
| 6,018,196 A | 1/2000 | Noddin | 257/777 |
| 6,020,561 A | 2/2000 | Ishida et al. | 174/261 |
| 6,025,650 A | 2/2000 | Tsuji et al. | 257/786 |
| 6,037,665 A | 3/2000 | Miyazaki | 257/773 |
| 6,046,909 A | 4/2000 | Joy | 361/748 |
| 6,072,233 A | 6/2000 | Corisis et al. | 257/686 |
| 6,084,297 A | 7/2000 | Brooks et al. | 257/698 |
| 6,084,781 A | 7/2000 | Klein | 361/771 |
| 6,088,236 A | 7/2000 | Tomura et al. | 361/783 |
| 6,103,552 A | 8/2000 | Lin | 438/113 |
| 6,103,992 A | 8/2000 | Noddin | 219/121.71 |
| 6,127,204 A | 10/2000 | Isaacs et al. | 438/106 |
| 6,159,770 A | 12/2000 | Tetaka et al. | 438/112 |
| 6,180,881 B1 | 1/2001 | Isaak | 174/52.4 |
| 6,188,127 B1 | 2/2001 | Senba et al. | 257/686 |
| 6,214,642 B1 | 4/2001 | Chen et al. | 438/108 |
| 6,218,728 B1 | 4/2001 | Kimura | 257/693 |
| 6,303,997 B1 | 10/2001 | Lee | 257/778 |
| 6,336,269 B1 | 1/2002 | Eldridge et al. | 29/885 |
| 6,483,718 B2 | 11/2002 | Hashimoto | 361/803 |
| 6,504,241 B1 | 1/2003 | Yanagida | 257/686 |
| 6,608,371 B2 | 8/2003 | Kurashima et al. | 257/686 |
| 6,653,170 B1 * | 11/2003 | Lin | 438/117 |

FOREIGN PATENT DOCUMENTS

| | | |
|---|---|---|
| WO | WO 97/38563 | 10/1997 |
| WO | WO 99/57762 | 11/1999 |

OTHER PUBLICATIONS

Elenius, "Choosing a Flip Chip Bumping Supplier—Technology an IC Package contractor should look for," Advanced Packaging, Mar./Apr. 1998, pp. 70-73.

Erickson, "Wafer Bumping: The Missing Link for DCA," Electronic Packaging & Production, Jul. 1998, pp. 43-46.

Kuchenmeister et al., "Film Chip Interconnection Systems Prepared By Wet Chemical Metallization," IEEE publication 0-7803-4526-6/98, Jun. 1998, 5 pages.

Ghaffarian, "Long Time BGA Assembly Reliability," Advancing Microelectronics, vol. 25, No. 6, Sep./Oct. 1998, pp. 20-23.

U.S. Appl. No. 09/465,024, filed Dec. 16, 1999, entitled "Bumpless Flip Chip Assembly With Solder Via".

U.S. Appl. No. 09/464,562, filed Dec. 16, 1999, entitled "Bumpless Flip Chip Assembly With Strips And Via-Fill".

U.S. Appl. No. 09/464,561, filed Dec. 16, 1999, entitled "Bumpless Flip Chip Assembly With Strips-In-Via And Plating".

U.S. Appl. No. 09/120,408, filed Jul. 22, 1998, entitled "Flip Chip Assembly With Via Interconnection".

U.S. Appl. No. 09/643,212, filed Aug. 22, 2000, entitled "Semiconductor Chip Assembly With Simultaneously Electroplated Contact Terminal and Connection Joint".

U.S. Appl. No. 09/643,214, filed Aug. 22, 2000, entitled "Semiconductor Chip Assembly With Simultaneously Electrolessly Plated Contact Terminal and Connection Joint".

U.S. Appl. No. 09/643,213, filed Aug. 22, 2000, entitled "Method Of Making A Support Circuit For A Semiconductor Chip Assembly".

U.S. Appl. No. 09/643,445, filed Aug. 22, 2000, entitled "Method Of Making A Semiconductor Chip Assembly".

U.S. Appl. No. 09/665,928, filed Sep. 20, 2000, entitled "Semiconductor Chip Assembly With Ball Bond Connection Joint".

U.S. Appl. No. 09/665,931, filed Sep. 20, 2000, entitled "Method Of Making A Support Circuit With A Tapered Through-Hole For A Semiconductor Chip Assembly".

U.S. Appl. No. 09/677,207, filed Oct. 2, 2000, entitled "Method Of Making A Semiconductor Chip Assembly With A Conducive Trace Subtractively Formed Before And After Chip Attachment".

U.S. Appl. No. 09/865,367, filed May 24, 2001, entitled "Semiconductor Chip Assembly With Simultaneously Electroplated Contact Terminal and Connection Joint".

U.S. Appl. No. 09/864,555, filed May 24, 2001, entitled "Semiconductor Chip Assembly With Simultaneously Electrolessly Plated Contact Terminal and Connection Joint".

U.S. Appl. No. 09/864,773, filed May 24, 2001, entitled "Semiconductor Chip Assembly With Ball Bond Connection Joint".

U.S. Appl. No. 10/714,794, filed Nov. 17, 2003, entitled "Semiconductor Chip Assembly With Embedded Metal Pillar".

* cited by examiner

SEMICONDUCTOR CHIP ASSEMBLY WITH WELDED METAL PILLAR OF STACKED METAL BALLS

CROSS-REFERENCE TO RELATED APPLICATIONS

This application is a continuation-in-part of U.S. application Ser. No. 11/472,703 filed Jun. 22, 2006, now U.S. Pat. No. 7,268,421, which is a continuation of U.S. application Ser. No. 10/985,579 filed Nov. 10, 2004, now U.S. Pat. No. 7,071,573.

This application also claims the benefit of U.S. Provisional Application Ser. No. 60/784,041 filed Mar. 20, 2006.

BACKGROUND OF THE INVENTION

1. Field of the Invention

The present invention relates to a semiconductor chip assembly, and more particularly to a semiconductor chip assembly with a welded metal pillar and its method of manufacture.

2. Description of the Related Art

Semiconductor chips have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding.

Wire bonding is by far the most common and economical connection technique. In this approach, wires are bonded, one at a time, from the chip to external circuitry by thermocompression, thermosonic or ultrasonic processes. In thermocompression bonding, fine gold wire is fed from a spool through a clamp and a capillary. A thermal source is swept past an end of the wire to form a wire ball that protrudes from the capillary. The chip or capillary is then heated to about 200 to 300° C., the capillary is brought down over an aluminum pad, the capillary exerts pressure on the wire ball, and the wire ball forms a ball bond on the pad. The capillary is then raised and moved to a terminal on the support circuit, the capillary is brought down again, and the combination of force and temperature forms a wedge bond between the wire and the terminal. Thus, the connection between the pad and the terminal includes the ball bond (which only contacts the pad), the wedge bond (which only contacts the terminal) and the wire between the bonds. After raising the capillary again, the wire is ripped from the wedge bond, the thermal source is swept past the wire to form a new wire ball, and the process is repeated for other pads on the chip. Thermosonic bonding is similar to thermocompression bonding but adds ultrasonic vibration as the ball and wedge bonds are formed so that less heat is necessary. Ultrasonic bonding uses aluminum wire to form wedge bonds without applying heat. There are many variations on these basic methods.

TAB involves bonding gold-bumped pads on the chip to external circuitry on a polymer tape using thermocompression bonding. TAB requires mechanical force such as pressure or a burst of ultrasonic vibration and elevated temperature to accomplish metallurgical welding between the wires or bumps and the designated surface.

Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Organic conductive adhesive bumps with conductive fillers in polymer binders have been used in place of solder bumps, but they do not normally form a metallurgical interface in the classical sense. A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used.

While flip-chip technology has tremendous advantages over wire bonding and TAB, its cost and technical limitations are significant. For instance, the cost of forming bumps on the pads is significant. In addition, an adhesive is normally underfilled between the chip and the support circuit to reduce stress on the solder joints due to thermal mismatch between the chip and the support circuit, and the underfilling process increases both manufacturing complexity and cost.

Other techniques besides wire bonding, TAB and flip-chip technologies have been developed to provide connection joints that electrically connect pads on chips to external conductive traces. These connection joints can be formed by electroplated metal, electrolessly plated metal, solder or conductive adhesive.

Electroplating provides deposition of an adherent metallic coating onto a conductive object placed into an electrolytic bath composed of a solution of the salt of the metal to be plated. Using the terminal as an anode (possibly of the same metal as the one used for plating), a DC current is passed through the solution affecting transfer of metal ions onto the cathode surface. As a result, the metal continually electroplates on the cathode surface. Electroplating using AC current has also been developed. Electroplating is relatively fast and easy to control. However, a plating bus is needed to supply current where electroplating is desired. The plating bus creates design constraints and must be removed after the electroplating occurs. Non-uniform plating may arise at the bottom of relatively deep through-holes due to poor current density distribution. Furthermore, the electrolytic bath is relatively expensive.

Electroless plating provides metal deposition by an exchange reaction between metal complexes in a solution and a catalytic metal that activates or initiates the reaction. As a result, the electroless metal continually plates (i.e., deposits or grows) on the catalytic metal. Advantageously, the reaction does not require externally applied electric current. Therefore, electroless plating can proceed without a plating bus. However, electroless plating is relatively slow. Furthermore, the electroless bath is relatively expensive.

Solder joints are relatively inexpensive, but exhibit increased electrical resistance as well as cracks and voids over time due to fatigue from thermo-mechanical stresses. Further, the solder is typically a tin-lead alloy and lead-based materials are becoming far less popular due to environmental concerns over disposing of toxic materials and leaching of toxic materials into ground water supplies.

Conductive adhesive joints with conductive fillers in polymer binders are relatively inexpensive, but do not normally form a metallurgical interface in the classical sense. Moisture penetration through the polymer binder may induce corrosion or oxidation of the conductive filler particles resulting in an unstable electrical connection. Furthermore, the polymer binder and the conductive filler may degrade leading to an unstable electrical connection. Thus, the conductive adhesive may have adequate mechanical strength but poor electrical characteristics.

Accordingly, each of these connection joint techniques has various advantages and disadvantages. The optimal approach for a given application depends on design, reliability and cost considerations.

The semiconductor chip assembly is subsequently connected to another circuit such as a printed circuit board (PCB) or mother board during next level assembly. Different semiconductor assemblies are connected to the next level assembly in different ways. For instance, ball grid array (BGA) packages contain an array of solder balls, and land grid array (LGA) packages contain an array of metal pads that receive corresponding solder traces on the PCB.

Thermo-mechanical wear or creep of the solder joints that connect the semiconductor chip assembly to the next level assembly is a major cause of failure in most board assemblies. This is because non-uniform thermal expansion and/or contraction of different materials causes mechanical stress on the solder joints.

Thermal mismatch induced solder joint stress can be reduced by using materials having a similar coefficient of thermal expansion (CTE). However, due to large transient temperature differences between the chip and other materials during power-up of the system, the induced solder joint stress makes the assembly unreliable even when the chip and the other materials have closely matched thermal expansion coefficients.

Thermal mismatch induced solder joint stress can also be reduced by proper design of the support circuit. For instance, BGA and LGA packages have been designed with pillar post type contact terminals that extend above the package and act as a stand-off or spacer between the package and the PCB in order to absorb thermal stress and reduce solder joint fatigue. The higher the aspect ratio of the pillar, the more easily the pillar can flex to follow expansion of the two ends and reduce shear stress.

Conventional approaches to forming the pillar either on a wafer or a separate support circuit include a bonded interconnect process (BIP) and plating using photoresist.

BIP forms a gold ball on a pad of the chip and a gold pin extending upwardly from the gold ball using a thermocompression wire bonder. Thereafter, the gold pin is brought in contact with a molten solder bump on a support circuit, and the solder is reflowed and cooled to form a solder joint around the gold pin. A drawback to this approach is that when the wire bonder forms the gold ball on the pad it applies substantial pressure to the pad which might destroy active circuitry beneath the pad. In addition, gold from the pin can dissolve into the solder to form a gold-tin intermetallic compound which mechanically weakens the pin and therefore reduces reliability.

U.S. Pat. No. 5,722,162 discloses fabricating a pillar by electroplating the pillar on a selected portion of an underlying metal exposed by an opening in photoresist and then stripping the photoresist. Although it is convenient to use photoresist to define the location of the pillar, electroplating the pillar in an opening in the photoresist has certain drawbacks. First, the photoresist is selectively exposed to light that initiates a reaction in regions of the photoresist that correspond to the desired pattern. Since photoresist is not fully transparent and tends to absorb the light, the thicker the photoresist, the poorer the penetration efficiency of the light. As a result, the lower portion of the photoresist might not receive adequate light to initiate or complete the intended photo-reaction. Consequently, the bottom portion of the opening in the photoresist might be too narrow, causing a pillar formed in the narrowed opening to have a diameter that decreases with decreasing height. Such a pillar has a high risk of fracturing at its lower portion in response to thermally induced stress. Furthermore, photoresist residue on the underlying metal might cause the pillar to have poor quality or even prevent the pillar from being formed. Second, if the photoresist is relatively thick (such as 100 microns or more), the photoresist may need to be applied with multiple coatings and receive multiple light exposures and bakes, which increases cost and reduces yield. Third, if the photoresist is relatively thick, the electroplated pillar may be non-uniform due to poor current density distribution in the relatively deep opening. As a result, the pillar may have a jagged or pointed top surface instead of a flat top surface that is better suited for providing a contact terminal for the next level assembly.

In view of the various development stages and limitations in currently available semiconductor chip assemblies, there is a need for a semiconductor chip assembly that is cost-effective, reliable, manufacturable, versatile, provides a vertical conductor with excellent mechanical and electrical properties, and makes advantageous use the particular connection joint technique best suited for a given application.

SUMMARY OF THE INVENTION

An object of the present invention is to provide a semiconductor chip assembly with a chip and a conductive trace that provides a low cost, high performance, high reliability package.

Another object of the present invention is to provide a convenient, cost-effective method for manufacturing a semiconductor chip assembly.

Generally speaking, the present invention provides a semiconductor chip assembly that includes a semiconductor chip that includes a conductive pad, a conductive trace that includes a routing line and a metal pillar, a connection joint that electrically connects the routing line and the pad, and an encapsulant. The chip and the metal pillar are embedded in the encapsulant, the routing line extends laterally beyond the metal pillar towards the chip, and the metal pillar is welded to the routing line and includes stacked metal balls that are welded together.

Generally speaking, the present invention also provides a method of making a semiconductor chip assembly that includes mechanically attaching a semiconductor chip that includes a conductive pad to a routing line, forming a connection joint that electrically connects the routing line and the pad, forming a metal pillar including welding a first metal ball to the routing line and then welding a second metal ball to the first metal ball, wherein the routing line extends laterally beyond the metal pillar towards the chip, and forming an encapsulant after attaching the chip to the routing line and forming the metal pillar, wherein the chip and the metal pillar are embedded in the encapsulant.

In accordance with an aspect of the invention, a semiconductor chip assembly includes a semiconductor chip that includes first and second opposing surfaces, wherein the first surface of the chip includes a conductive pad, a conductive trace that includes a routing line and a metal pillar, a connection joint that electrically connects the routing line and the pad, and an encapsulant that includes first and second opposing surfaces, wherein the first surface of encapsulant faces in a first direction, the second surface of the encapsulant faces in a second direction opposite the first direction, the chip, the metal pillar and the encapsulant extend vertically beyond the routing line in the first direction, the routing line extends laterally beyond the metal pillar towards the chip and extends vertically beyond the chip and the metal pillar in the second direction, the metal pillar is disposed outside a periphery of the chip, is metallurgically welded to the routing line, extends vertically across most or all of a thickness of the chip between the first and second surfaces of the chip and consists of stacked metal balls that are metallurgically welded together, and the chip and the metal balls are embedded in the encapsulant.

The chip can be the only chip embedded in the encapsulant, or alternatively, multiple chips can be embedded in the encapsulant. The first surface of the chip can face in the first direction and the second surface of the chip can face in the second direction, or alternatively, the first surface of the chip can face in the second direction and the second surface of the chip can face in the first direction.

The routing line can be disposed vertically beyond the chip and the metal pillar in the second direction. The routing line can extend within and outside the periphery of the chip, or alternatively, be disposed outside the periphery of the chip. Furthermore, the routing line can be in an electrically conductive path between the metal pillar and any chip embedded in the encapsulant. That is, any chip embedded in the encapsulant can be electrically connected to the metal pillar by an electrically conductive path that includes the routing line.

The metal pillar can extend vertically beyond the chip in the first direction, and can extend vertically beyond the chip in the second direction. The metal pillar can extend across most or all of a thickness of any chip embedded in the encapsulant. Likewise, the metal pillar can extend vertically beyond any chip embedded in the encapsulant in the first and second directions, and can be disposed outside the periphery of any chip embedded in the encapsulant. The metal pillar can extend vertically beyond the encapsulant in the first direction, or alternatively, the metal pillar can be laterally aligned with the first surface of the encapsulant, or alternatively, the metal pillar can not extend to the first surface of the encapsulant.

The metal pillar can be not covered in the first direction by the encapsulant or any other insulative material of the assembly. For instance, the metal pillar can be exposed in the first direction, or alternatively, a solder terminal that overlaps the metal pillar can be exposed in the first direction and the metal pillar can be covered in the first direction by the solder terminal. In either case, the metal pillar is not covered by the encapsulant or any other insulative material of the assembly in the first direction. The metal pillar can also be not covered in the second direction by the encapsulant or any other insulative material of the assembly.

The metal pillar can be welded only to the routing line, can be disposed within a periphery of the routing line and can have a substantially cylindrical shape.

The metal pillar can consist of two, three, four or more metal balls. Furthermore, the metal pillar can include, consist essentially of or consist of ball bonds. For instance, the metal pillar can consist of stacked ball bonds and a stud bump stacked on the ball bonds, or alternatively, consist of stacked ball bonds.

The metal balls can be vertically aligned with one another and have essentially identical peripheries and substantially spherical shapes. The metal balls can each be welded to one or two other metal balls. For instance, the top metal ball can be welded only to the underlaying metal ball, the bottom metal ball can be welded only to the overlaying metal ball and the routing line, and the remaining metal balls (if any) between the top and bottom metal balls can each be welded only to the underlaying and overlaying metal balls they are sandwiched between. Furthermore, the metal balls can each extend vertically between one-quarter and three-quarters of the thickness of the chip.

The metal balls can each include, consist essentially of or consist of a ball bond. For instance, a metal ball can be a stud bump that includes a ball bond and a stump and consist essentially of a ball bond, or alternatively, be a ball bond without a stump. Furthermore, the metal balls can each be gold, aluminum, copper or solder, or alternatively, a solder coating and a coated metal, wherein the solder coating contacts the encapsulant and the coated metal, and the coated metal is spaced from the encapsulant.

The encapsulant can contact the chip and the metal balls. The encapsulant can cover the chip in the first direction, or alternatively, the first surface of the encapsulant can be laterally aligned with the second surface of the chip and the second surface of the chip can be not covered in the first direction by another material of the assembly.

The connection joint can contact and electrically connect the routing line and the pad. The connection joint can be electroplated metal, electrolessly plated metal, solder, conductive adhesive or a wire bond.

The assembly can include an aperture that extends from the first surface of the encapsulant to the metal pillar, is disposed outside the periphery of the chip, is vertically aligned with the metal pillar, extends into but not through the encapsulant and is spaced from the routing line. Furthermore, a solder terminal can extend into the aperture, be electrically connected to the metal pillar in the aperture and extend vertically beyond the metal pillar and the encapsulant in the first direction.

The assembly can include an insulative base that contacts the routing line, is spaced from and overlapped by the chip and extends vertically beyond the chip, the metal pillar and the encapsulant in the second direction.

The assembly can include an insulative adhesive that contacts the chip and extends vertically beyond the chip in the second direction.

The assembly can include a solder terminal that is electrically connected to the metal pillar, extends vertically beyond the metal pillar and the encapsulant in the first direction and is spaced from the routing line and the connection joint.

The assembly can include another solder terminal that is electrically connected to the routing line, extends vertically beyond the routing line and the encapsulant in the second direction and is spaced from the metal pillar and the connection joint.

The assembly can include a tapered pillar that contacts and is not metallurgically welded to the routing line, is disposed outside the periphery of the chip, is overlapped by the metal pillar and extends vertically beyond the chip, the routing line, the metal pillar and the encapsulant in the second direction. The tapered pillar can be vertically aligned with the metal pillar. The tapered pillar can include first and second opposing surfaces that are flat and parallel to one another and tapered sidewalls therebetween, wherein the first surface of the tapered pillar faces towards and contacts the routing line, the second surface of the tapered pillar faces away from and is spaced from the routing line, and the tapered sidewalls slant inwardly towards the second surface of the tapered pillar. Furthermore, the second surface of the tapered pillar can be concentrically disposed within a surface area of the first surface of the tapered pillar, and a surface area of the first surface of the tapered pillar can be at least 20 percent larger than a surface area of the second surface of the tapered pillar.

The assembly can include a heat sink that is mechanically attached to the chip, electrically isolated by the chip, overlapped by the chip and disposed vertically beyond the chip and the conductive trace in the second direction.

The assembly can include a ground plane that is mechanically attached to the routing line, electrically connected to the routing line, overlapped by the routing line and disposed vertically beyond the chip and the routing line in the second direction.

The assembly can be a first-level package that is a single-chip or multi-chip package.

In accordance with another aspect of the invention, a method of making a semiconductor chip assembly includes providing a routing line, then mechanically attaching a semiconductor chip to the routing line, wherein the chip includes first and second opposing surfaces, and the first surface of the chip includes a conductive pad, forming a connection joint that electrically connects the routing line and the pad, forming a metal pillar that is metallurgically welded to the routing line, wherein forming the metal pillar includes metallurgically welding a first metal ball to the routing line and then metallurgically welding a second metal ball to the first metal ball without contacting the second metal ball to the routing line, the metal pillar consists of stacked metal balls that include the first and second metal balls and each metal ball is metallurgically welded to another metal ball, and forming an encapsulant after attaching the chip to the routing line and forming the metal pillar, wherein the encapsulant includes a first surface that faces in a first direction and a second surface that faces in a second direction opposite the first direction, the chip and the metal balls are embedded in the encapsulant, the encapsulant covers the chip and extends vertically beyond the chip and the routing line in the first direction, the routing line extends laterally beyond the metal pillar towards the chip and extends vertically beyond the chip and the metal pillar in the second direction, and the metal pillar is disposed outside a periphery of the chip, extends vertically beyond the routing line in the first direction and extends vertically across most or all of a thickness of the chip between the first and second surfaces of the chip.

The method can include forming the routing line by selectively depositing the routing line on a metal base, and attaching the chip to the routing line such that the metal base extends vertically beyond the chip in the second direction.

The method can include forming the routing line by providing a plating mask on the metal base, wherein the plating mask includes an opening that exposes a portion of the metal base, and then electroplating the routing line on the exposed portion of the metal base through the opening in the plating mask.

The method can include etching the metal base after forming the encapsulant, thereby reducing contact area between the metal base and the routing line. Etching the metal base can remove a first portion of the metal base that contacts the routing line without removing a second portion of the metal base that contacts the routing line, thereby reducing but not eliminating contact area between the metal base and the routing line. For instance, etching the metal base can remove a first portion of the metal base within a periphery of the pad without removing a second portion of the metal base outside the periphery of the pad. As another example, etching the metal base can form a tapered pillar from an unetched portion of the metal base that contacts the routing line, is disposed outside the periphery of the chip, is overlapped by the metal pillar and extends vertically beyond the chip, the routing line, the metal pillar and the encapsulant in the second direction. Alternatively, etching the metal base can eliminate contact area between the metal base and the routing line. For instance, etching the metal base can remove the metal base.

The method can include etching the metal base after forming the encapsulant, thereby electrically isolating the routing line from other routing lines formed on the metal base. Likewise, the method can include etching the metal base after forming the encapsulant, thereby electrically isolating the pad from other conductive pads of the chip.

The method can include welding the first metal ball to the routing line and then welding the second metal ball to the first metal ball by ball bonding, wedge bonding, thermocompression bonding, thermosonic bonding, ultrasonic bonding, stud bumping, or combinations thereof. For instance, welding the first metal ball to the routing line can include forming a first ball bond by thermocompression or thermosonic bonding, and welding the second metal ball to the first metal ball can include forming a second ball bond by thermocompression or thermosonic bonding. Welding the first metal ball to the routing line can also include forming a first ball bond by stud bumping, and welding the second metal ball to the first metal ball can also include forming a second ball bond by stud bumping. Welding the first metal ball to the routing line can also include applying thermocompression or thermosonic ball bonding using a capillary to press a first wire ball against the routing line, and welding the second metal ball to the first metal ball can also include applying thermocompression or thermosonic ball bonding using the capillary to press a second wire ball against the first metal ball.

Welding the first and second metal balls can also include (1) positioning a capillary with a first wire ball extending therefrom over the routing line, wherein the first wire ball is connected to a wire that is fed through the capillary, (2) moving the capillary towards the routing line so that the first wire ball contacts the routing line and deforms into a first ball bond and remains connected to the wire, (3) moving the capillary away from the routing line, disconnecting the first ball bond from the wire, and cooling the first ball bond so that the first ball bond contacts and is welded to and electrically connected to the routing line, (4) positioning the capillary with a second wire ball extending therefrom over the first metal ball, wherein the second wire ball is connected to the wire that is fed through the capillary, (5) moving the capillary towards the first metal ball so that the second wire ball contacts the first metal ball and deforms into a second ball bond and remains connected to the wire, and (6) moving the capillary away from the routing line, disconnecting the second ball bond from the wire, and cooling the second ball bond so that the second ball bond contacts and is welded to and electrically connected to the first metal ball.

The method can include fracturing a wire after forming the metal pillar and before forming the encapsulant, thereby detaching the wire from the metal pillar. For instance, the wire can be fractured proximate to the top ball bond, and the top metal ball can be a stud bump.

The method can include forming the encapsulant by depositing the encapsulant such that the encapsulant covers the metal pillar in the first direction and the metal pillar is not exposed, and then removing a portion of the encapsulant such that the metal pillar is exposed, or alternatively, depositing the encapsulant on the metal pillar such that the encapsulant does not cover the metal pillar in the first direction and the metal pillar is exposed.

The method can include removing the portion of the encapsulant by grinding, laser ablation or plasma etching. For instance, removing the portion of the encapsulant can include grinding the encapsulant without grinding the metal pillar, and then grinding the encapsulant and the metal pillar. Alternatively, removing the portion of the encapsulant can include selectively removing the encapsulant within the periphery of the metal pillar using laser ablation or plasma etching.

The method can include removing the portion of the encapsulant to expose the metal pillar, expose the second surface of the chip, laterally align the metal pillar and the first surface of the encapsulant, laterally align the metal pillar and the second surface of the chip, laterally align the first surface of the encapsulant and the second surface of the chip and/or laterally align the metal pillar, the first surface of the encapsulant and the second surface of the chip. In any case, the chip and the metal pillar remain embedded in the encapsulant.

The method can include forming the connection joint by plating the connection joint on the routing line and the pad. For instance, the connection joint can be electroplated or electrolessly plated on the routing line and the pad. Alternatively, the method can include forming the connection joint by depositing a non-solidified material on the routing line and the pad and then hardening the non-solidified material. For instance, solder paste can be deposited on the routing line and the pad and then hardened by reflowing, or conductive adhesive can be deposited on the routing line and the pad and then hardened by curing. Alternatively, the method can include forming the connection joint by wire bonding. For instance, the wire bond can extend vertically beyond the chip and the routing line in the first direction when the first surface of the chip faces in the first direction, or alternatively, the wire bond can extend vertically beyond the chip, the routing line and the metal pillar in the second direction when the first surface of the chip faces in the second direction.

The method can include attaching the chip to the routing line and then forming the metal pillar, or alternatively, forming the metal pillar and then attaching the chip to the routing line.

The method can include forming the connection joint and then forming the metal pillar, or alternatively, forming the metal pillar and then forming the connection joint.

The method can include forming the connection joint and then forming the encapsulant, or alternatively, forming the encapsulant and then forming the connection joint.

The method can include etching the metal pillar after forming the encapsulant, thereby forming an aperture in the encapsulant that extends from the first surface of the encapsulant to the metal pillar, extends into but not through the encapsulant, exposes only the metal pillar and the encapsulant and is spaced from the routing line. For instance, the metal pillar can be etched using a wet chemical etch that is selective of the metal pillar relative to the encapsulant, thereby receding the metal pillar relative to the first surface of the encapsulant.

The method can include providing an insulative base that contacts the routing line, is spaced from and overlapped by the chip and extends vertically beyond the chip, the metal pillar and the encapsulant in the second direction.

The method can include providing an insulative adhesive that attaches the chip to the routing line before forming the encapsulant.

The method can include providing a solder terminal that is electrically connected to the metal pillar, extends vertically beyond the metal pillar and the encapsulant in the first direction and is spaced from the routing line and the connection joint. The solder terminal can be deposited on and in contact with the metal pillar, or alternatively, a plated terminal can be electrolessly plated on and in contact with the metal pillar, and then the solder terminal can be deposited on and in contact with the plated terminal and spaced from the metal pillar.

The method can include providing a solder terminal that is electrically connected to the routing line, extends vertically beyond the routing line and the encapsulant in the second direction and is spaced from the metal pillar and the connection joint. For instance, the solder terminal can be deposited on and in contact with the routing line, or alternatively, a plated terminal can be electrolessly plated on and in contact with the routing line, and then the solder terminal can be deposited on and in contact with the plated terminal and spaced from the routing line.

An advantage of the present invention is that the semiconductor chip assembly can be manufactured conveniently and cost effectively. Another advantage is that the metal base or the insulative base can be provided before the encapsulant, thereby enhancing the mechanical support and protection for the routing line after the chip and the metal pillar are attached. Another advantage is that the metal pillar can be welded to the routing line rather than deposited on the routing line by electroplating or electroless plating which improves uniformity and reduces manufacturing time and cost. Another advantage is that the connection joint can be made from a wide variety of materials and processes, thereby making advantageous use of mature connection joint technologies in a unique and improved manufacturing approach. Another advantage is that the assembly need not include connection joints that are wire bonds or TAB leads, although the process is flexible enough to accommodate these techniques if desired. Another advantage is that the metal pillar can extend across most or all of a thickness of the chip and the solder terminals can protrude vertically from the encapsulant and the insulative base, respectively, thereby facilitating a three-dimensional stacked arrangement. Another advantage is that the assembly can be manufactured using low temperature processes which reduces stress and improves reliability. A further advantage is that the assembly can be manufactured using well-controlled processes which can be easily implemented by circuit board, lead frame and tape manufacturers. Still another advantage is that the assembly can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which:

FIGS. 1A-18A are cross-sectional views showing a method of making a semiconductor chip assembly in accordance with a first embodiment of the present invention;

FIGS. 1B-18B are top plan views corresponding to FIGS. 1A-18A, respectively;

FIGS. 1C-18C are bottom plan views corresponding to FIGS. 1A-18A, respectively;

DETAILED DESCRIPTION OF THE PREFERRED EMBODIMENTS

FIGS. 1A-18A, 1B-18B and 1C-18C are cross-sectional, top and bottom views, respectively, of a method of making a semiconductor chip assembly in accordance with a first embodiment of the present invention.

Figure 1A:
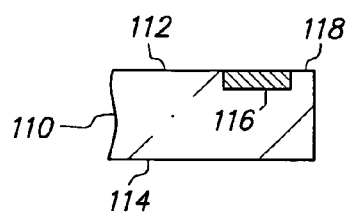
Figure 1B:
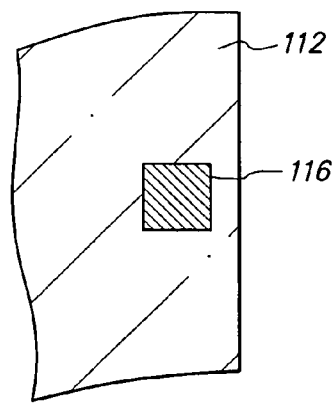
Figure 1C:
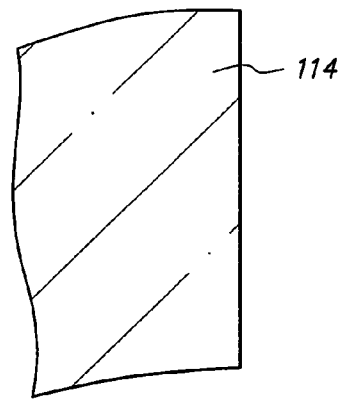

FIGS. 1A, 1B and 1C are cross-sectional, top and bottom views, respectively, of semiconductor chip 110 which is an integrated circuit in which various transistors, circuits, interconnect lines and the like are formed (not shown). Chip 110 includes opposing major surfaces 112 and 114 and has a thickness (between surfaces 112 and 114) of 150 microns. Surface 112 is the active surface and includes conductive pad 116 and passivation layer 118.

Pad 116 is substantially aligned with passivation layer 118 so that surface 112 is essentially flat. Alternatively, if desired, pad 116 can extend above or be recessed below passivation layer 118. Pad 116 provides a bonding site to electrically couple chip 110 with external circuitry. Thus, pad 116 can be an input/output pad or a power/ground pad. Pad 116 has a length and width of 100 microns.

Pad 116 has an aluminum base that is cleaned by dipping chip 110 in a solution containing 0.05 M phosphoric acid at room temperature for 1 minute and then rinsed in distilled water. Pad 116 can have the aluminum base serve as a surface layer, or alternatively, pad 116 can be treated to include a surface layer that covers the aluminum base, depending on the nature of a connection joint that shall subsequently contact the surface layer. In this embodiment, the connection joint is a gold wire bond. Therefore, pad 116 need not be treated to accommodate this connection joint. Alternatively, pad 116 can be treated by depositing several metal layers, such as chromium/copper/gold or titanium/nickel/gold on the aluminum base. The chromium or titanium layer provides a barrier for the aluminum base and an adhesive between the overlaying metal and the aluminum base. The metal layers, however, are typically selectively deposited by evaporation, electroplating or sputtering using a mask which is a relatively complicated process. Alternatively, pad 116 can be treated by forming a nickel surface layer on the aluminum base. For instance, chip 110 can be dipped in a zinc solution to deposit a zinc layer on the aluminum base. This step is commonly known as zincation. Preferably, the zinc solution contains about 150 grams/liter of NaOH, 25 grams/liter of ZnO, and 1 gram/liter of $NaNO_3$, as well as tartaric acid to reduce the rate at which the aluminum base dissolves. Thereafter, the nickel surface layer is electrolessly deposited on the zincated aluminum base. A suitable electroless nickel plating solution is Enthone Enplate NI-424 at 85° C.

Chip 110 includes many other pads on surface 112, and only pad 116 is shown for convenience of illustration. In addition, chip 110 has already been singulated from other chips that it was previously attached to on a wafer.

Figure 2A:
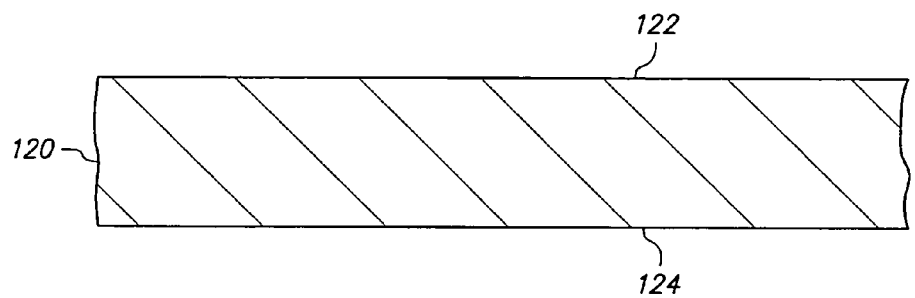
Figure 2B:
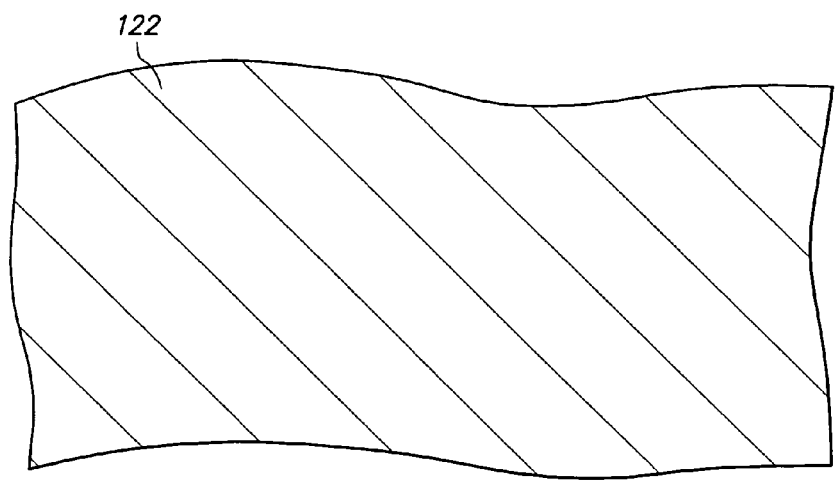
Figure 2C:
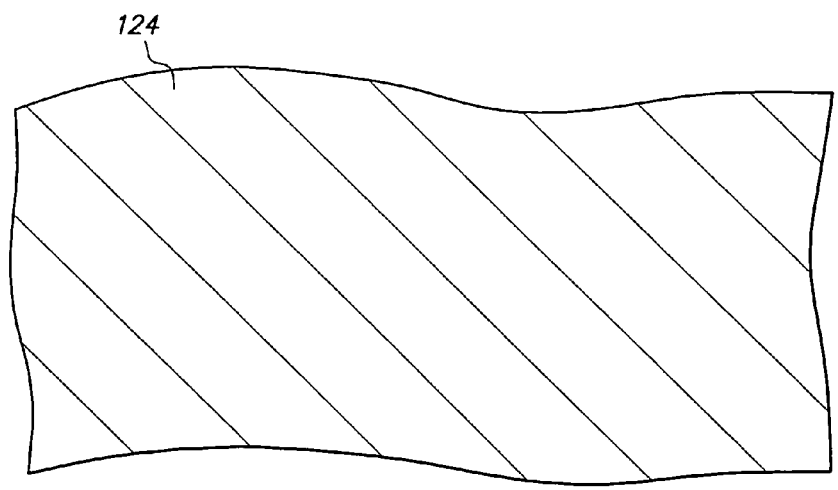

FIGS. 2A, 2B and 2C are cross-sectional, top and bottom views, respectively, of metal base 120 which includes opposing major surfaces 122 and 124. Metal base 120 is a copper plate with a thickness of 200 microns.

Figure 3A:
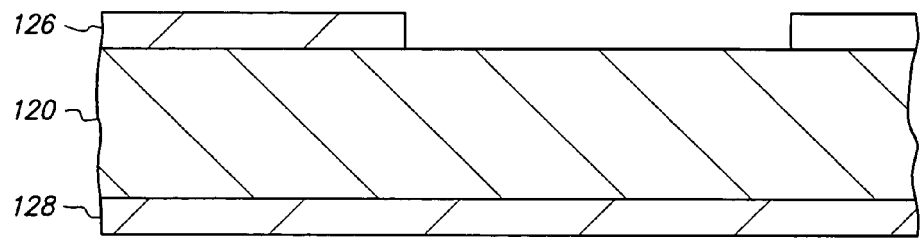
Figure 3B:
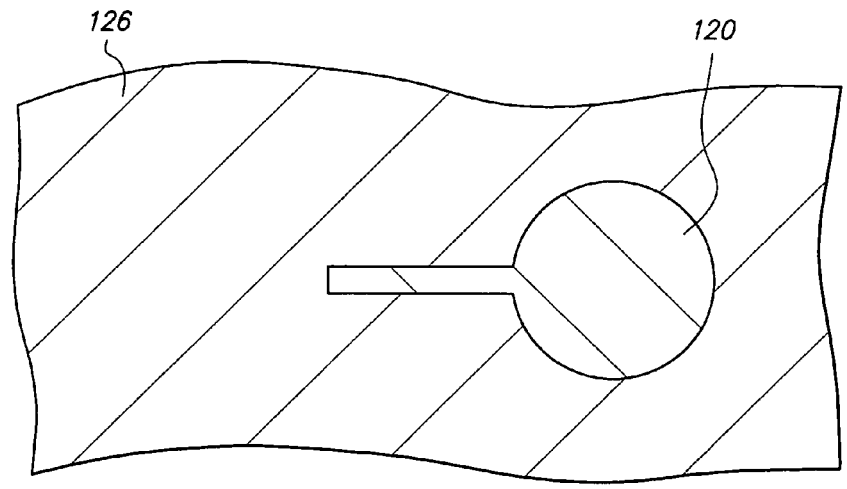
Figure 3C:
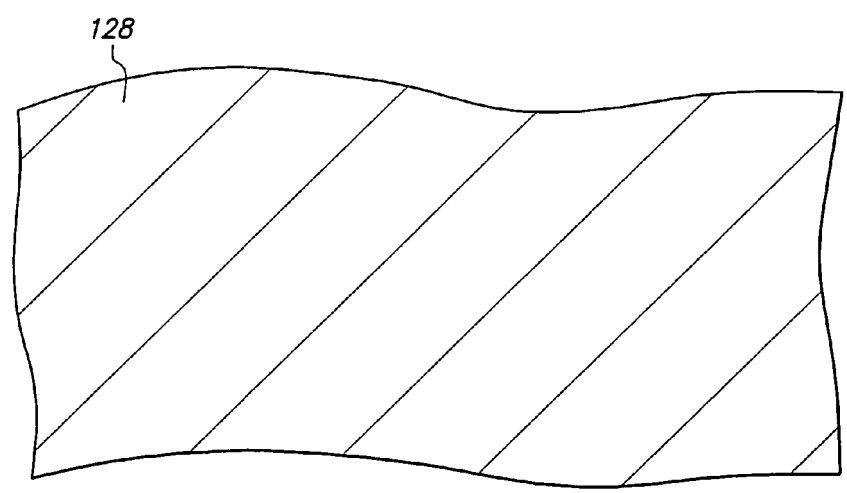

FIGS. 3A, 3B and 3C are cross-sectional, top and bottom views, respectively, of photoresist layers 126 and 128 formed on metal base 120. Photoresist layers 126 and 128 are deposited using a dry film lamination process in which hot rolls simultaneously press photoresist layers 126 and 128 onto surfaces 122 and 124, respectively. A reticle (not shown) is positioned proximate to photoresist layer 126. Thereafter, photoresist layer 126 is patterned by selectively applying light through the reticle, applying a developer solution to remove the photoresist portion rendered soluble by the light, and then hard baking, as is conventional. As a result, photoresist layer 126 contains an opening that selectively exposes surface 122 of metal base 120, and photoresist layer 128 remains unpatterned. Photoresist layers 126 and 128 each have a thickness of 50 microns beyond surfaces 122 and 124, respectively.

Figure 4A:
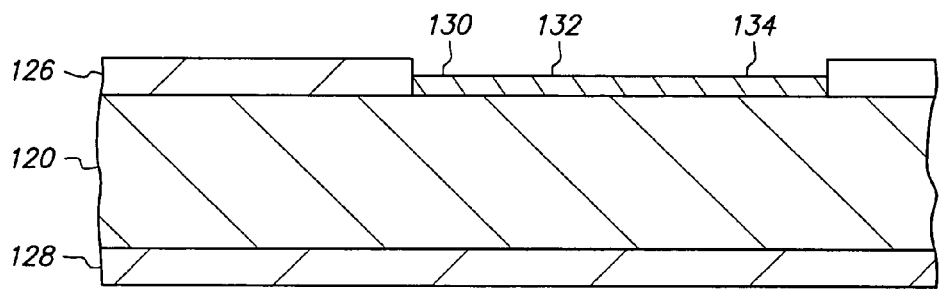
Figure 4B:
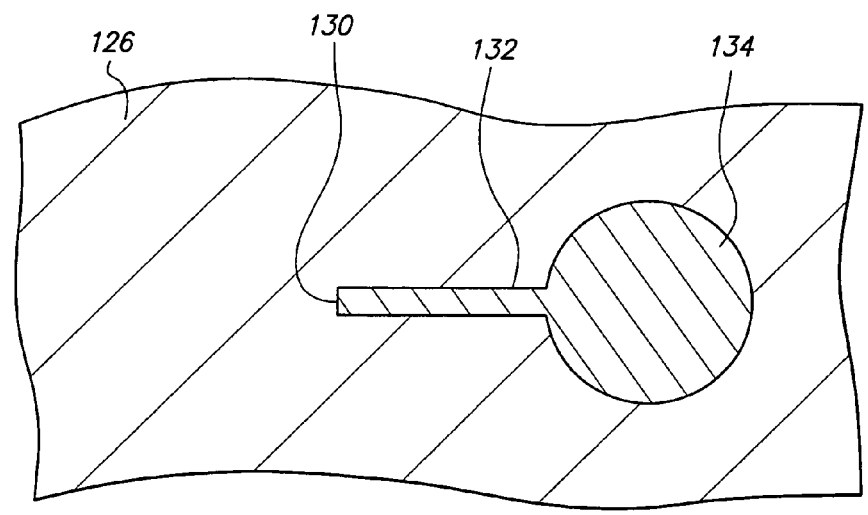
Figure 4C:
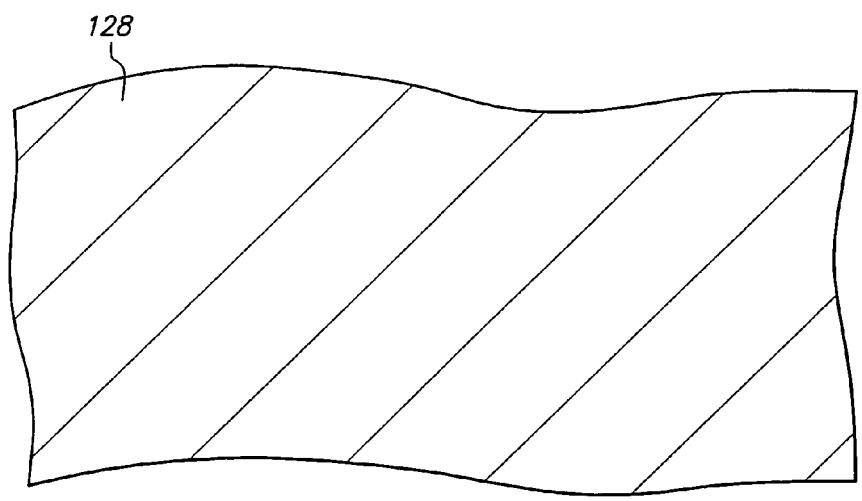

FIGS. 4A, 4B and 4C are cross-sectional, top and bottom views, respectively, of routing line 130 formed on metal base 120.

Routing line 130 includes elongated routing portion 132 and enlarged circular portion 134. Elongated routing portion 132 and enlarged circular portion 134 are adjacent to and integral with and coplanar with one another.

Routing line 130 is composed of a first nickel layer electroplated on metal base 120, a copper layer electroplated on the first nickel layer, a second nickel layer electroplated on the copper layer, and a gold layer electroplated on the second nickel layer. The first nickel layer contacts and is sandwiched between metal base 120 and the copper layer, the copper layer contacts and is sandwiched between the first and second nickel layers, the second nickel layer contacts and is sandwiched between the copper layer and the gold layer, and the gold layer contacts the second nickel layer. Thus, the copper layer, second nickel layer and gold layer are spaced and separated from metal base 120, the second nickel layer and gold layer are spaced and separated from the first nickel layer, the gold layer is exposed, and the copper layer and first and second nickel layers are buried beneath the gold layer. For convenience of illustration, the copper layer, gold layer and first and second nickel layers are shown as a single layer.

Routing line 130 is formed by an electroplating operation using photoresist layers 126 and 128 as plating masks. Thus, routing line 130 are formed additively. Initially, a plating bus (not shown) is connected to metal base 120, current is applied to the plating bus from an external power source, and metal base 120 is submerged in an electrolytic nickel plating solution such as Technic Techni Nickel "S" at room temperature. As a result, the first nickel layer electroplates (deposits or grows) on the exposed portion of surface 122. The first nickel electroplating operation continues until the first nickel layer has the desired thickness. Thereafter, the structure is removed from the electrolytic nickel plating solution and submerged in an electrolytic copper plating solution such as Sel-Rex CUBATH M™ at room temperature while current is applied to the plating bus to electroplate the copper layer on the first nickel layer. The copper electroplating operation continues until the copper layer has the desired thickness. Thereafter, the structure is removed from the electrolytic copper plating solution and submerged in an electrolytic nickel plating solution such as Technic Techni Nickel "S" at room temperature while current is applied to the plating bus to electroplate the second nickel layer on the copper layer. The second nickel electroplating operation continues until the second nickel layer has the desired thickness. Thereafter, the structure is removed from the electrolytic nickel plating solution and submerged in an electrolytic gold plating solution such as Technic Orotemp at room temperature while current is applied to the plating bus to electroplate the gold layer on the second nickel layer. The gold electroplating operation continues until the gold layer has the desired thickness. Thereafter, the structure is removed from the electrolytic gold plating solution and rinsed in distilled water to remove contaminants.

Routing line 130 has a thickness of 26.5 microns. In particular, the first and second nickel layers each have a thickness of 3 microns, the copper layer has a thickness of 20 microns, and the gold layer has a thickness of 0.5 microns. Elongated routing portion 132 is a flat planar lead with a width (orthogonal to its elongated length) of 100 microns, and enlarged circular portion 134 has a diameter of 400 microns.

Figure 5A:
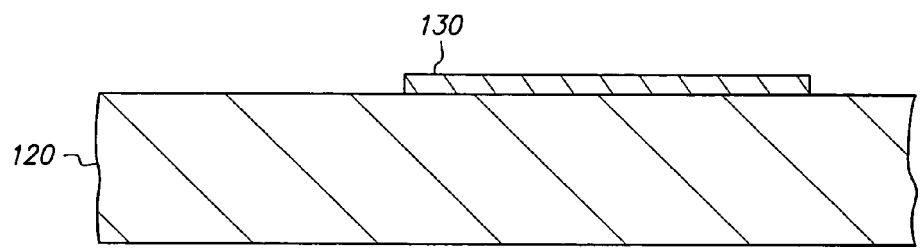
Figure 5B:
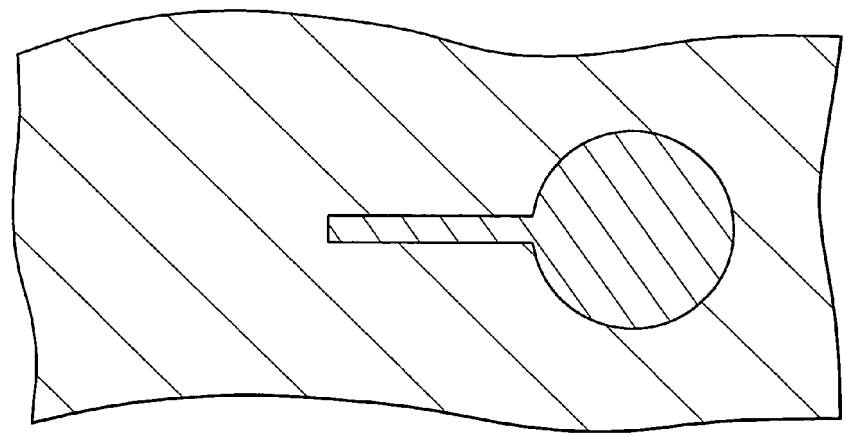
Figure 5C:
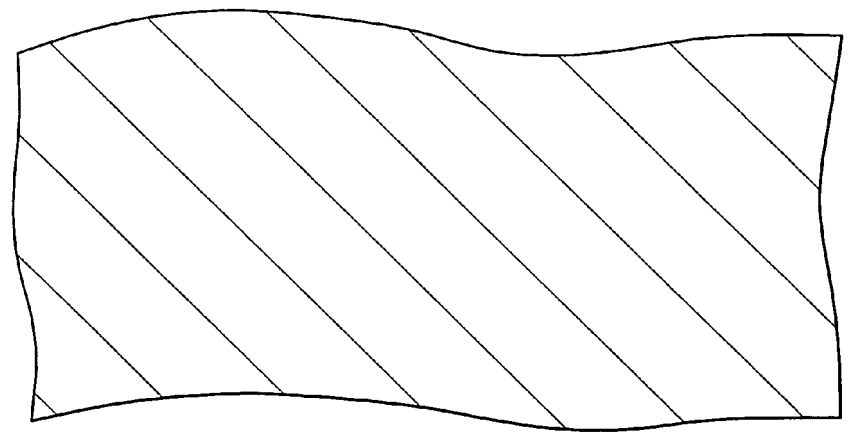

FIGS. 5A, 5B and 5C are cross-sectional, top and bottom views, respectively, of metal base 120 and routing line 130 after photoresist layers 126 and 128 are stripped. Photoresist layers 126 and 128 are removed using a solvent, such as a mild alkaline solution with a pH of 9, that is highly selective of photoresist with respect to copper, nickel and gold. Therefore, no appreciable amount of metal base 120 or routing line 130 is removed.

Figure 6A:
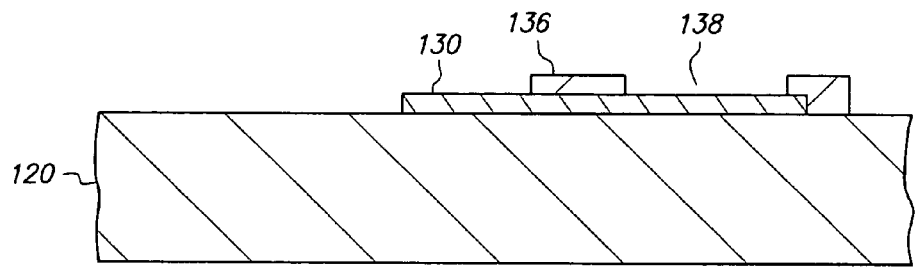
Figure 6B:
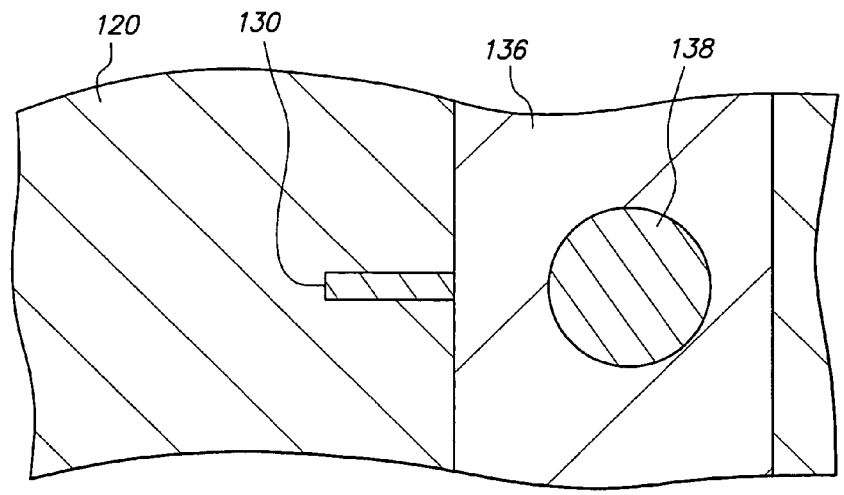
Figure 6C:
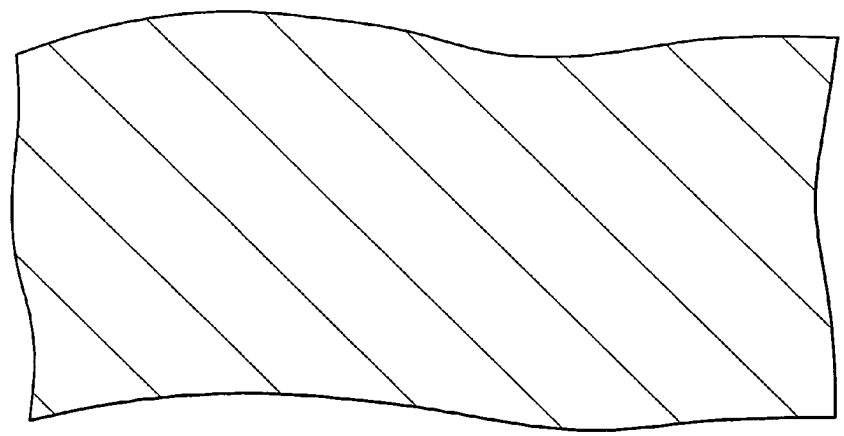

FIGS. 6A, 6B and 6C are cross-sectional, top and bottom views, respectively, of solder mask 136 formed on metal base 120 and routing line 130.

Solder mask 136 is initially a photoimageable liquid resin that is dispensed on metal base 120 and routing line 130. Thereafter, solder mask 136 is patterned by selectively applying light through a reticle (not shown), applying a developer solution to remove the solder mask portions rendered soluble by the light, and then hard baking, as is conventional. As a result, solder mask 136 contains opening 138 with a diameter of 100 microns that is vertically aligned with and selectively exposes enlarged circular portion 134. Solder mask 136 exposes an inner circular region of enlarged circular portion 134 with a diameter of 300 microns, and covers an outer annular region of enlarged circular portion 134 with a width of 50 microns ((400−300)/2). In addition, solder mask 136 extends 30 microns upwardly beyond routing line 130.

Figure 7A:
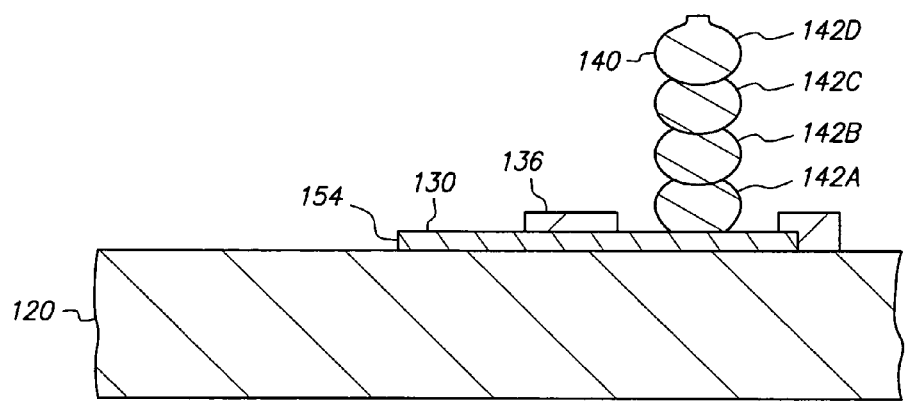
Figure 7B:
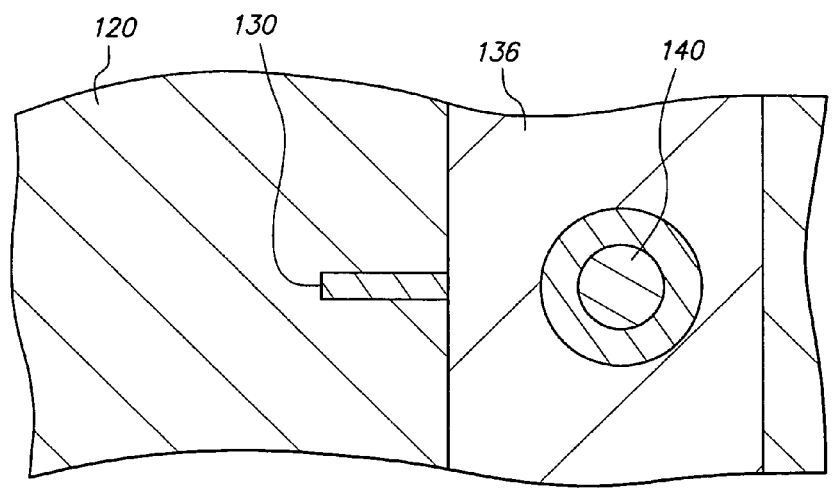
Figure 7C:
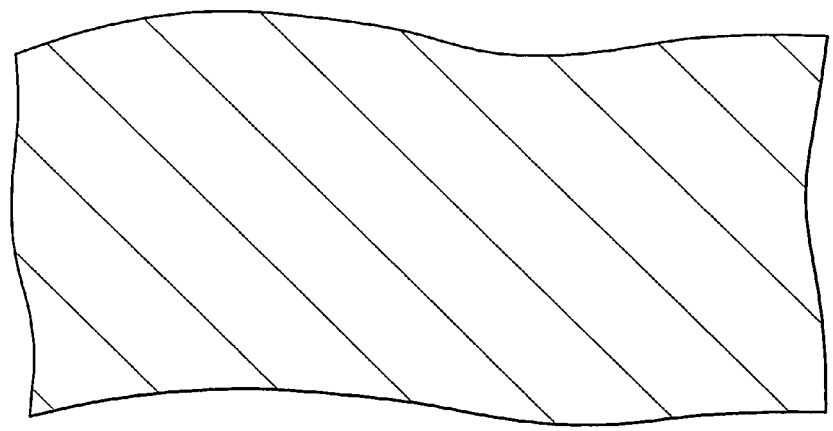

FIGS. 7A, 7B and 7C are cross-sectional, top and bottom views, respectively, of metal pillar 140 welded to routing line 130.

Metal pillar 140 is metallurgically welded to routing line 130 by thermosonic bonding. Metal pillar 140 contacts and is electrically connected to the inner circular region of enlarged circular portion 134, extends into opening 138, and is spaced from metal base 120, elongated routing portion 132 and solder mask 136. Metal pillar 140 has a substantially cylindrical shape with a maximum diameter of 150 microns, extends upwardly beyond routing line 130 by 425 microns and is disposed within the periphery of enlarged circular portion 134. Furthermore, metal base 120 and routing line 130 are disposed downwardly beyond metal pillar 140.

Metal pillar 140 consists of metal balls 142A, 142B, 142C and 142D that are stacked, vertically aligned with one another and metallurgically welded together. Metal ball 142A is sandwiched between and metallurgically welded to metal ball 142B and routing line 130, metal ball 142B is sandwiched between and metallurgically welded to metal balls 142A and 142C, metal ball 142C is sandwiched between and metallurgically welded to metal balls 142B and 142D, and metal ball 142D is metallurgically welded to metal ball 142C. In addition, metal ball 142A is spaced from metal balls 142C and 142D, metal ball 142B is spaced from metal ball 142D, metal ball 142C is spaced from metal ball 142A, and metal balls 142B, 142C and 142D are spaced from routing line 130. Thus, metal balls 142 are each welded to one or two other metal balls 142. Furthermore, metals balls 142A, 142B, 142C and 142D each have substantially spherical shapes and a diameter of 150 microns.

FIGS. 7D-7O are cross-sectional views of a method of making metal pillar 140.

Figure 7D:
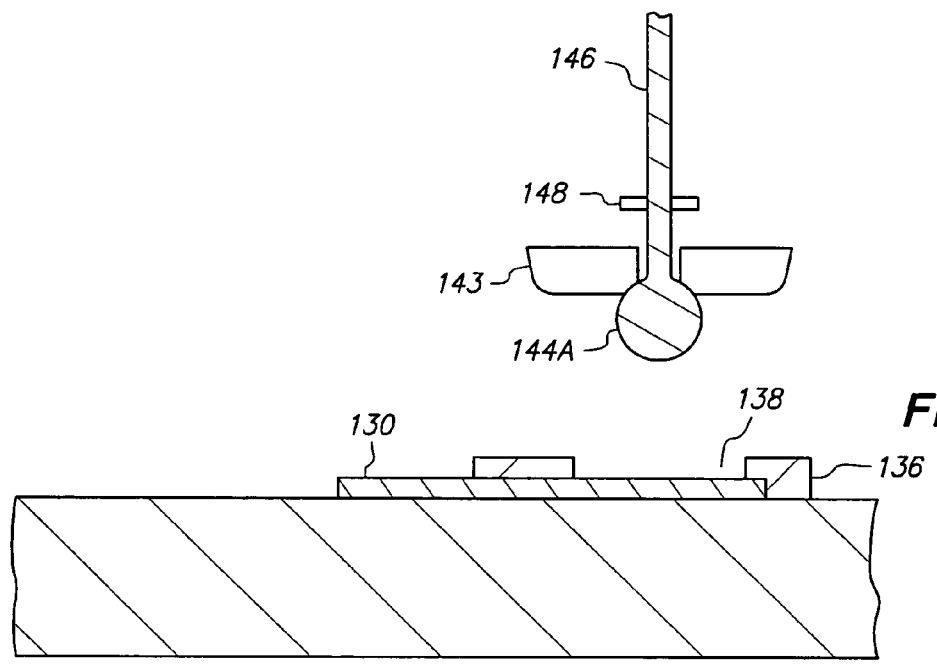
FIGS. 7D-7O are cross-sectional views showing a method of making a metal pillar for a semiconductor chip assembly in accordance with the first embodiment of the present invention.

FIG. 7D shows the structure with capillary 143 and wire ball 144A positioned above opening 138 and wire ball 144A spaced from routing line 130 and disposed outside opening 138. Capillary 143 is part of a conventional thermosonic wire bonding apparatus. Capillary 143 has a conical shape and can be composed of alumina, tungsten carbide, ceramic, artificial ruby or various refractory metals. Wire ball 144A is composed of gold and protrudes from the bottom of capillary 143. Wire ball 144A is formed at the end of gold wire 146 by applying thermal energy, such as electronic flame-off or a hydrogen gas flame jet, as is conventional. Wire 146 is fed from a spool (not shown) through clamp 148 and a bore in capillary 143. Clamp 148 is closed to hold wire 146 in place. Wire ball 144A has a diameter of 125 microns, and wire 146 has a diameter of 50 microns.

Figure 7E:
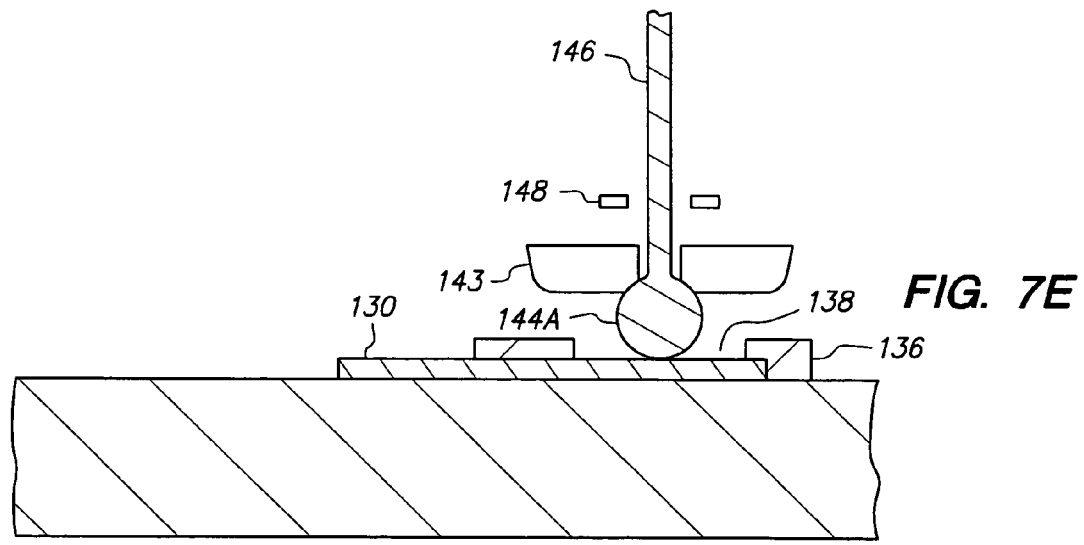

FIG. 7E shows the structure after capillary 143 moves downward and wire ball 144A enters opening 138 and contacts routing line 130. Since opening 138 has a diameter of 300 microns and extends 30 microns above routing line 130, and wire ball 144A has a diameter of 125 microns and is centered with respect to opening 138, wire ball 144A contacts routing line 130 without contacting solder mask 136. Clamp 148 opens before the movement begins so that wire 146 unwinds from its spool as capillary 143 moves. In addition, capillary 143 is heated to about 150 to 200° C. and provides horizontal ultrasonic oscillatory motions with a frequency of about 60 to 120 kHz. The combination of heat from capillary 143 and the recent flaming operation place wire ball 144A in a soft state which is easy to deform. However, the temperature of wire ball 144A does not reach the glass transition temperature of solder mask 136 which remains a solid insulative film.

Figure 7F:
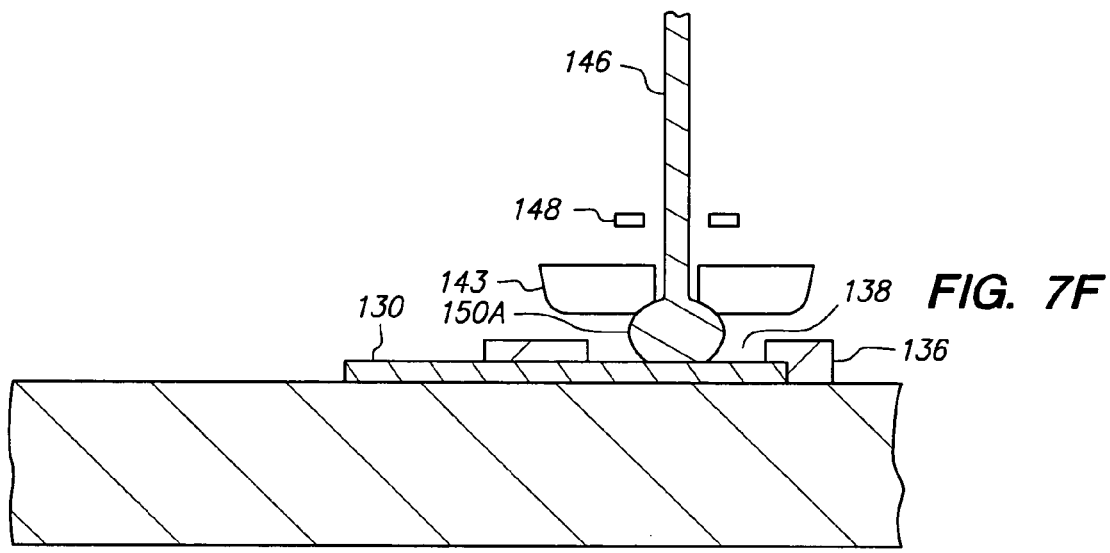

FIG. 7F shows the structure after capillary 143 moves further downward towards routing line 130 such that wire ball 144A deforms into ball bond 150A that contacts routing line 130 in opening 138. More particularly, since wire ball 144A is still in a soft state which is easy to deform, and capillary 143 exerts a downward force of about 25 to 45 grams while continuing to oscillate ultrasonically, wire ball 144A deforms into ball bond 150A. Clamp 148 remains open so that wire 146 continues to unwind from its spool as capillary 143 moves. The combination of heat, pressure and ultrasonic vibration welds routing line 130 and ball bond 150A. Furthermore, solder mask 136 prevents ball bond 150A from contacting metal base 120 in the event misregistration occurs.

Figure 7G:
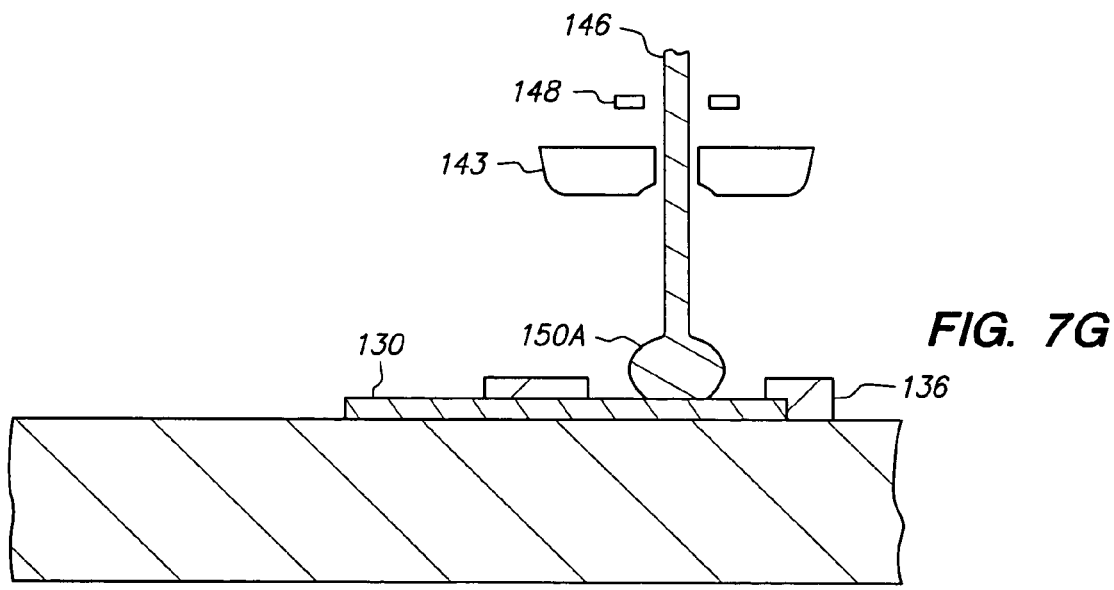

FIG. 7G shows the structure after capillary 143 moves upward and away from routing line 130 and ball bond 150A while clamp 148 remains open and wire 146 slides through capillary 143 without exerting upward pressure on ball bond 150A. In addition, ball bond 150A begins to cool and solidify.

Figure 7H:
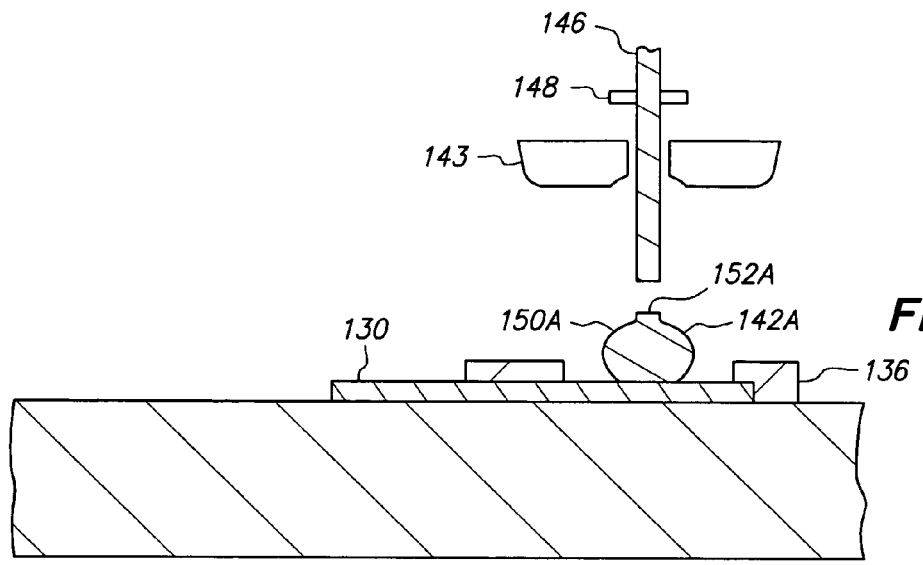

FIG. 7H shows the structure after ball bond 150A solidifies, clamp 148 closes and capillary 143 moves upward to fracture wire 146 just over and proximate to ball bond 150A, thereby detaching wire 146 from ball bond 150A. As a result, metal ball 142A is a stud bump composed of ball bond 150A and an extremely short, inconsequential stump 152A and is welded to routing line 130.

Figure 7I:
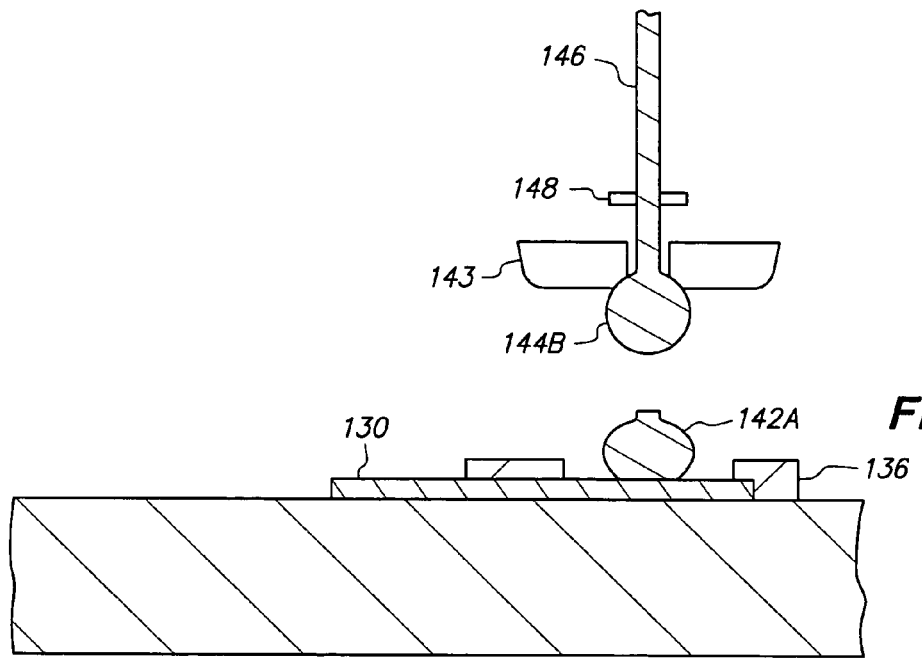

FIG. 7I shows the structure with capillary 143 and wire ball 144B positioned above and spaced from metal ball 142A. Wire ball 144B is composed of gold and protrudes from the bottom of capillary 143. Wire ball 144B is formed at the end of wire 146 in the same manner as wire ball 144A and has the same shape and dimensions as wire ball 144A, and clamp 148 is closed to hold wire 146 in place.

Figure 7J:
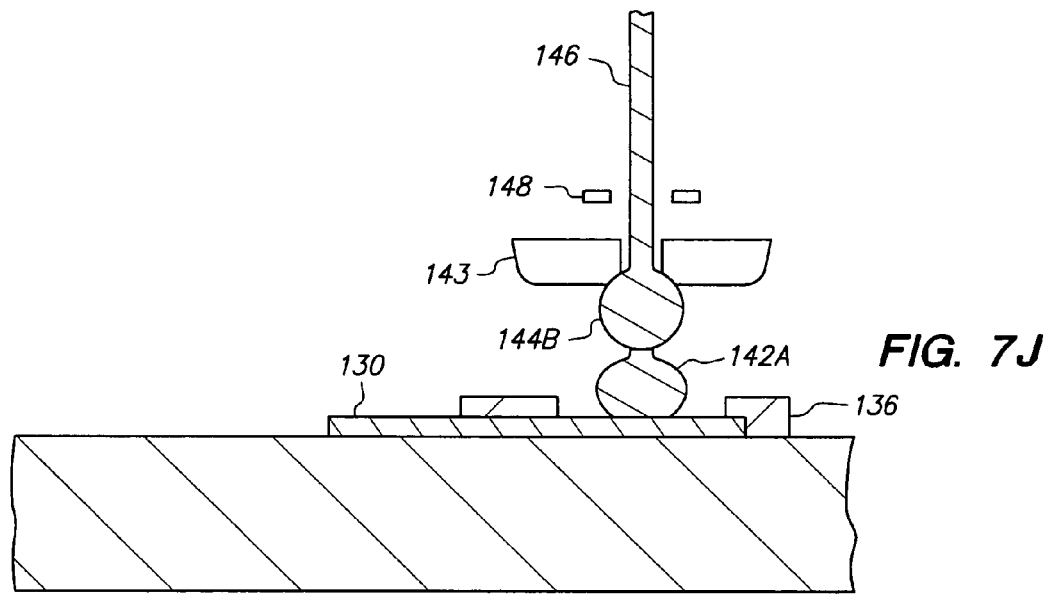

FIG. 7J shows the structure after capillary 143 moves downward and wire ball 144B contacts metal ball 142A. Clamp 148 opens before the movement begins so that wire 146 unwinds from its spool as capillary 143 moves. In addition, capillary 143 is heated to about 150 to 200° C. and provides horizontal ultrasonic oscillatory motions with a frequency of about 60 to 120 kHz. The combination of heat from capillary 143 and the recent flaming operation place wire ball 144B in a soft state which is easy to deform. However, the temperature of wire ball 144B does not reach the glass transition temperature of solder mask 136 which remains a solid insulative film.

Figure 7K:
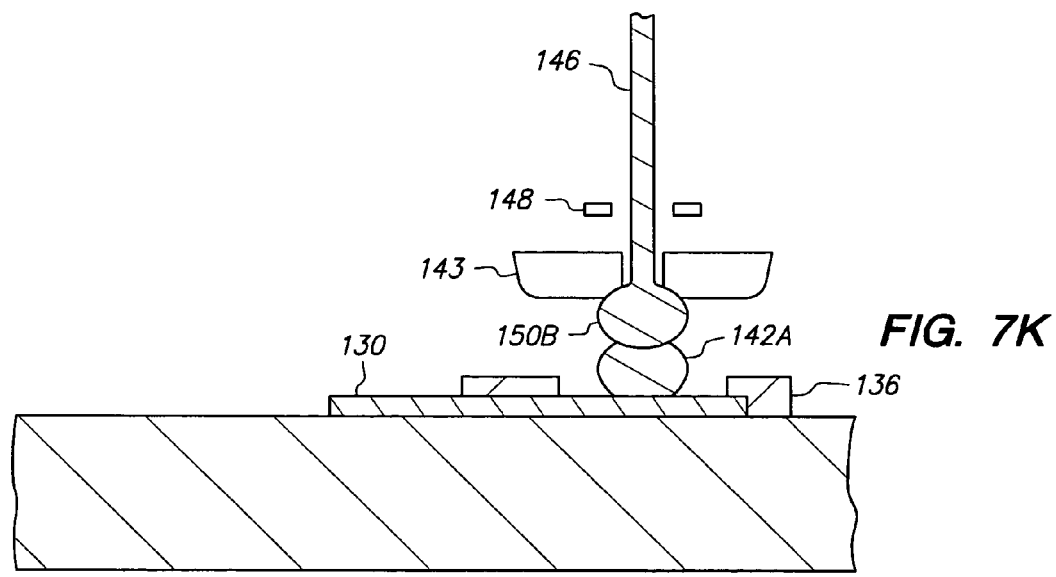

FIG. 7K shows the structure after capillary 143 moves further downward towards metal ball 142A such that wire ball 144B deforms into ball bond 150B that contacts and extends into metal ball 142A. More particularly, since wire ball 144B is still in a soft state which is easy to deform, and capillary 143 exerts a downward force of about 25 to 45 grams while continuing to oscillate ultrasonically, wire ball 144B tunnels into metal ball 142A and deforms into ball bond 150B. Clamp 148 remains open so that wire 146 continues to unwind from its spool as capillary 143 moves. The combination of heat, pressure and ultrasonic vibration welds metal ball 142A and ball bond 150B. Furthermore, ball bond 150B effectively eliminates stump 152A, thereby converting metal ball 142A to ball bond 150A.

Figure 7L:
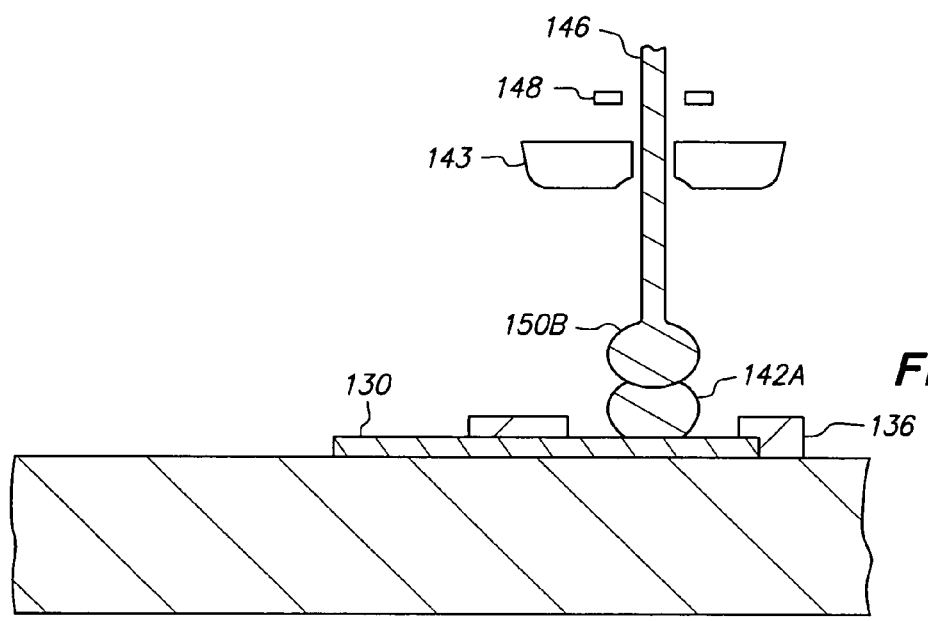

FIG. 7L shows the structure after capillary 143 moves upward and away from ball bond 150B while clamp 148 remains open and wire 146 slides through capillary 143 without exerting upward pressure on ball bond 150B. In addition, ball bond 150B begins to cool and solidify.

Figure 7M:
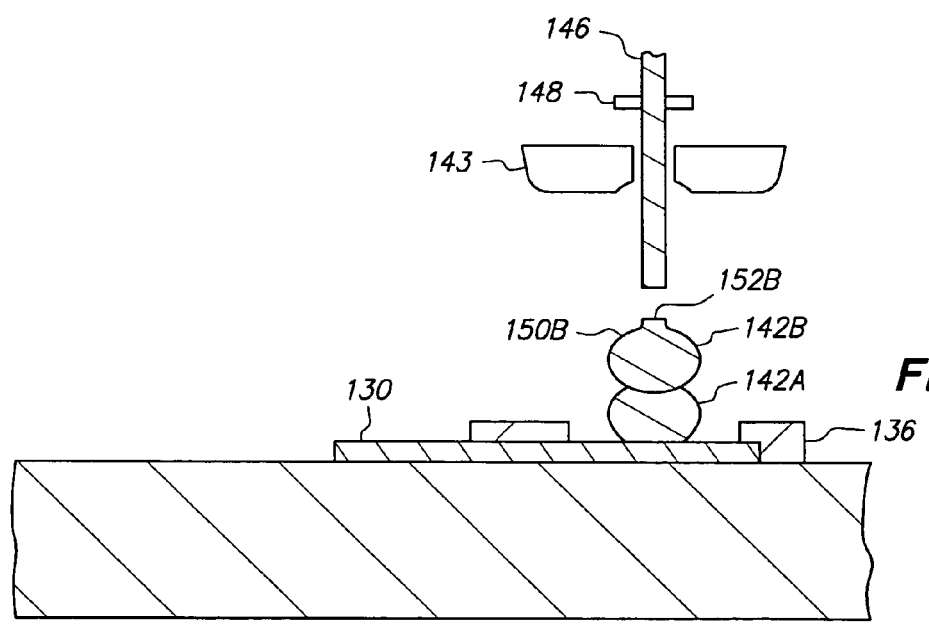

FIG. 7M shows the structure after ball bond 150B solidifies, clamp 148 closes and capillary 143 moves upward to fracture wire 146 just over and proximate to ball bond 150B, thereby detaching wire 146 from ball bond 150B. As a result, metal ball 142B is a stud bump composed of ball bond 150B and an extremely short, inconsequential stump 152B and is welded to metal ball 142A.

Figure 7N:
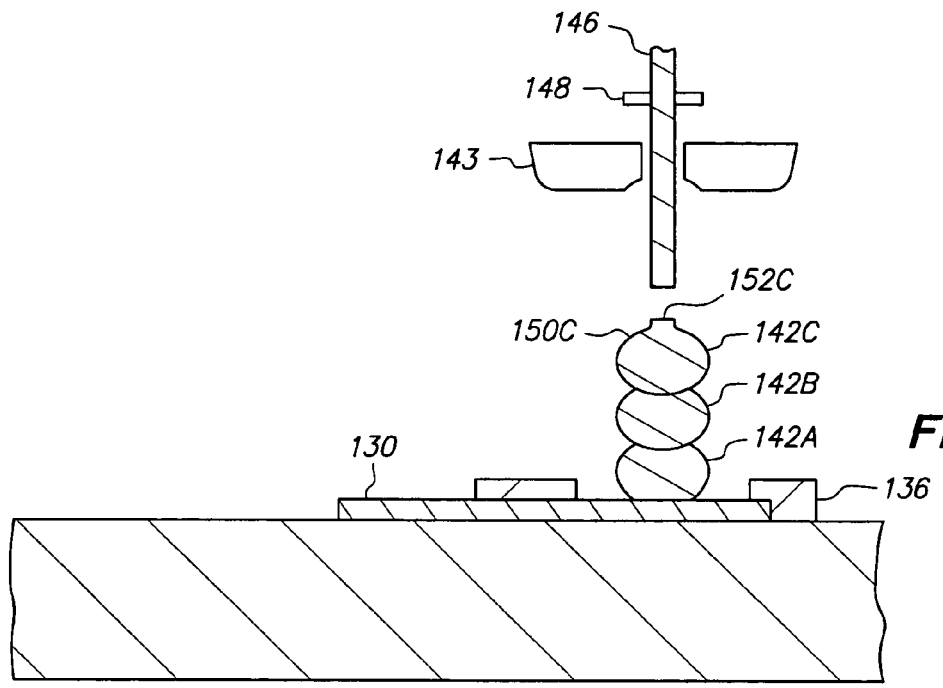

FIG. 7N shows the structure after metal ball 142C is welded to metal ball 142B in the same manner that metal ball 142B is welded to metal ball 142A. As a result, metal ball 142C is a stud bump composed of ball bond 150C and an extremely short, inconsequential stump 152C, metal ball 142B is ball bond 150B (without stump 152B) and metal ball 142A is ball bond 150A (without stump 152A).

Figure 7O:
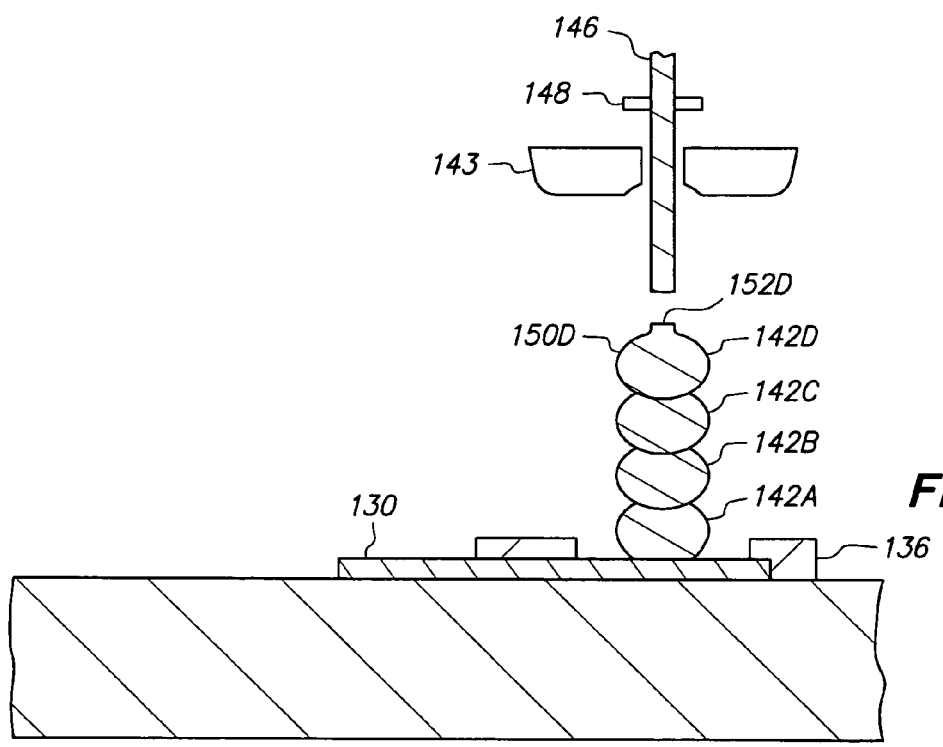

FIG. 7O shows the structure after metal ball 142D is welded to metal ball 142C in the same manner that metal ball 142C is welded to metal ball 142B. As a result, metal ball 142D is a stud bump composed of ball bond 150D and an extremely short, inconsequential stump 152D, metal ball 142C is ball bond 150C (without stump 152C), metal ball 142B is ball bond 150B (without stump 152B) and metal ball 142A is ball bond 150A (without stump 152A).

Conductive trace 154 includes routing line 130 and metal pillar 140. Conductive trace 154 is adapted for providing horizontal and vertical routing between pad 116 and a next level assembly.

Figure 8A:
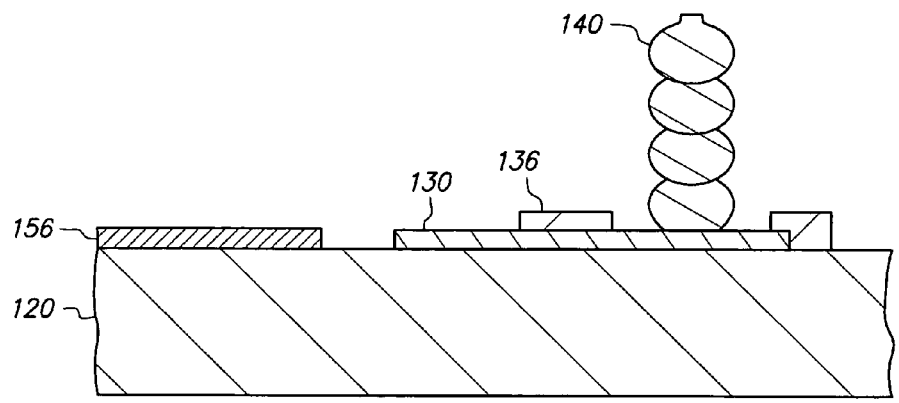
Figure 8B:
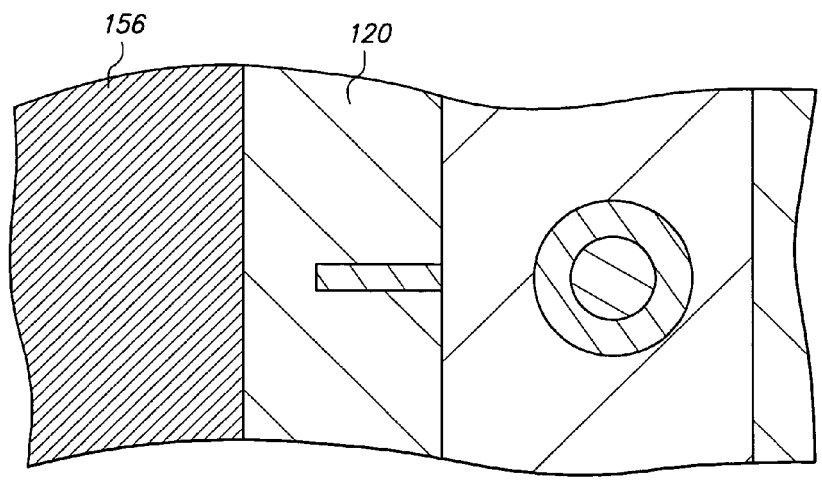
Figure 8C:
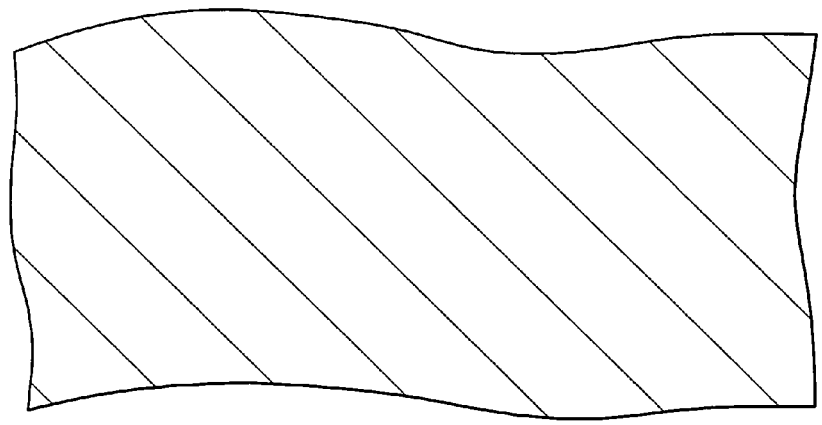

FIGS. 8A, 8B and 8C are cross-sectional, top and bottom views, respectively, of adhesive 156 formed on metal base 120.

Adhesive 156 may include an organic surface protectant such as HK 2000 which is promptly applied to the structure after metal pillar 140 is formed to reduce native oxide formation on the exposed copper surfaces. The use of organic surface protectant layers in insulative adhesives for semiconductor chip assemblies is well-known in the art.

Thereafter, a liquid resin (A stage) such as polyamic acid is applied over metal base 120 using stencil printing. During stencil printing, a stencil (not shown) is placed over metal base 120, routing line 130 and solder mask 136, a stencil opening is aligned with metal base 120 and offset from routing line 130 and solder mask 136, and then a squeegee (not shown) pushes the liquid resin along the surface of the stencil opposite metal base 120, routing line 130 and solder mask 136, through the stencil opening and onto metal base 120 but not routing line 130 and solder mask 136. The liquid resin is compliant enough at room temperature to conform to virtually any shape. Therefore, the liquid resin flows over and covers a portion of metal base 120 but remains spaced and separated from routing line 130, solder mask 136 and metal pillar 140.

Figure 9A:
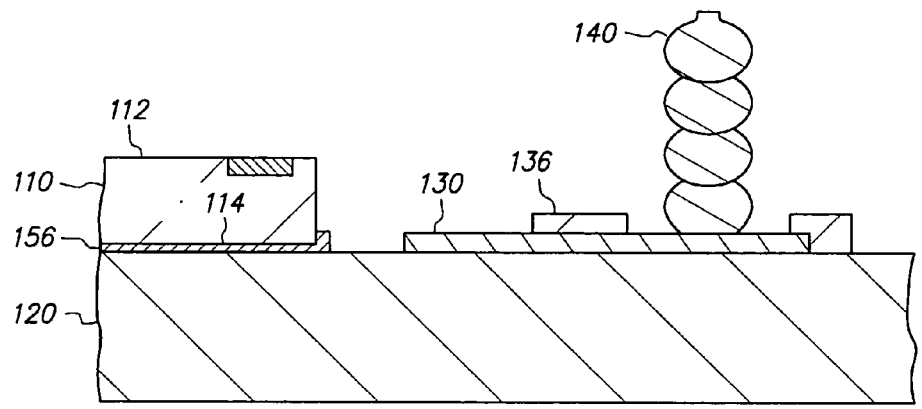
Figure 9B:
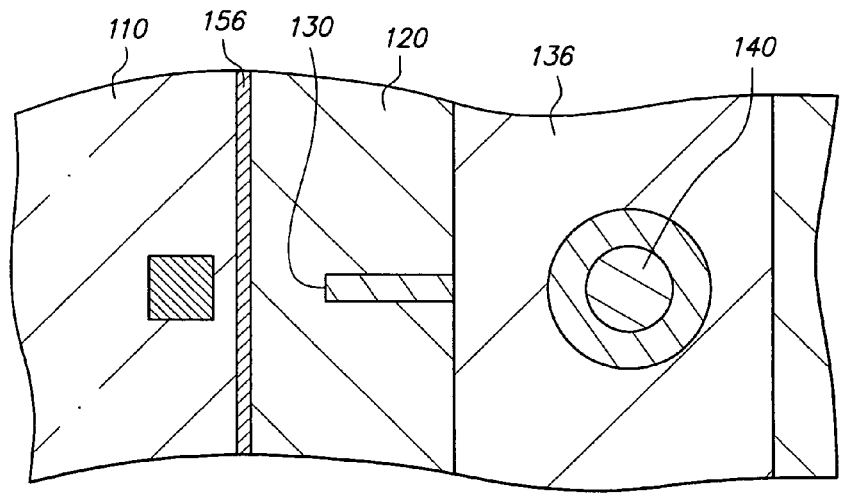
Figure 9C:
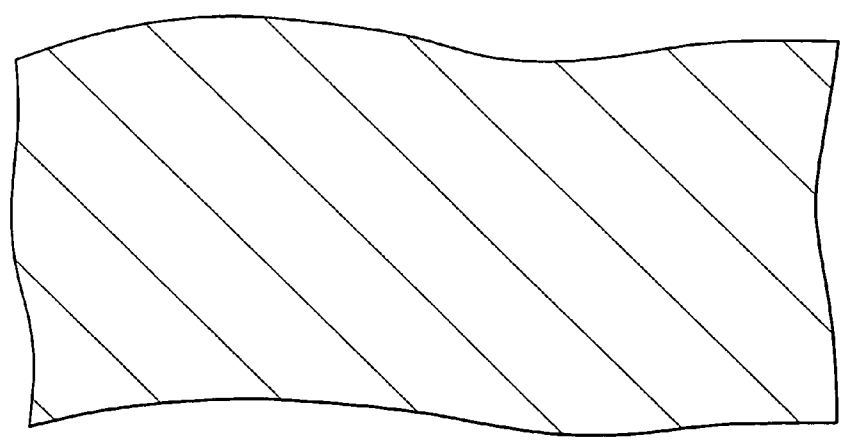

FIGS. 9A, 9B and 9C are cross-sectional, top and bottom views, respectively, of chip 110 mechanically attached to metal base 120, routing line 130, solder mask 136 and metal pillar 140 by adhesive 156.

Adhesive 156 extends between and contacts chip 110 and metal base 120 but remains spaced and separated from routing line 130, solder mask 136 and metal pillar 140. Surface 112 of chip 110 faces upwardly and away from metal base 120 and routing line 130 and is exposed, and surface 114 of chip 110 faces downwardly and towards metal base 120 and is covered by adhesive 156. Chip 110 and metal base 120 do not contact one another, and chip 110 and routing line 130 do not contact one another.

Adhesive 156 is sandwiched between chip 110 and metal base 120 using relatively low pressure from a pick-up head that places chip 110 on adhesive 156, holds chip 110 against adhesive 156 for 5 seconds and then releases chip 110. The pick-up head is heated to a relatively low temperature such as 150° C., and adhesive 156 receives heat from the pick-up head transferred through chip 110. As a result, adhesive 156 proximate to chip 110 is partially polymerized (B stage) and forms a gel but is not fully cured, and adhesive 156 that is partially polymerized provides a loose mechanical bond between chip 110 and metal base 120.

Chip 110 and metal base 120 are positioned relative to one another so that chip 110 is disposed within the periphery of adhesive 156, and routing line 130, solder mask 136 and metal pillar 140 are disposed outside the periphery of chip 110. Chip 110 and metal base 120 can be aligned using an automated pattern recognition system.

Thereafter, the structure is placed in an oven and adhesive 156 is fully cured (C stage) at relatively low temperature in the range of 200 to 250° C. to form a solid adhesive insulative thermosetting polyimide layer that contacts and is sandwiched between and mechanically attaches chip 110 and metal base 120. Adhesive 156 is 5 microns thick between chip 110 and metal base 120.

At this stage, metal base 120 covers and extends downwardly beyond chip 110, routing line 130, solder mask 136, metal pillar 140 and adhesive 156, routing line 130 is disposed outside the periphery of chip 110, extends laterally beyond metal pillar 140 towards chip 110 and extends downwardly beyond chip 110 and metal pillar 140, metal pillar 140 is disposed outside the periphery of chip 110, extends vertically across most of the thickness of chip 110 (between surfaces 112 and 114), extends upwardly beyond chip 110 and is disposed upwardly beyond and overlaps routing line 130, and adhesive 156 extends downwardly beyond chip 110. Furthermore, chip 110 remains electrically isolated from routing line 130.

Figure 10A:
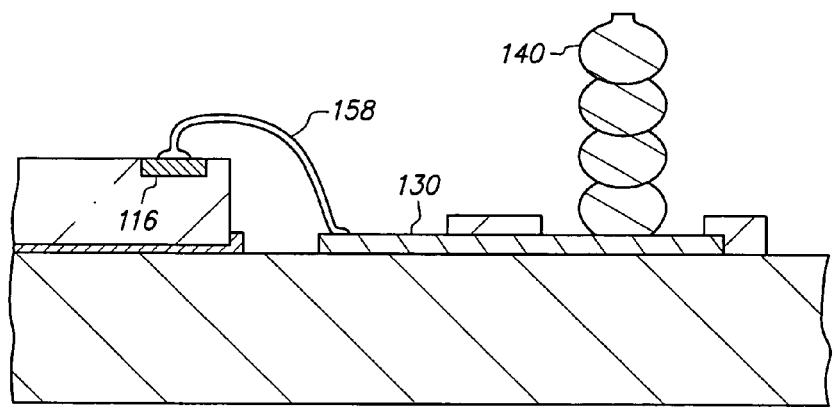
Figure 10B:
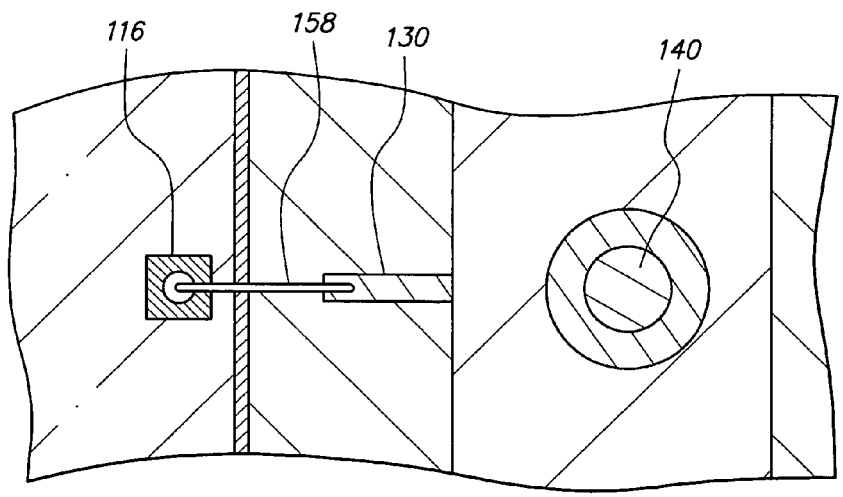
Figure 10C:
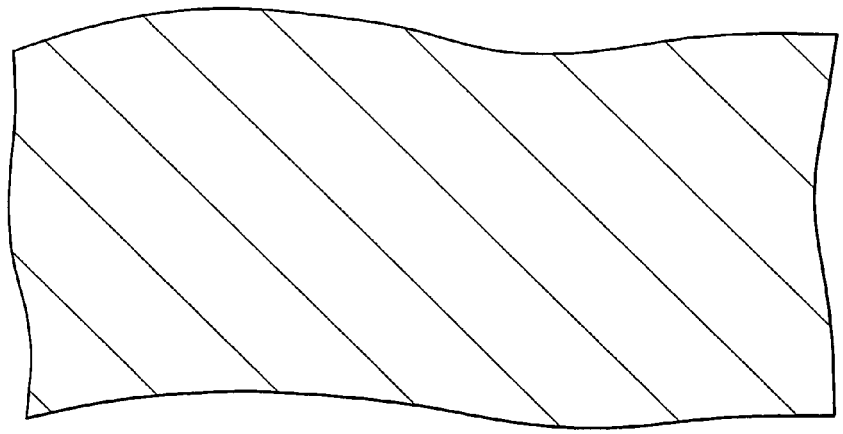

FIGS. 10A, 10B and 10C are cross-sectional, top and bottom views, respectively, of connection joint 158 formed on pad 116 and routing line 130.

Connection joint 158 is a gold wire bond that is ball bonded to pad 116 and then wedge bonded to routing line 130. Thus, connection joint 158 contacts and electrically connects pad 116 and routing line 130, and consequently, electrically connects pad 116 and metal pillar 140. Furthermore, connection joint 158 extends within and outside the periphery of chip 110, extends upwardly beyond chip 110 by 100 microns and is spaced and separated from metal pillar 140.

Although connection joint 158 includes a ball bond that is welded to pad 116, connection joint 158 also includes an elongated stem that extends from the ball bond and is wedge bonded to routing line 130. As a result, connection joint 158 does not consist essentially of or consist of a ball bond or a stud bump.

Figure 11A:
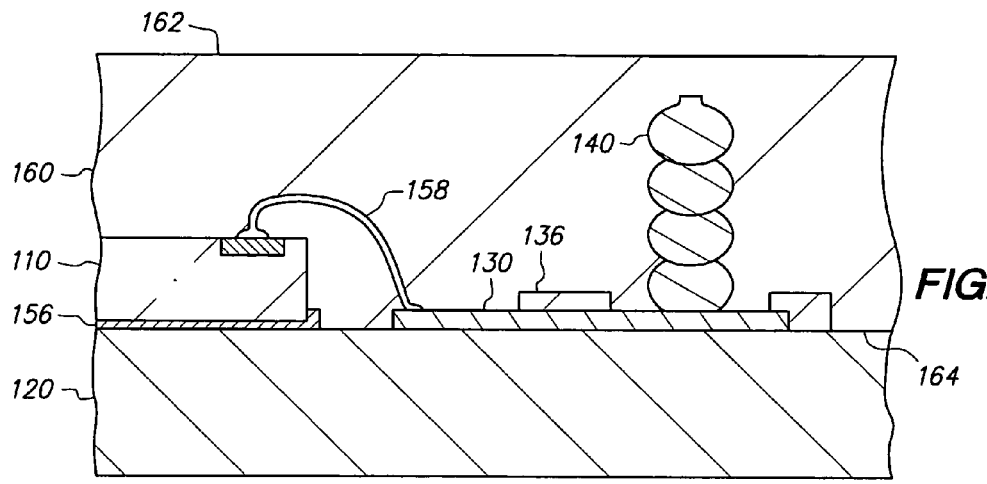
Figure 11B:
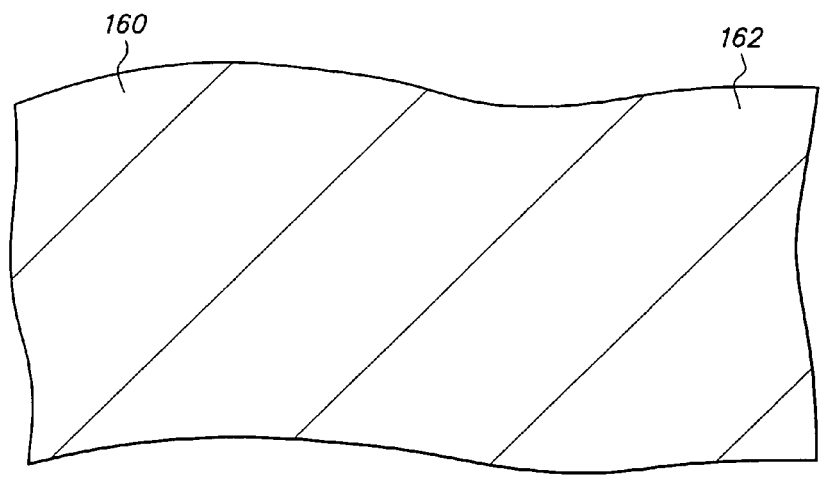
Figure 11C:
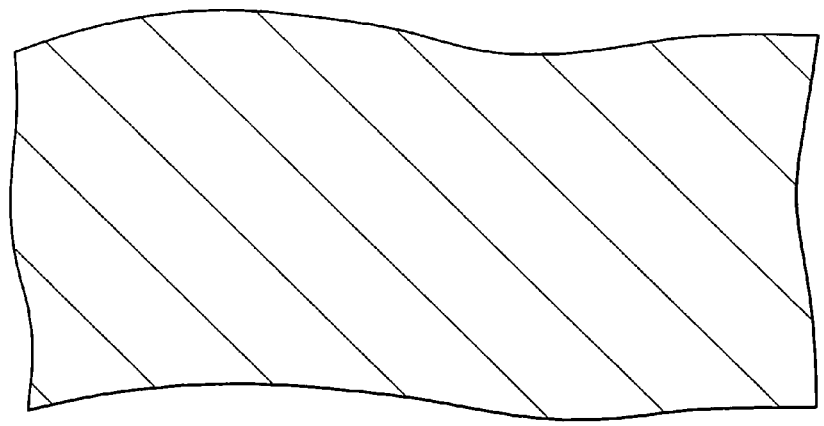

FIGS. 11A, 11B and 11C are cross-sectional, top and bottom views, respectively, of encapsulant 160 formed on chip 110, routing line 130, solder mask 136, metal pillar 140, adhesive 156 and connection joint 158.

Encapsulant 160 is deposited by transfer molding. Transfer molding is the most popular chip encapsulation method for essentially all plastic packages. Generally speaking, transfer molding involves forming components in a closed mold from a molding compound that is conveyed under pressure in a hot, plastic state from a central reservoir called the transfer pot through a tree-like array of runners and gates into closed cavities. Molding compounds are well-known in the art.

The preferred transfer molding system includes a preheater, a mold, a press and a cure oven. The mold includes an upper mold section and a lower mold section, also called "platens" or "halves" which define the mold cavities. The mold also includes the transfer pot, runners, gates and vents. The transfer pot holds the molding compound. The runners and gates provide channels from the transfer pot to the cavities. The gates are placed near the entrances of the cavities and are constricted to control the flow and injection velocity of the molding compound into the cavities and to facilitate removal of the solidified molding compound after molding occurs. The vents allow trapped air to escape but are small enough to permit only a negligible amount of the molding compound to pass through them.

The molding compound is initially in tablet form. The preheater applies high-frequency energy to preheat the molding compound to a temperature in the range of 50 to 100° C. The preheated temperature is below the transfer temperature and therefore the preheated molding compound is not in a fluid state. In addition, the structure is placed in one of the mold cavities, and the press operates hydraulically to close the mold and seal the mold cavities by clamping together the upper and lower mold sections. Guide pins ensure proper mating of the upper and lower mold sections at the parting line. In addition, the mold is heated to a transfer temperature in the range of 150 to 250° C. by inserting electric heating cartridges in the upper and lower mold sections.

After closing the mold, the preheated molding compound in tablet form is placed in the transfer pot. Thereafter, a transfer plunger applies pressure to the molding compound in the transfer pot. The pressure is in the range of 10 to 100 kgf/cm$^2$ and preferably is set as high as possible without introducing reliability problems. The combination of heat from the mold and pressure from the transfer plunger converts the molding compound in the transfer pot into a fluid state. Furthermore, the pressure from the transfer plunger forces the fluid molding compound through the runners and the gates into the mold cavities. The pressure is maintained for a certain optimum time to ensure that the molding compound fills the cavities.

The lower mold section contacts and makes sealing engagement with and is generally flush with metal base 120. However, the upper mold section is spaced from metal pillar 140 by 150 microns. As a result, the molding compound contacts the exposed portions of the chip 110, metal base 120, solder mask 136, metal pillar 140, adhesive 156 and connection joint 158 in the cavity. After 1 to 3 minutes at the transfer temperature, the molding compound polymerizes and is partially cured in the mold.

Once the partially cured molding compound is resilient and hard enough to withstand ejection forces without significant permanent deformation, the press opens the mold, ejector pins remove the molded structure from the mold, and excess molding compound attached to the molded structure that solidified in the runners and the gates is trimmed and removed. The molded structure is then loaded into a magazine and postcured in the curing oven for 4 to 16 hours at a temperature somewhat lower than the transfer temperature but well above room temperature to completely cure the molding compound.

The molding compound is a multi-component mixture of an encapsulating resin with various additives. The principal additives include curing agents (or hardeners), accelerators, inert fillers, coupling agents, flame retardants, stress-relief agents, coloring agents and mold-release agents. The encapsulating resin provides a binder, the curing agent provides linear/cross-polymerization, the accelerator enhances the polymerization rate, the inert filler increases thermal conductivity and thermal shock resistance and reduces the thermal coefficient of expansion, resin bleed, shrinkage and residual stress, the coupling agent enhances adhesion to the structure, the flame retardant reduces flammability, the stress-relief agent reduces crack propagation, the coloring agent reduces photonic activity and device visibility, and the mold-release agent facilitates removal from the mold.

Encapsulant 160 contacts and covers chip 110, metal base 120, solder mask 136, metal pillar 140, adhesive 156 and connection joint 158. More particularly, encapsulant 160 contacts surface 112 and the outer edges of chip 110, but is spaced and separated from surface 114 of chip 110 (due to adhesive 156).

Encapsulant 160 is a solid adherent compressible protective layer that provides environmental protection such as moisture resistance and particle protection for chip 110 as well as mechanical support for routing line 130 and metal pillar 140. Furthermore, chip 110 and metal pillar 140 are embedded in encapsulant 160.

Encapsulant 160 includes opposing surfaces 162 and 164. Surface 162 faces upwardly, and surface 164 faces downwardly. Encapsulant 160 extends upwardly beyond chip 110, metal base 120, routing line 130, solder mask 136, metal pillar 140, adhesive 156 and connection joint 158, has a thickness of 600 microns and extends 150 microns upwardly beyond metal pillar 140.

Figure 12A:
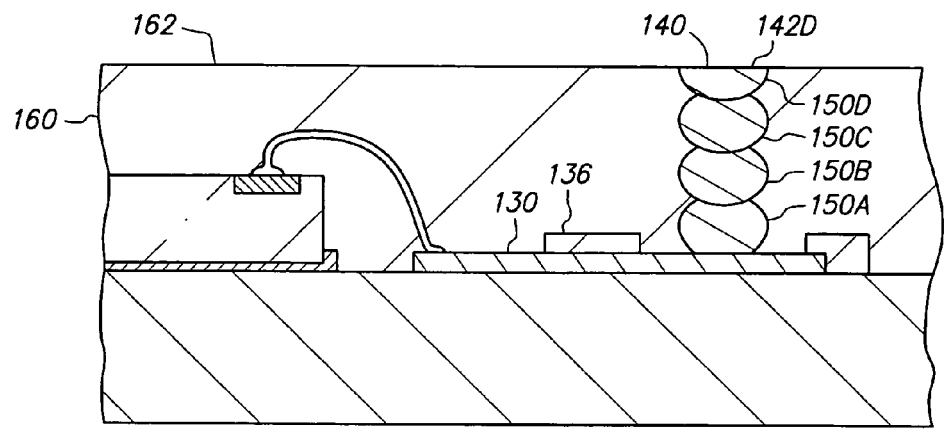
Figure 12B:
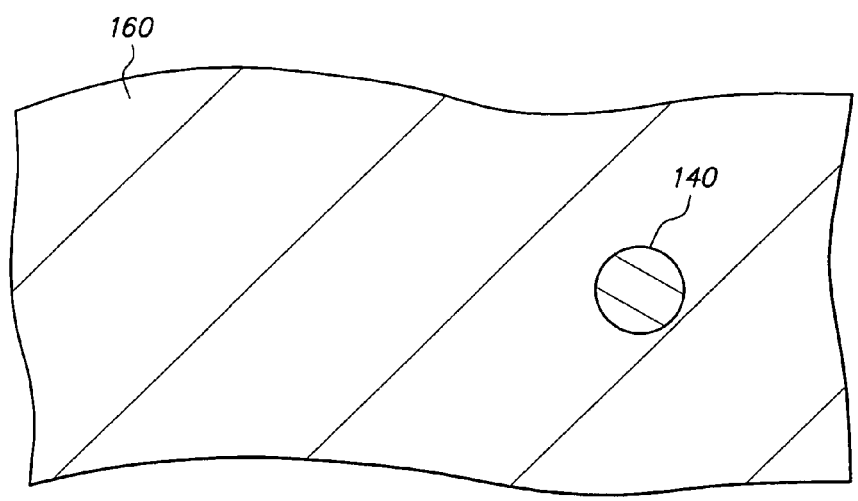
Figure 12C:
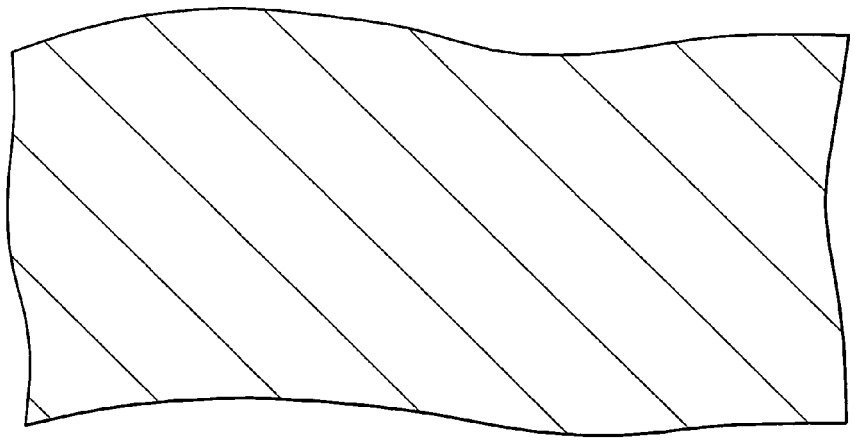

FIGS. 12A, 12B and 12C are cross-sectional, top and bottom views, respectively, of the structure after an upper portion of encapsulant 160 is removed.

The upper portion of encapsulant 160 is removed by grinding. In particular, a rotating diamond sand wheel and distilled water are applied to surface 162 of encapsulant 160. Initially, the diamond sand wheel grinds only encapsulant 160. As the grinding continues, encapsulant 160 becomes thinner as surface 162 migrates downwardly. Eventually the diamond sand wheel contacts metal pillar 140, and as a result, begins to grind metal pillar 140 as well. As the grinding continues, metal pillar 140 and encapsulant 160 become thinner as their grinded surfaces migrate downwardly. The grinding continues until metal pillar 140 and encapsulant 160 have the desired thickness, and then halts before it reaches chip 110, metal base 120, routing line 130, solder mask 136, adhesive 156 or connection joint 158. Thereafter, the structure is rinsed in distilled water to remove contaminants.

Metal pillar 140 and encapsulant 160 extend upwardly beyond chip 110 by 250 microns after the grinding operation. Thus, the grinding removes a 50 micron thick upper portion of metal pillar 140 and a 200 micron thick upper portion of encapsulant 160. Furthermore, metal ball 142D is ball bond 150D since the grinding removes stump 152D. Thus, metal pillar 140 remains welded to routing line 130 and is solely ball bonds 150A, 150B, 150C and 150D.

At this stage, chip 110 and metal pillar 140 remain embedded in encapsulant 160. Metal pillar 140 and surface 162 of encapsulant 160 are laterally aligned with one another and exposed. Thus, an exposed planarized horizontal surface that faces upwardly includes metal pillar 140 and encapsulant 160. Metal pillar 140 and encapsulant 160 continue to extend upwardly beyond chip 110, metal base 120, routing line 130, solder mask 136, adhesive 156 and connection joint 158, metal pillar 140 continues to extend vertically across most of the thickness of chip 110, and encapsulant 160 continues to cover chip 110. Furthermore, metal pillar 140 extends through surface 162 of encapsulant 160, and encapsulant 160 no longer covers metal pillar 140. Stated differently, metal pillar 140 is not covered in the upward direction by encapsulant 160 or any other insulative material of the structure.

Figure 13A:
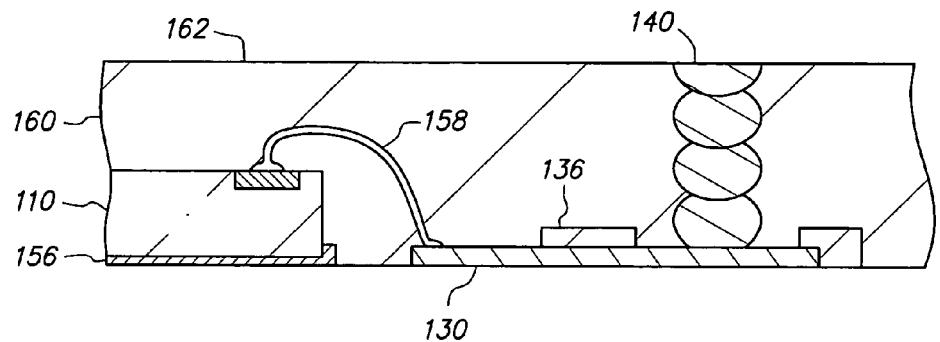
Figure 13B:
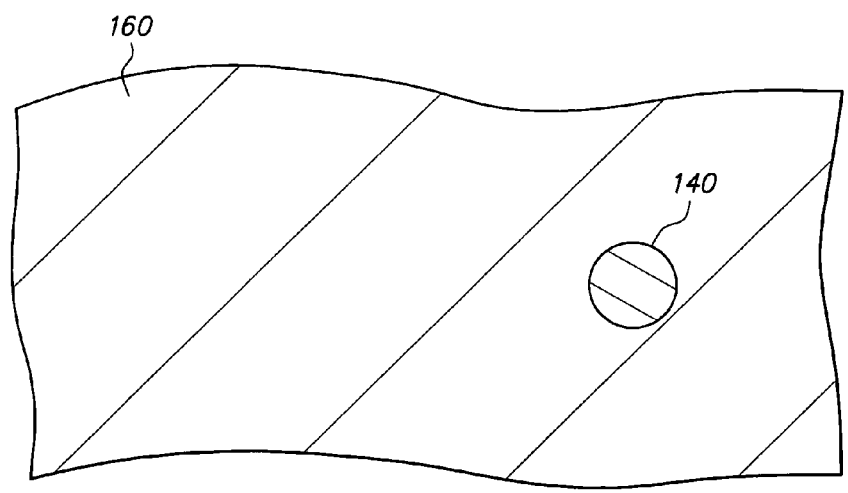
Figure 13C:
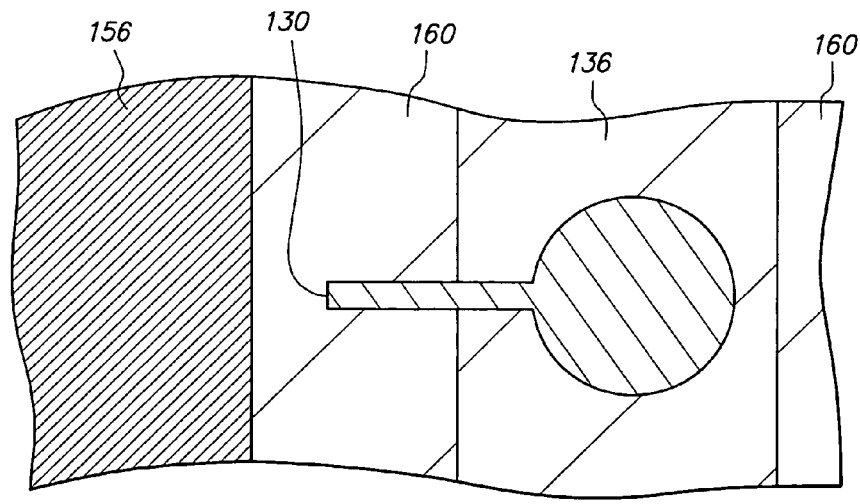

FIGS. 13A, 13B and 13C are cross-sectional, top and bottom views, respectively, of the structure after metal base 120 is removed.

Metal base 120 is removed by applying a blanket back-side wet chemical etch. For instance, a bottom spray nozzle (not shown) can spray a wet chemical etch on metal base 120 while a top spray nozzle (not shown) is deactivated, or alternatively, a front-side protective mask such as a polyimide tape can be placed over and cover metal pillar 140 in the upward direction and the structure can be dipped in the wet chemical. The wet chemical etch is highly selective of copper with respect to nickel, polyimide, the solder mask material and the molding compound, and therefore, highly selective of metal base 120 with respect to the first nickel layer of routing line 130, solder mask 136, adhesive 156 and encapsulant 160. Chip 110, metal pillar 140 and connection joint 158 are not exposed to the wet chemical etch. Furthermore, the first nickel layer of routing line 130, solder mask 136 and encapsulant 160 protect the copper layer of routing line 130 from the wet chemical etch. Therefore, no appreciable amount of routing line 130, solder mask 136, adhesive 156 or encapsulant 160 is removed.

The wet chemical etch removes metal base 120. As a result, the wet chemical etch eliminates contact area between metal base 120 and routing line 130 and exposes routing line 130.

A suitable wet chemical etch can be provided by a solution containing alkaline ammonia. The optimal etch time for removing metal base 120 without excessively exposing routing line 130 to the wet chemical etch can be established through trial and error.

Advantageously, encapsulant 160 provides mechanical support for routing line 130 and metal pillar 140 and reduces mechanical strain on solder mask 136 and adhesive 156, which is particularly useful after metal base 120 is removed. Encapsulant 160 protects routing line 130 and metal pillar 140 from mechanical damage by the wet chemical etch and subsequent cleaning steps (such as rinsing in distilled water and air blowing). For instance, encapsulant 160 absorbs physical force of the wet chemical etch and cleaning steps that might otherwise separate routing line 130 from metal pillar 140. Thus, encapsulant 160 improves structural integrity and allows the wet chemical etch and subsequent cleaning steps to be applied more vigorously, thereby improving manufacturing throughput.

Figure 14A:
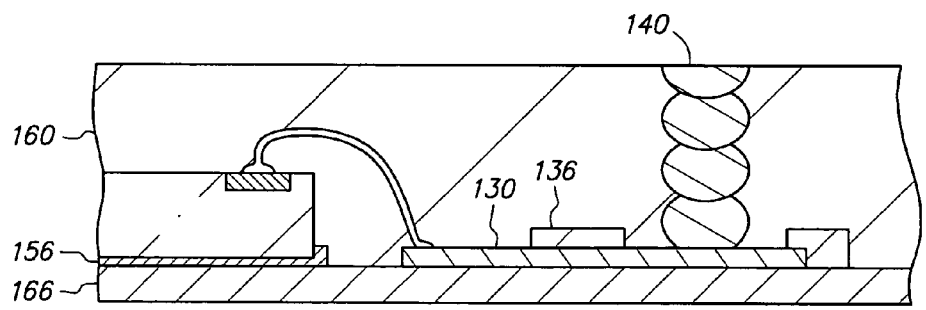
Figure 14B:
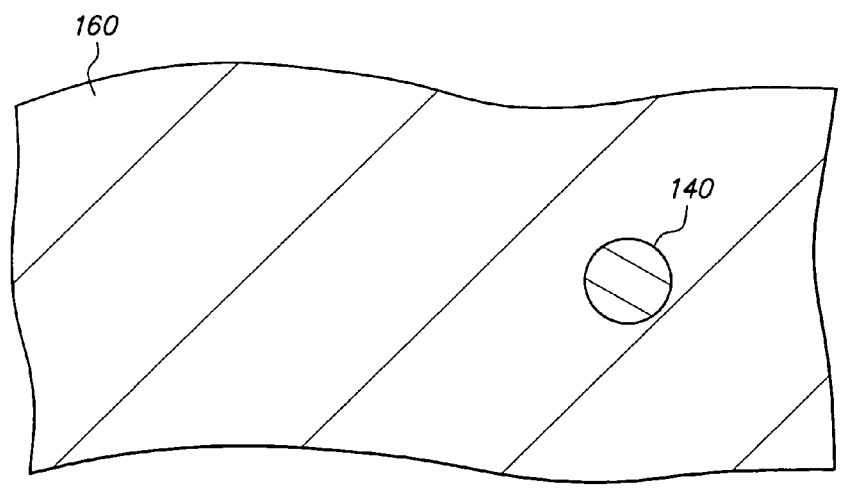
Figure 14C:
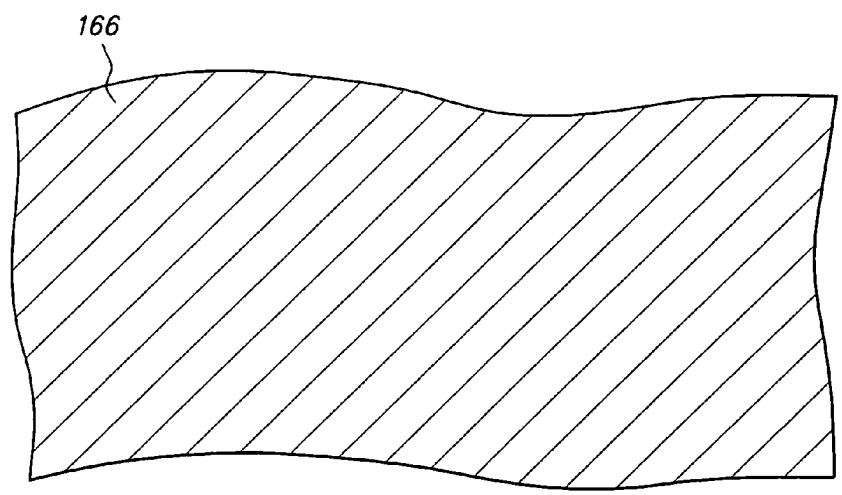

FIGS. 14A, 14B and 14C are cross-sectional, top and bottom views, respectively, of insulative base 166 formed on routing line 130, solder mask 136, adhesive 156 and encapsulant 160.

Insulative base 166 is initially an epoxy in paste form that includes an epoxy resin, a curing agent, an accelerator and a filler. The filler is an inert material, such as silica (powdered fused quartz), that improves thermal conductivity, thermal shock resistance, and thermal coefficient of expansion matching. The epoxy paste is blanketly deposited on routing line 130, solder mask 136, adhesive 156 and encapsulant 160, and then the epoxy paste is cured or hardened at a relatively low temperature in the range of 100 to 250° C. to form a solid adherent insulator that provides a protective seal for routing line 130.

Insulative base 166 contacts and covers and extends downwardly beyond routing line 130, solder mask 136, adhesive 156 and encapsulant 160, covers and extends downwardly beyond and is spaced from chip 110, metal pillar 140 and connection joint 158, and has a thickness of 50 microns.

For convenience of illustration, insulative base 166 is shown below chip 110 to retain a single orientation throughout the figures for ease of comparison between the figures, although in this step the structure would be inverted so that gravitational force would assist the epoxy paste deposition.

Figure 15A:
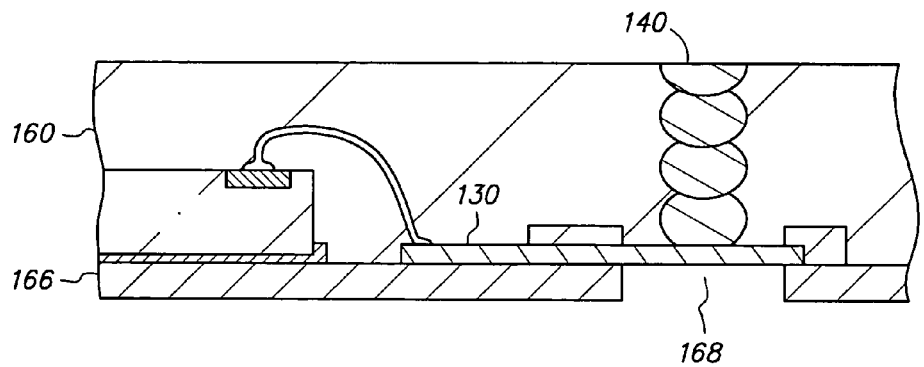
Figure 15B:
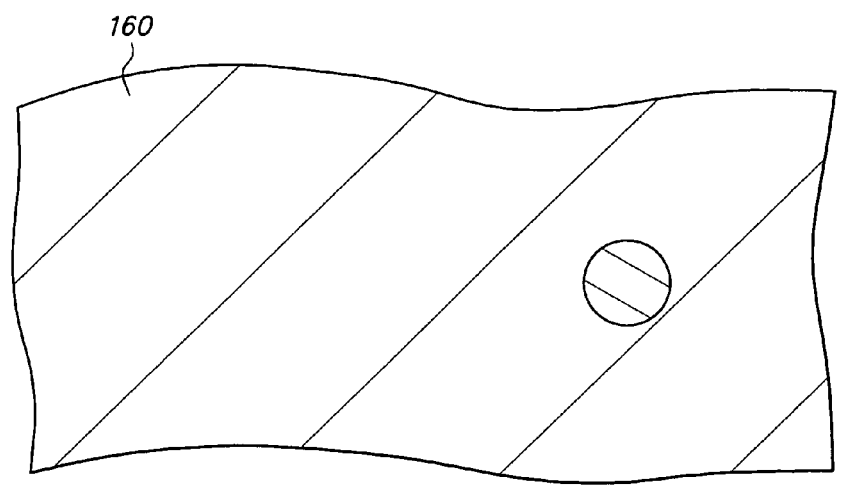
Figure 15C:
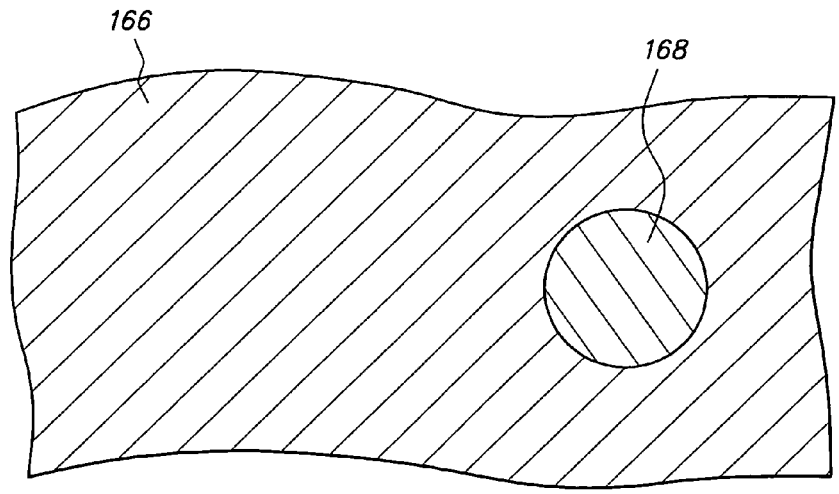

FIGS. 15A, 15B and 15C are cross-sectional, top and bottom views, respectively, of opening 168 that extends through insulative base 166 and exposes routing line 130.

Opening 168 is formed through insulative base 166 by applying a suitable etch that is highly selective of insulative base 166 with respect to routing line 130. In this instance, a selective TEA $CO_2$ laser etch is applied using multiple laser direct writes. The laser is directed at enlarged circular portion 134 of routing line 130. The laser has a spot size of 150 microns, and enlarged circular portion 134 has a diameter of 400 microns. Furthermore, the laser direct writes are offset relative to one another yet overlap so that the laser scans a central portion of enlarged circular portion 134 with a diameter of 300 microns. In this manner, the laser direct writes in combination are vertically aligned with and centered relative to enlarged circular portion 134. As a result, the laser strikes routing line 130, a portion of insulative base 166 that extends within the periphery of routing line 130, and ablates insulative base 166.

The laser drills through and removes a portion of insulative base 166. However, a portion of insulative base 166 that extends across the peripheral edges of enlarged circular portion 134 is outside the scope of the laser and remains intact.

Thereafter, a brief cleaning step can be applied to remove oxides and debris that may be present on the exposed portion of routing line 130. For instance, a brief oxygen plasma cleaning step can be applied to the structure. Alternatively, a brief wet chemical cleaning step using a solution containing potassium permanganate can be applied to the structure. In either case, the cleaning step cleans the exposed portion of routing line 130 without damaging the structure. Likewise, the cleaning step can clean the exposed portion of metal pillar 140.

Opening 168 is formed in and extends vertically through insulative base 166, is disposed outside the periphery of chip 110, is vertically aligned with and exposes enlarged circular portion 134 of routing line 130, is spaced from elongated routing portion 132 of routing line 130, adhesive 156 and encapsulant 160 and has a diameter of 300 microns. Opening 168 is formed without damaging routing line 130 or metal pillar 140 and does not extend into encapsulant 160.

Opening 168 may have a diameter that is slightly larger than 300 microns due to the beam angle of the laser, the thermal effects of the laser, and/or the isotropic nature of an oxygen plasma or wet chemical cleaning step. For convenience of explanation, this slight enlargement is ignored.

As a result, insulative base 166 contains opening 168 with a diameter of 300 microns that is vertically aligned with and selectively exposes enlarged circular portion 134. Insulative base 166 exposes an inner circular region of enlarged circular portion 134 with a diameter of 300 microns, and covers an outer annular region of enlarged circular portion 134 with a width of 50 microns ((400−300)/2). In addition, openings 138 and 168 are vertically aligned with one another.

Figure 16A:
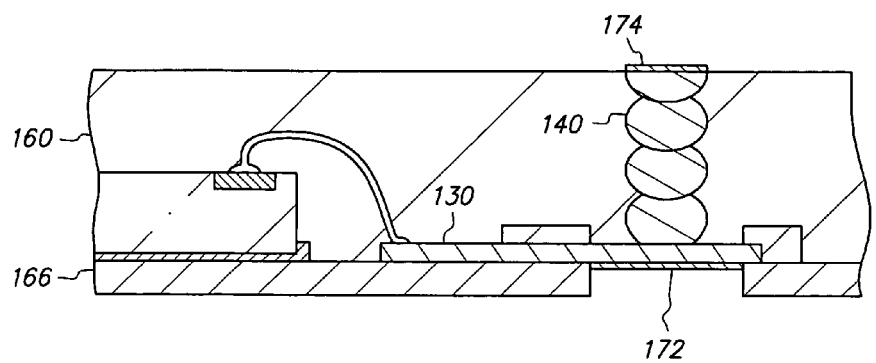
Figure 16B:
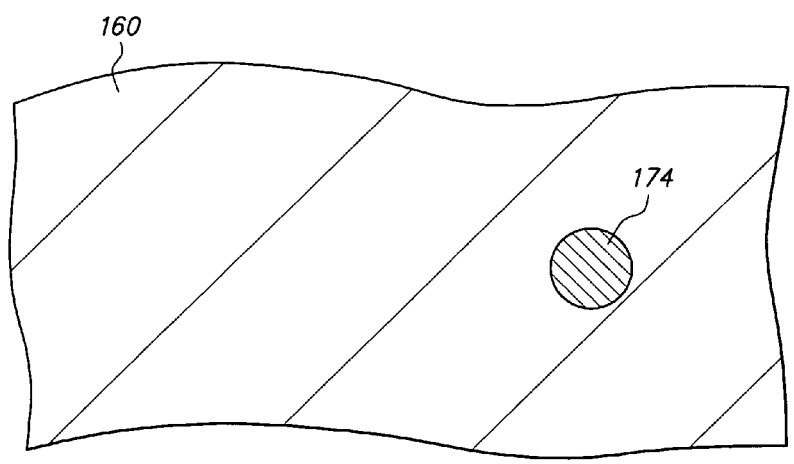
Figure 16C:
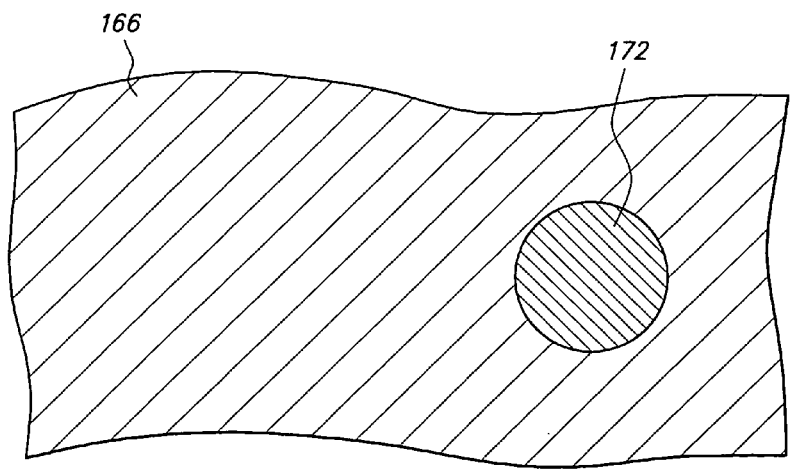

FIGS. 16A, 16B and 16C are cross-sectional, top and bottom views, respectively, of plated terminal 172 formed on routing line 130 and plated terminal 174 formed on metal pillar 140.

Plated terminals 172 and 174 are electrolessly plated on the exposed portions of routing line 130 and metal pillar 140, respectively. More particularly, plated terminal 172 is plated on enlarged circular portion 134 of routing line 130 in opening 168, and plated terminal 174 is plated on metal pillar 140 during an electroless plating operation.

Plated terminal 172 is composed of a nickel layer electrolessly plated on routing line 130 and a gold layer electrolessly plated on the nickel layer, and plated terminal 174 is composed of a nickel layer electrolessly plated on metal pillar 140 and a gold layer electrolessly plated on the nickel layer. In plated terminal 172, the nickel layer contacts and is sandwiched between routing line 130 and the gold layer, and the gold layer is spaced and separated from routing line 130 and exposed. In plated terminal 174, the nickel layer contacts and is sandwiched between metal pillar 140 and the gold layer, and the gold layer is spaced and separated from metal pillar 140 and exposed. For convenience of illustration, the nickel and gold layers are shown as a single layer.

The structure is submerged in an electroless nickel plating solution such as Enthone Enplate NI-424 at 85° C. Preferred nickel plating solutions include nickel-sulfate and nickel-chloride and have a pH of about 9.5 to 10.5. A higher nickel concentration provides a faster plating rate but reduces the stability of the solution. The amount of chelating agents or ligands in the solution depends on the nickel concentration and their chemical structure, functionality and equivalent weight. Most of the chelating agents used in electroless nickel plating solutions are hydroxy organic acids which form one or more water soluble nickel ring complexes. These complexes reduce the free nickel ion concentration, thereby increasing the stability of the solution while retaining a reasonably fast plating rate. Generally, the higher the complex agent concentration, the slower the plating rate. In addition, the pH of the solution and the plating rate continually decrease as the electroless plating continues due to hydrogen ions being introduced into the solution as a byproduct of the nickel reduction. Accordingly, the solution is buffered to offset the effects of the hydrogen ions. Suitable buffering agents include sodium or potassium salts of mono and dibasic organic acids. Finally, those skilled in the art will understand that electroless nickel plating solutions do not deposit pure elemental nickel since a reducing agent such as $H_2PO_2$ will naturally decompose into the electrolessly plated nickel. Therefore, those skilled in the art will understand that electrolessly plated nickel refers to a nickel compound that is mostly nickel but not pure elemental nickel.

Routing line 130 includes an exposed nickel surface layer and therefore is catalytic to electroless nickel. Likewise, metal pillar 140 is gold and is electrically connected to routing line 130 and therefore is catalytic to electroless nickel. Furthermore, encapsulant 160 and insulative base 166 are not catalytic to electroless nickel and therefore a plating mask is not necessary. As a result, plated terminal 172 plates on routing line 130 and plated terminal 174 plates on metal pillar 140.

The electroless nickel plating operation continues until plated terminals 172 and 174 are about 4 microns thick. At this point, plated terminals 172 and 174 are primarily nickel and contain about 4 to 9 weight percentage phosphorus.

Thereafter, the structure is removed from the electroless nickel plating solution and briefly submerged in an electroless gold plating solution such as is MacDermid PLANAR™ at 70° C. Plated terminals 172 and 174 include exposed nickel surface layers and therefore are catalytic to electroless gold. Furthermore, encapsulant 160 and insulative base 166 are not catalytic to electroless gold and therefore a plating mask is not necessary. As a result, the gold deposits on the nickel surface layers. The gold electroless plating operation continues until the gold surface layers are about 0.5 microns thick. Thereafter, the structure is removed from the electroless gold plating solution and rinsed in distilled water.

In this manner, plated terminals 172 and 174 are simultaneously formed during a single electroless plating operation.

Plated terminal 172 contacts and is electrically connected to routing line 130 in opening 168 and extends downwardly beyond routing line 130. Plated terminal 172 contacts and covers the portion of routing line 130 that was previously exposed by opening 168. Thus, plated terminal 172 provides a robust, permanent electrical connection to routing line 130 that protrudes downwardly from routing line 130 and is exposed. Plated terminal 172 includes a buried nickel layer and a gold surface layer. The buried nickel layer provides the primary mechanical and electrical connection to routing line 130, and the gold surface layer provides a wettable surface to facilitate solder reflow. Plated terminal 172 has a cylindrical shape with a diameter of 300 microns.

Plated terminal 174 contacts and is electrically connected to metal pillar 140 and extends upwardly beyond metal pillar 140 and encapsulant 160. Thus, plated terminal 174 provides a robust, permanent electrical connection to metal pillar 140 that protrudes upwardly from metal pillar 140 and is exposed. Plated terminal 174 includes a buried nickel layer and a gold surface layer. The buried nickel layer provides the primary mechanical and electrical connection to metal pillar 140, and the gold surface layer provides a wettable surface to facilitate solder reflow. Plated terminal 174 has a cylindrical shape with a diameter of about 300 microns.

At this stage, conductive trace 154 includes routing line 130, metal pillar 140 and plated terminals 172 and 174 and is electrically connected to pad 116 by connection joint 158. Connection joint 158 and plated terminals 172 and 174 are spaced and separated from one another, and plated terminals 172 and 174 are vertically aligned with one another.

Figure 17A:
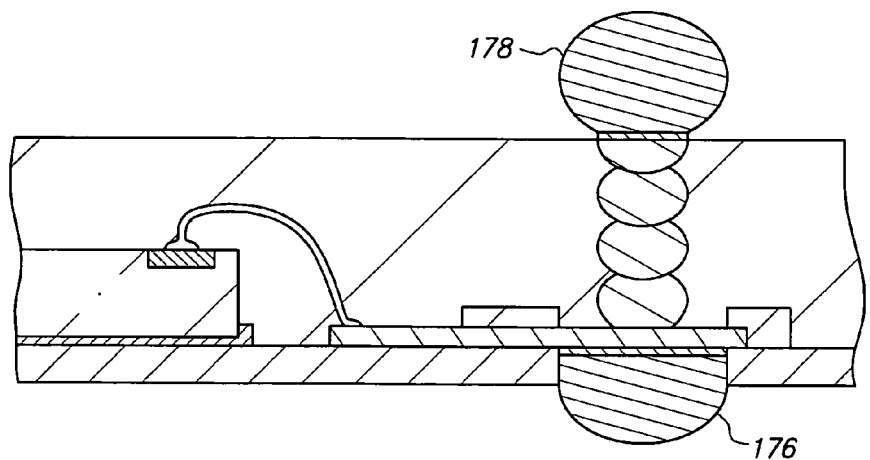
Figure 17B:
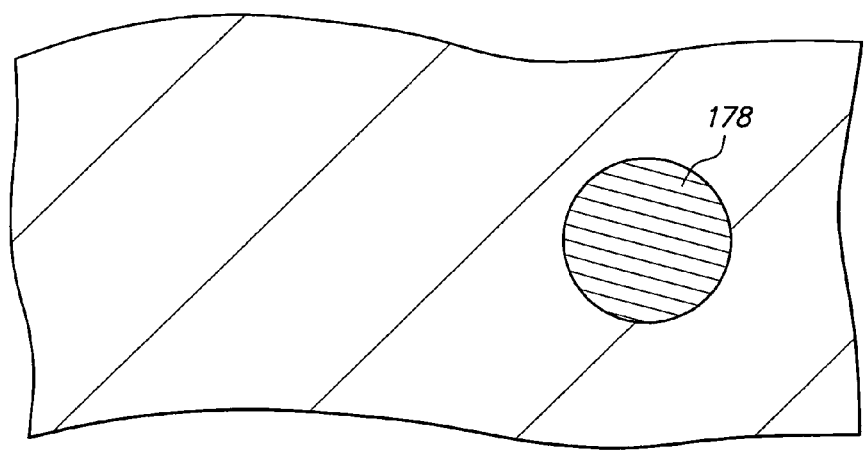
Figure 17C:
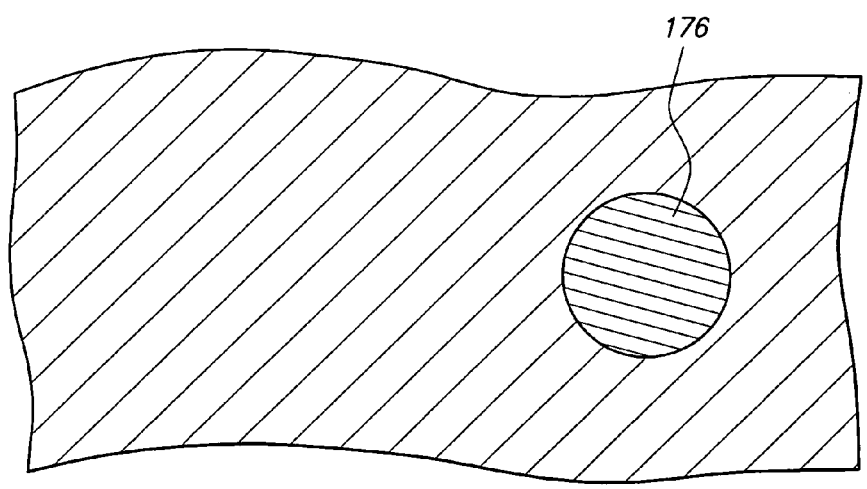

FIGS. 17A, 17B and 17C are cross-sectional, top and bottom views, respectively, of solder terminals 176 and 178 formed on plated terminals 172 and 174, respectively.

Solder terminals 176 and 178 are initially tin-lead balls with spherical shapes. The tin-lead balls are dipped in flux to provide solder terminals 176 and 178 with flux surface coatings that surround the tin-lead balls. Thereafter, the structure is inverted so that plated terminal 172 faces upwardly, and solder terminal 176 is deposited on plated terminal 172. Solder terminal 176 weakly adheres to plated terminal 172 due to the flux surface coating of solder terminal 176. Thereafter, the structure is inverted again so that plated terminal 174 faces upwardly, and solder terminal 178 is deposited on plated terminal 174. Solder terminal 176 still weakly adheres to plated terminal 172 due to the flux surface coating of solder terminal 176, and solder terminal 178 weakly adheres to plated terminal 174 due to the flux surface coating of solder terminal 178.

Thereafter, heat is applied to reflow solder terminals 176 and 178. Plated terminals 172 and 174 contain gold surface layers that provide wettable surfaces for solder reflow. As a result, solder terminals 176 and 178 wet plated terminals 172 and 174, respectively. The heat is then removed and solder terminals 176 and 178 cool and solidify, and contact a larger surface area of and remain proximate to plated terminals 172 and 174, respectively.

Solder terminal 176 contacts and is electrically connected to plated terminal 172 and extends downwardly beyond insulative base 166 and plated terminal 172. Thus, solder terminal 176 provides a reflowable electrical connection to plated terminal 172 that protrudes downwardly from insulative base 166 and plated terminal 172 and is exposed. Solder terminal 176 has a substantially hemispherical shape with a diameter of about 300 microns.

Solder terminal 178 contacts and is electrically connected to plated terminal 174 and extends upwardly beyond encapsulant 160 and plated terminal 174. Thus, solder terminal 178 provides a reflowable electrical connection to plated terminal 174 that protrudes upwardly from encapsulant 160 and plated terminal 174 and is exposed. Solder terminal 178 has a substantially spherical shape with a diameter of about 300 microns.

At this stage, conductive trace 154 includes routing line 130, metal pillar 140, plated terminals 172 and 174 and solder terminals 176 and 178. Solder terminals 176 and 178 are spaced and separated from one another and vertically aligned with one another and provide contact terminals for the assembly.

Figure 18A:
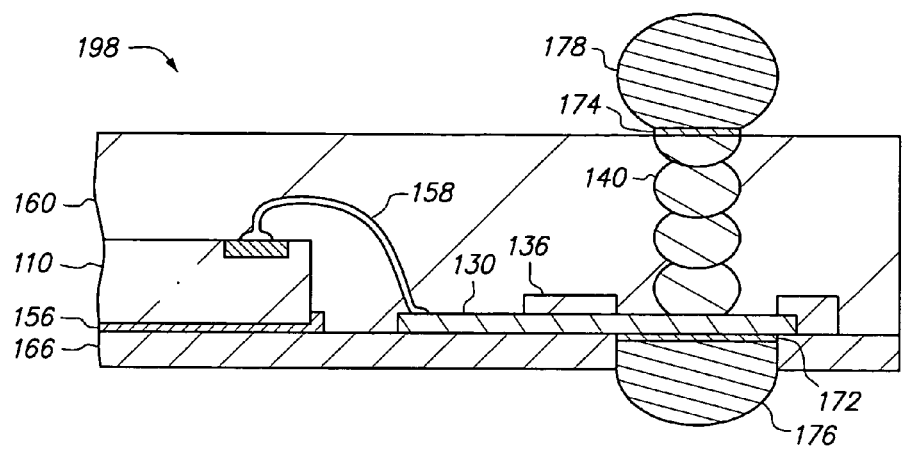
Figure 18B:
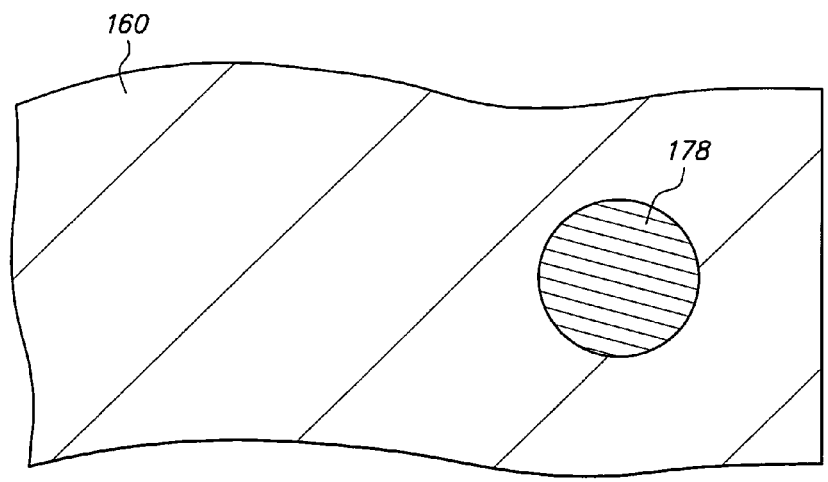
Figure 18C:
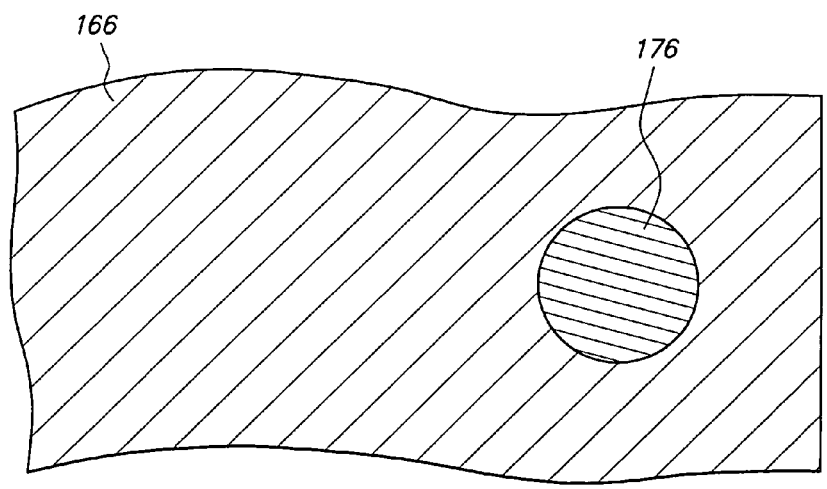

FIGS. 18A, 18B and 18C are cross-sectional, top and bottom views, respectively, of the structure after cutting encapsulant 160 and insulative base 166 with an excise blade to singulate the assembly from other assemblies.

At this stage, the manufacture of semiconductor chip assembly 198 that includes chip 110, routing line 130, solder mask 136, metal pillar 140, adhesive 156, connection joint 158, encapsulant 160, insulative base 166, plated terminals 172 and 174 and solder terminals 176 and 178 can be considered complete.

Routing line 130 is mechanically coupled to chip 110 by adhesive 156 and encapsulant 160, and is electrically coupled to chip 110 by connection joint 158. Routing line 130 provides horizontal fan-out routing between pad 116 and external circuitry, and metal pillar 140 provides vertical routing between pad 116 and external circuitry. Metal pillar 140 extends vertically across most of the thickness of chip 110, is welded to and only to routing line 130, is not covered in the upward direction by encapsulant 160 or any other insulative material of the assembly, and is not covered in the downward direction by insulative base 166 or any other insulative material of the assembly. Encapsulant 160 and insulative base 166 provide mechanical support and environmental protection for the assembly. Encapsulant 160 has most of surface 162 exposed in the upward direction, and surface 164 is covered in the downward direction.

The semiconductor chip assembly is a single-chip first-level package. Thus, chip 110 is the only chip embedded in encapsulant 160.

The semiconductor chip assembly includes other conductive traces embedded in encapsulant 160, and only a single conductive trace 154 is shown for convenience of illustration. The conductive traces are spaced and separated and electrically isolated from one another. The conductive traces each include a respective routing line, metal pillar, plated terminal pair and solder terminal pair. The conductive traces are each electrically connected to a respective pad on chip 110 by a respective connection joint. The conductive traces each extend beyond an outer edge of chip 110 and extend across most of the thickness of chip 110 to provide horizontal fan-out routing and vertical routing for their respective pads. Furthermore, the conductive traces each include upwardly and downwardly protruding solder terminals to facilitate a three-dimensional stacked arrangement.

Chip 110 is designed with the pads electrically isolated from one another.

However, the corresponding routing lines are initially electroplated on metal base 120 and electrically connected to one another by metal base 120. Furthermore, the connection joints electrically connect the routing lines and the corresponding pads, thereby electrically connecting the pads with one another. Thereafter, once metal base 120 is etched and removed, the routing lines are electrically isolated from one another, and therefore, the pads return to being electrically isolated from one another.

Advantageously, there is no plating bus or related circuitry that need be disconnected or severed from the conductive traces after the metal base is removed.

Figure 19A:
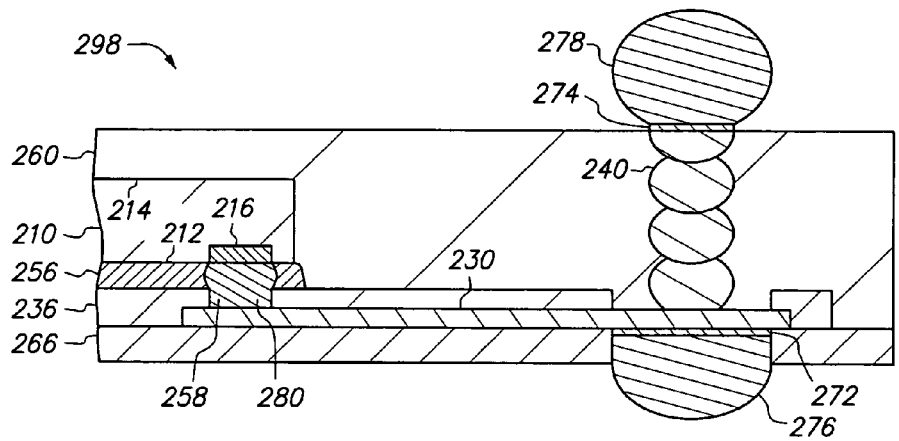
FIGS. 19A, 19B and 19C are cross-sectional, top and bottom views, respectively, of a semiconductor chip assembly in accordance with a second embodiment of the present invention.
Figure 19B:
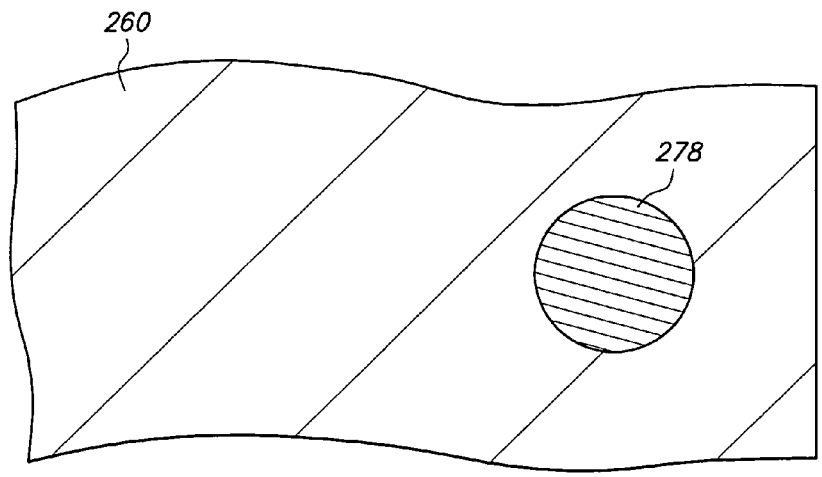
Figure 19C:
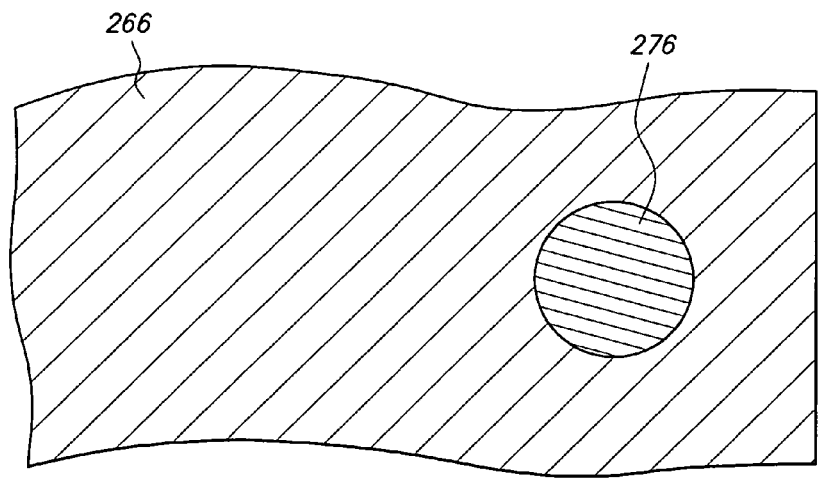

FIGS. 19A, 19B and 19C are cross-sectional, top and bottom views, respectively, of a semiconductor chip assembly in accordance with a second embodiment of the present invention. In the second embodiment, the chip is flip-chip bonded. For purposes of brevity, any description in the first embodiment is incorporated herein insofar as the same is applicable, and the same description need not be repeated. Likewise, elements of the second embodiment similar to those in the first embodiment have corresponding reference numerals indexed at two-hundred rather than one-hundred. For instance, chip 210 corresponds to chip 110, routing line 230 corresponds to routing line 130, etc.

Connection joint 258 is initially a solder bump deposited on pad 216. The solder bump has a hemispherical shape and a diameter of 100 microns.

Routing line 230 extends within and outside the periphery of chip 210 and is disposed downwardly beyond chip 210. Thus, the elongated routing portion (corresponding to elongated routing portion 132) is lengthened. This is accomplished by a slight adjustment to the electroplating operation previously described for routing line 130. In particular, the photoresist layer (corresponding to photoresist layer 126) is patterned to reshape the opening for the routing line 230, and therefore routing line 230 is lengthened relative to routing line 130.

Solder mask 236 extends laterally beyond routing line 230 in the direction away from metal pillar 240, and includes opening 280 that selectively exposes a portion of routing line 230 near the distal end of routing line 230 opposite metal pillar 240.

Chip 210 is positioned such that surface 212 faces downwardly, surface 214 faces upwardly, routing line 230 extends laterally across pad 216, and connection joint 258 is aligned with and extends into opening 280 and contacts and is sandwiched between pad 216 and routing line 230. Furthermore, metal pillar 240 extends vertically across all of the thickness of chip 210. Thereafter, heat is applied to reflow connection joint 258, and then the heat is removed and connection joint 258 cools and solidifies into a hardened solder joint that mechanically attaches and electrically connects pad 216 and routing line 230. Furthermore, connection joint 258 exhibits localized wetting and does not collapse, and chip 210 remains spaced and separated from routing line 230 and solder mask 236.

Thereafter, adhesive 256 is dispensed into and underfills the open gap between chip 210 and solder mask 236, and then adhesive 256 is cured. As a result, adhesive 256 contacts and is sandwiched between chip 210 and solder mask 236, contacts connection joint 258 and is spaced and separated from pad 216. Thus, adhesive 256 is significantly thicker than adhesive 156. A suitable underfill adhesive is Namics U8443.

Thereafter, encapsulant 260, insulative base 266, plated terminals 272 and 274 and solder terminals 276 and 278 are formed.

Semiconductor chip assembly 298 includes chip 210, routing line 230, solder mask 236, metal pillar 240, adhesive 256, connection joint 258, encapsulant 260, insulative base 266, plated terminals 272 and 274 and solder terminals 276 and 278.

Figure 20A:
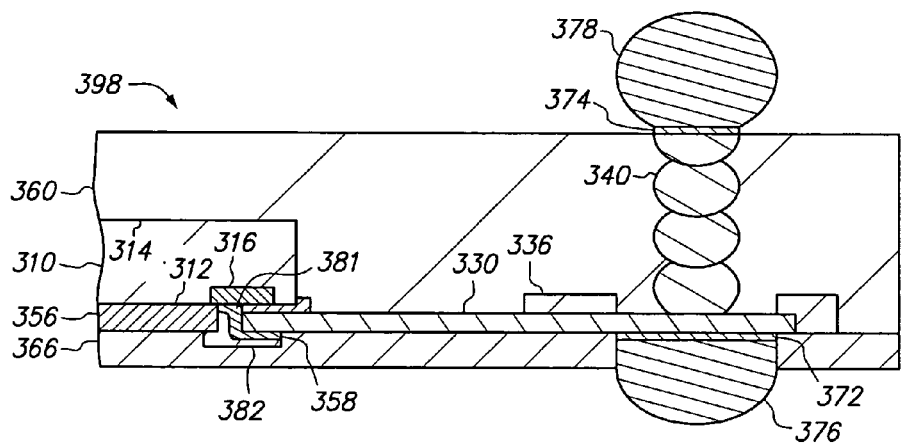
FIGS. 20A, 20B and 20C are cross-sectional, top and bottom views, respectively, of a semiconductor chip assembly in accordance with a third embodiment of the present invention.
Figure 20B:
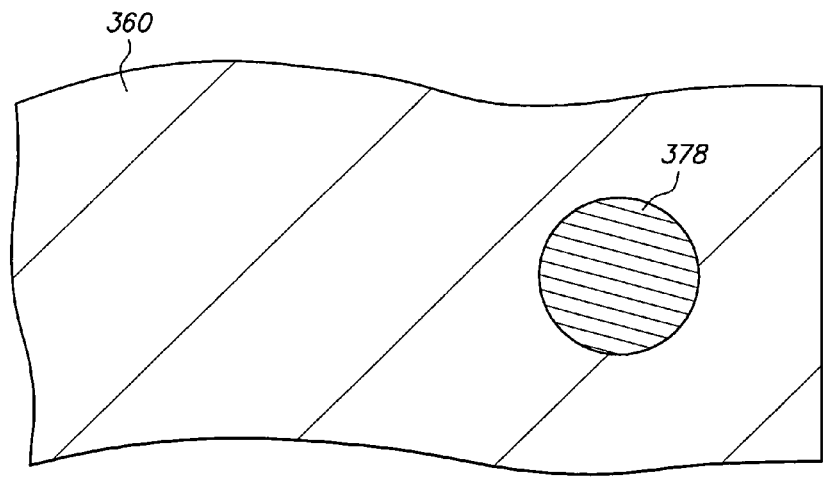
Figure 20C:
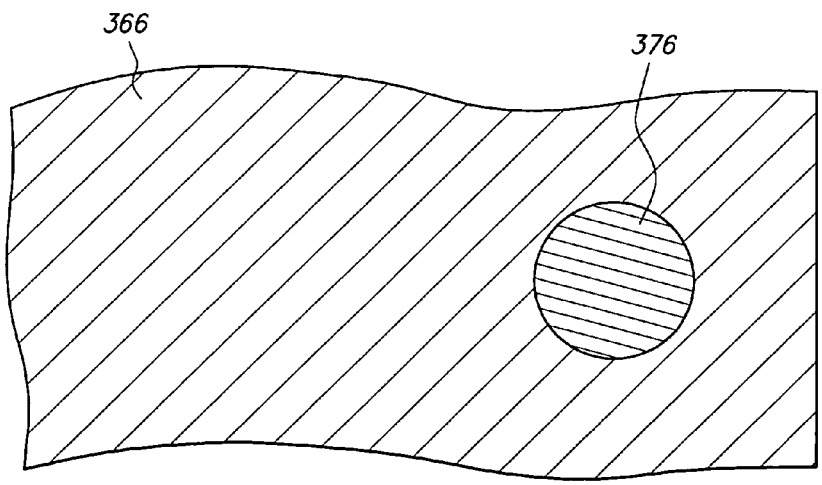

FIGS. 20A, 20B and 20C are cross-sectional, top and bottom views, respectively, of a semiconductor chip assembly in accordance with a third embodiment of the present invention. In the third embodiment, the connection joint is electroplated. For purposes of brevity, any description in the first embodiment is incorporated herein insofar as the same is applicable, and the same description need not be repeated. Likewise, elements of the third embodiment similar to those in the first embodiment have corresponding reference numerals indexed at three-hundred rather than one-hundred. For instance, chip 310 corresponds to chip 110, routing line 330 corresponds to routing line 130, etc.

Pad 316 is treated to accommodate an electroplated copper connection joint by forming a nickel surface layer on the aluminum base. For instance, chip 310 is dipped in a zinc solution to deposit a zinc layer on the aluminum base. This step is commonly known as zincation. Preferably, the zinc solution contains about 150 grams/liter of NaOH, 25 grams/liter of ZnO, and 1 gram/liter of $NaNO_3$, as well as tartaric acid to reduce the rate at which the aluminum base dissolves. Thereafter, the nickel surface layer is electrolessly deposited on the zincated aluminum base. A suitable electroless nickel plating solution is Enthone Enplate NI-424 at 85° C.

Routing line 330 extends within and outside the periphery of chip 310 and is disposed downwardly beyond chip 310. Thus, the elongated routing portion (corresponding to elongated routing portion 132) is lengthened. This is accomplished by a slight adjustment to the electroplating operation previously described for routing line 130. In particular, the photoresist layer (corresponding to photoresist layer 126) is patterned to reshape the opening for the routing line 330, and therefore routing line 330 is lengthened relative to routing line 130.

The metal base (corresponding to metal base 120) is etched on the side opposite routing line 330 to form a recess (not shown), and then adhesive 356 is deposited on the metal base and routing line 330.

Chip 310 is inverted and positioned such that surface 312 faces downwardly, surface 314 faces upwardly, adhesive 356 contacts and is sandwiched between pad 316 and routing line 330, and routing line 330 partially overlaps pad 316. Furthermore, metal pillar 340 extends vertically across all of the thickness of chip 310. Thereafter, encapsulant 360 is formed, and then the metal base is etched again to convert the recess into a slot (not shown) that extends through the metal base, exposes adhesive 356 and is vertically aligned with pad 316.

Thereafter, through-hole 381 is formed in adhesive 356 that exposes pad 316. Through-hole 381 is formed by applying a suitable etch that is highly selective of adhesive 356 with respect to pad 316 and routing line 330. In this instance, a selective TEA $CO_2$ laser etch is applied. The laser is directed at and vertically aligned with and centered relative to pad 316. The laser has a spot size of 70 microns, and pad 316 has a length and width of 100 microns. As a result, the laser strikes pad 316 and portions of routing line 330 and adhesive 356 that extend within the periphery of pad 316, and ablates adhesive 356. The laser drills through and removes a portion of adhesive 356. However, portions of adhesive 356 that extend across the peripheral edges of pad 316 are outside the scope of the laser and remain intact. Likewise, routing line 330 shields a portion of adhesive 356 from the laser etch, and a portion of adhesive 356 sandwiched between pad 316 and routing line 330 remains intact. The laser etch is anisotropic, and therefore little or none of adhesive 356 sandwiched between pad 316 and routing line 330 is undercut or removed. Through-hole 381 may slightly undercut adhesive 356 between pad 316 and routing line 330 and have a diameter that is slightly larger than 70 microns due to the beam angle of the laser, the thermal effects of the laser, and/or the isotropic nature of an oxygen plasma or wet chemical cleaning step. For convenience of explanation, this slight undercut and enlargement is ignored. However, through-hole 381 is formed without damaging chip 310 or routing line 330 and does not extend into chip 310.

Thereafter, a brief cleaning step can be applied to remove oxides and debris that may be present on the exposed portions of pad 316 and routing line 330. For instance, a brief oxygen plasma cleaning step can be applied to the structure. Alternatively, a brief wet chemical cleaning step using a solution containing potassium permanganate can be applied to the structure. In either case, the cleaning step cleans the exposed portions of pad 316 and routing line 330 without damaging the structure.

Thereafter, connection joint 358 is formed by an electroplating operation. Initially, the metal base is connected to a plating bus (not shown), current is applied to the plating bus from an external power source, and the structure is submerged in an electrolytic copper plating solution such as Sel-Rex CUBATH M™ at room temperature. As a result, connection joint 358 electroplates on the exposed portions of the metal base. In addition, since the plating bus provides the current to the metal base, which in turn provides the current to routing line 330, connection joint 358 electroplates on the exposed portions of routing line 330 in through-hole 381. At the initial stage, since adhesive 356 is an electrical insulator and pad 316 is not connected to the plating bus, connection joint 358 does not electroplate on pad 316 and is spaced from pad 316. However, as the copper electroplating continues, connection joint 358 continues to plate on routing line 330, extends through adhesive 356 and contacts pad 316. As a result, pad 316 is connected to the plating bus by the metal base, routing line 330 and connection joint 358, and therefore connection joint 358 begins to electroplate on pad 316 as well. The copper electroplating continues until connection joint 358 has the desired thickness. Thereafter, the structure is removed from the electrolytic copper plating solution and rinsed in distilled water to remove contaminants.

Thereafter, insulative plug 382 is formed on adhesive 356 and connection joint 358 and disposed within the slot, then the metal base is etched and removed, then insulative base 366 is formed, then metal pillar 340 and encapsulant 360 are grinded, and then plated terminals 372 and 374 and solder terminals 376 and 378 are formed.

Semiconductor chip assembly 398 includes chip 310, routing line 330, solder mask 336, metal pillar 340, adhesive 356, connection joint 358, encapsulant 360, insulative base 366, plated terminals 372 and 374, solder terminals 376 and 378 and insulative plug 382.

Figure 21A:
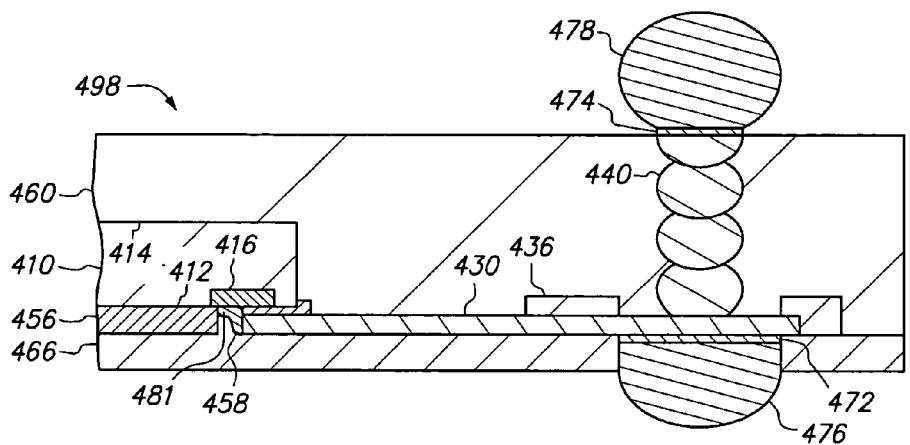
FIGS. 21A, 21B and 21C are cross-sectional, top and bottom views, respectively, of a semiconductor chip assembly in accordance with a fourth embodiment of the present invention.
Figure 21B:
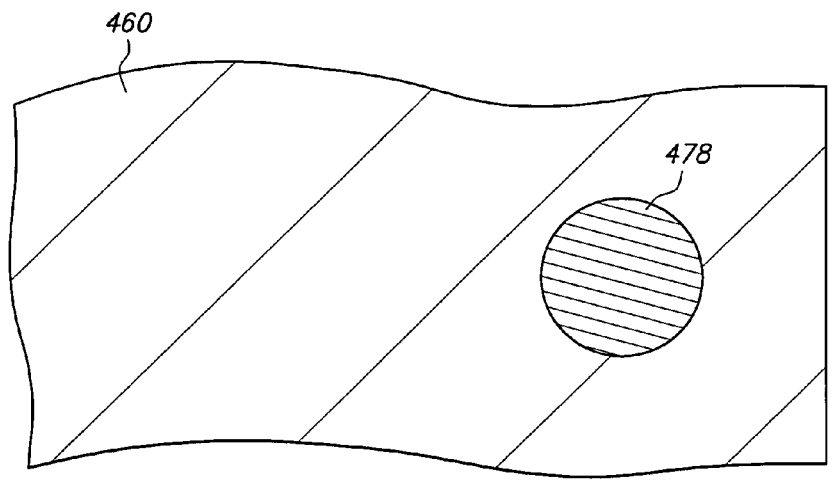
Figure 21C:
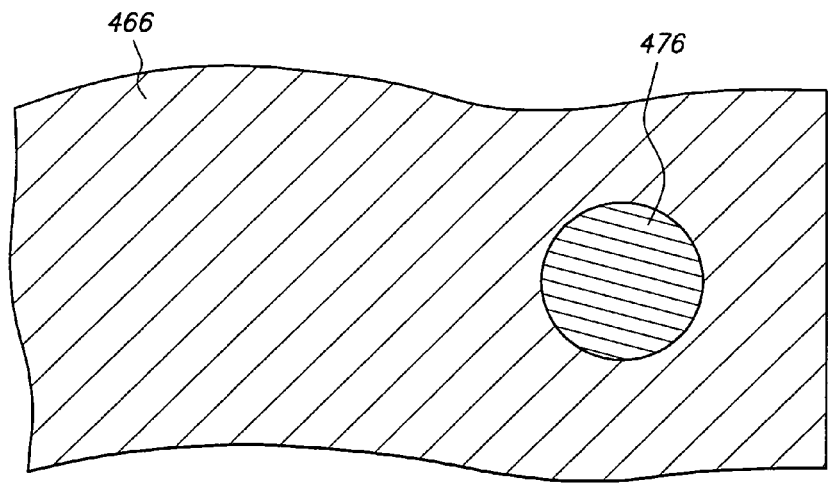

FIGS. 21A, 21B and 21C are cross-sectional, top and bottom views, respectively, of a semiconductor chip assembly in accordance with a fourth embodiment of the present invention. In the fourth embodiment, the connection joint is electrolessly plated. For purposes of brevity, any description in the first embodiment is incorporated herein insofar as the same is applicable, and the same description need not be repeated. Likewise, elements of the fourth embodiment similar to those in the first embodiment have corresponding reference numerals indexed at four-hundred rather than one-hundred. For instance, chip 410 corresponds to chip 110, routing line 430 corresponds to routing line 130, etc.

Pad 416 is treated to include a nickel surface layer in the same manner as pad 316, routing line 430 is configured in the same manner as routing line 330, and adhesive 456 is deposited on the metal base (corresponding to metal base 120) and routing line 430 in the same manner that adhesive 356 is deposited on the metal base and routing line 330.

Chip 410 is inverted and positioned such that surface 412 faces downwardly, surface 414 faces upwardly, adhesive 456 contacts and is sandwiched between pad 416 and routing line 430, and routing line 430 partially overlaps pad 416. Furthermore, metal pillar 440 extends vertically across all of the thickness of chip 410. Thereafter, encapsulant 460 is formed, and then the metal base is etched and removed, thereby exposing adhesive 456. Thereafter, through-hole 481 is formed in adhesive 456 and exposes pad 416. Through-hole 481 is formed in the same manner as through-hole 381.

Thereafter, connection joint 458 is formed by an electroless plating operation. The structure is submerged in an electroless nickel plating solution such as Enthone Enplate NI-424 at 85° C. Pad 416 includes an exposed nickel surface layer and therefore is catalytic to electroless nickel. Connection joint 458 plates on pad 416 and eventually contacts and electrically connects pad 416 and routing line 430 in through-hole 481. The electroless nickel plating operation continues until connection joint 458 is about 10 microns thick. Thereafter, the structure is removed from the electroless nickel plating solution and rinsed in distilled water.

Thereafter, insulative base 466 is formed, then metal pillar 440 and encapsulant 460 are grinded, and then plated terminals 472 and 474 and solder terminals 476 and 478 are formed.

Semiconductor chip assembly 498 includes chip 410, routing line 430, solder mask 436, metal pillar 440, adhesive 456, connection joint 458, encapsulant 460, insulative base 466, plated terminals 472 and 474 and solder terminals 476 and 478.

Figure 22A:
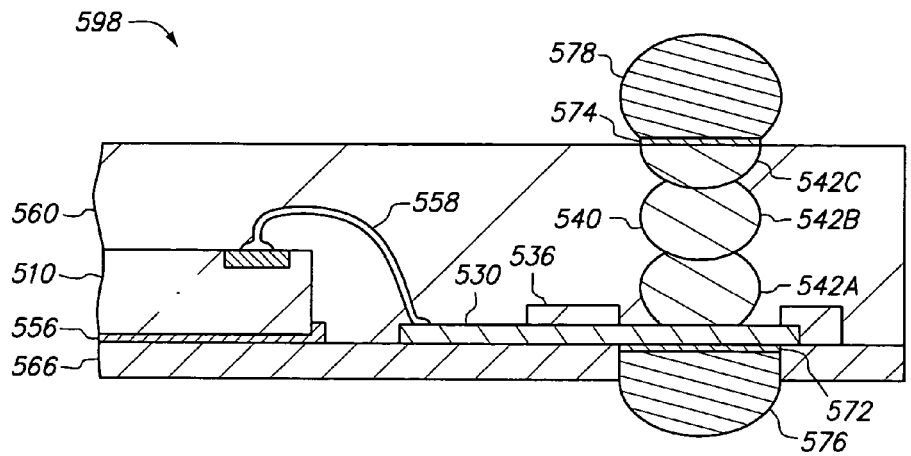
FIGS. 22A, 22B and 22C are cross-sectional, top and bottom views, respectively, of a semiconductor chip assembly in accordance with a fifth embodiment of the present invention.
Figure 22B:
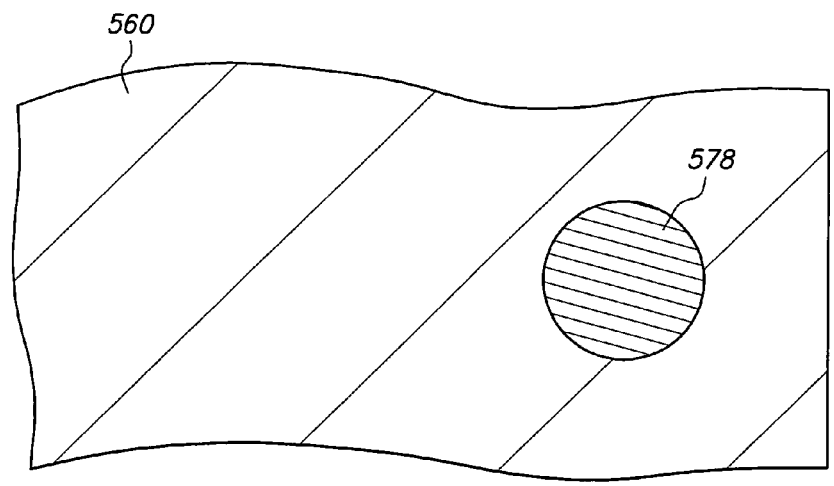
Figure 22C:
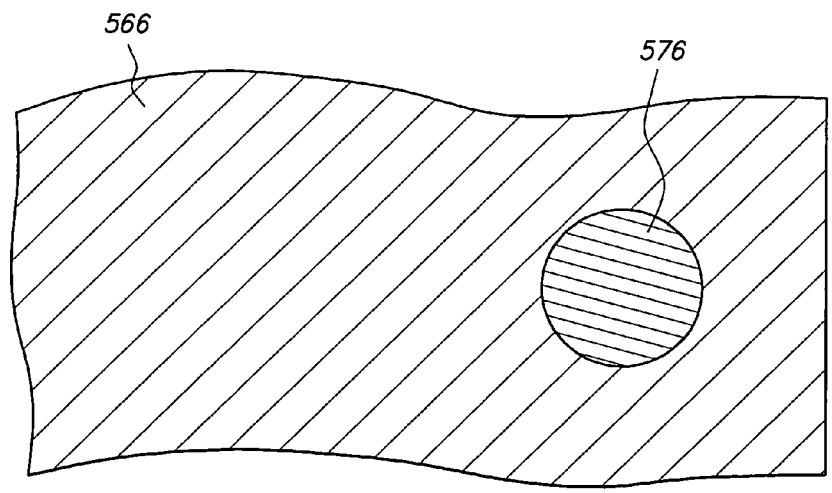

FIGS. 22A, 22B and 22C are cross-sectional, top and bottom views, respectively, of a semiconductor chip assembly in accordance with a fifth embodiment of the present invention. In the fifth embodiment, the metal pillar consists of three metal balls. For purposes of brevity, any description in the first embodiment is incorporated herein insofar as the same is applicable, and the same description need not be repeated. Likewise, elements of the fifth embodiment similar to those in the first embodiment have corresponding reference numerals indexed at five-hundred rather than one-hundred. For instance, chip 510 corresponds to chip 110, routing line 530 corresponds to routing line 130, etc.

Metal pillar 540 is formed from a gold wire with a diameter of 75 microns (rather than 50 microns) and wire balls which each have a diameter of 175 microns (rather than 125 microns) and consists of metal balls 542A, 542B and 542C which each have a diameter of 200 microns (rather than 150 microns). Thus, the fourth metal ball (corresponding to metal ball 142D) is omitted.

Semiconductor chip assembly 598 includes chip 510, routing line 530, solder mask 536, metal pillar 540, adhesive 556, connection joint 558, encapsulant 560, insulative base 566, plated terminals 572 and 574 and solder terminals 576 and 578.

Figure 23A:
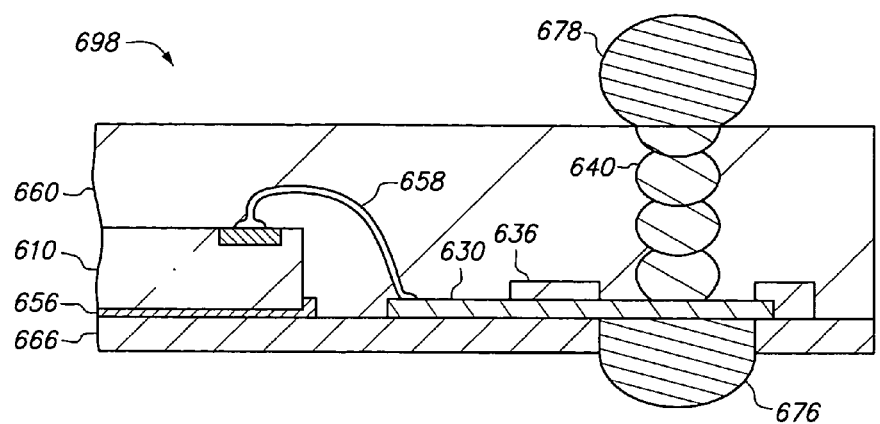
FIGS. 23A, 23B and 23C are cross-sectional, top and bottom views, respectively, of a semiconductor chip assembly in accordance with a sixth embodiment of the present invention.
Figure 23B:
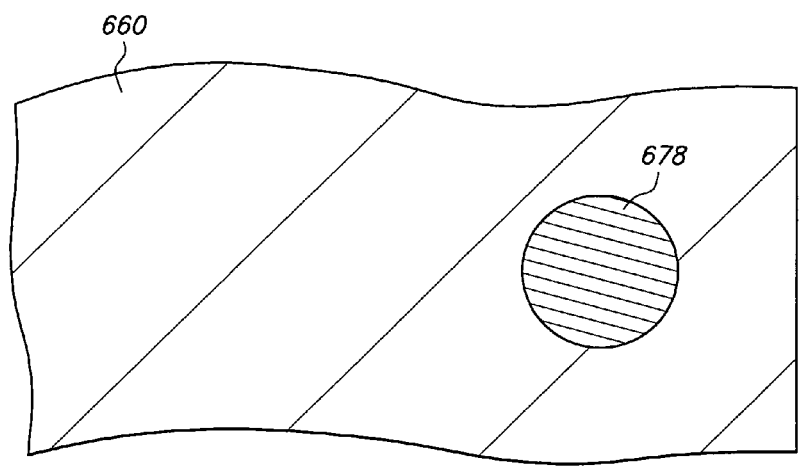
Figure 23C:
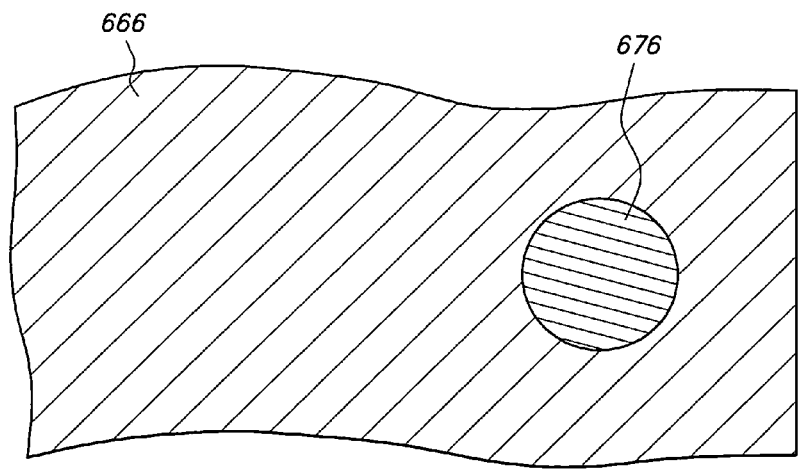

FIGS. 23A, 23B and 23C are cross-sectional, top and bottom views, respectively, of a semiconductor chip assembly in accordance with a sixth embodiment of the present invention. In the sixth embodiment, the metal pillar is copper. For purposes of brevity, any description in the first embodiment is incorporated herein insofar as the same is applicable, and the same description need not be repeated. Likewise, elements of the sixth embodiment similar to those in the first embodiment have corresponding reference numerals indexed at six-hundred rather than one-hundred. For instance, chip 610 corresponds to chip 110, routing line 630 corresponds to routing line 130, etc.

Metal pillar 640 is formed from a copper wire and thus is copper. Furthermore, the plated terminals (corresponding to plated terminals 172 and 174) are omitted, and solder terminals 676 and 678 are formed by depositing solder paste on routing line 630 and metal pillar 640, respectively, and then reflowing the solder paste. Thus, solder terminals 676 and 678 contact and are electrically connected to routing line 630 and metal pillar 640, respectively.

Semiconductor chip assembly 698 includes chip 610, routing line 630, solder mask 636, metal pillar 640, adhesive 656, connection joint 658, encapsulant 660, insulative base 666 and solder terminals 676 and 678.

Figure 24A:
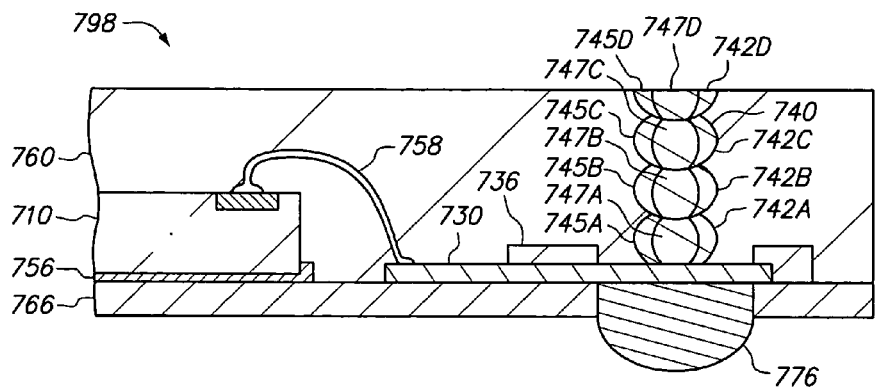
FIGS. 24A, 24B and 24C are cross-sectional, top and bottom views, respectively, of a semiconductor chip assembly in accordance with a seventh embodiment of the present invention.
Figure 24B:
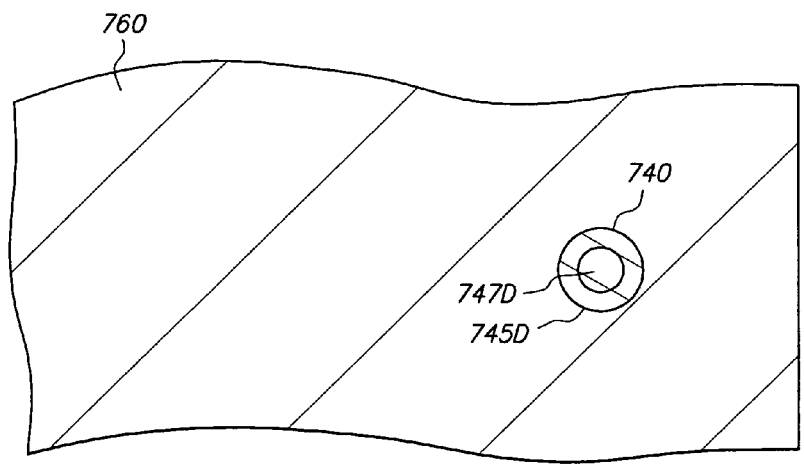
Figure 24C:
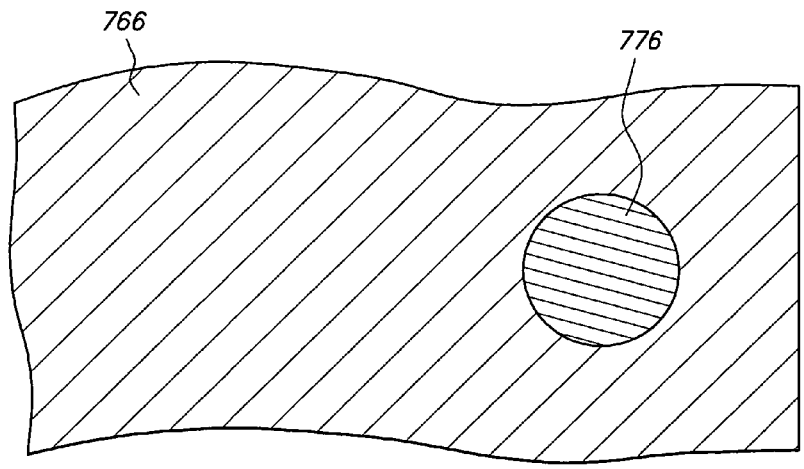

FIGS. 24A, 24B and 24C are cross-sectional, top and bottom views, respectively, of a semiconductor chip assembly in accordance with a seventh embodiment of the present invention. In the seventh embodiment, the metal pillar is solder-coated copper. For purposes of brevity, any description in the first embodiment is incorporated herein insofar as the same is applicable, and the same description need not be repeated. Likewise, elements of the seventh embodiment similar to those in the first embodiment have corresponding reference numerals indexed at seven-hundred rather than one-hundred. For instance, chip 710 corresponds to chip 110, routing line 730 corresponds to routing line 130, etc.

Metal pillar 740 is formed from a solder-coated copper wire and thus is solder-coated copper. Metal balls 742A, 742B, 742C and 742D include solder coating 745A, 745B, 745C and 745D, respectively, and coated copper 747A, 747B, 747C and 747D, respectively. Encapsulant 760 contacts solder coatings 745A, 745B, 745C and 745D and is spaced from coated copper 747A, 747B, 747C and 747D. Furthermore, the plated terminals (corresponding to plated terminals 172 and 174) are omitted, the solder terminal (corresponding to solder terminal 178) is omitted, and solder terminal 776 is formed in the same manner as solder terminal 676. Thus, metal pillar 740 provides a solder terminal that is exposed in the upward direction.

Semiconductor chip assembly 798 includes chip 710, routing line 730, solder mask 736, metal pillar 740, adhesive 756, connection joint 758, encapsulant 760, insulative base 766 and solder terminal 776.

Figure 25A:
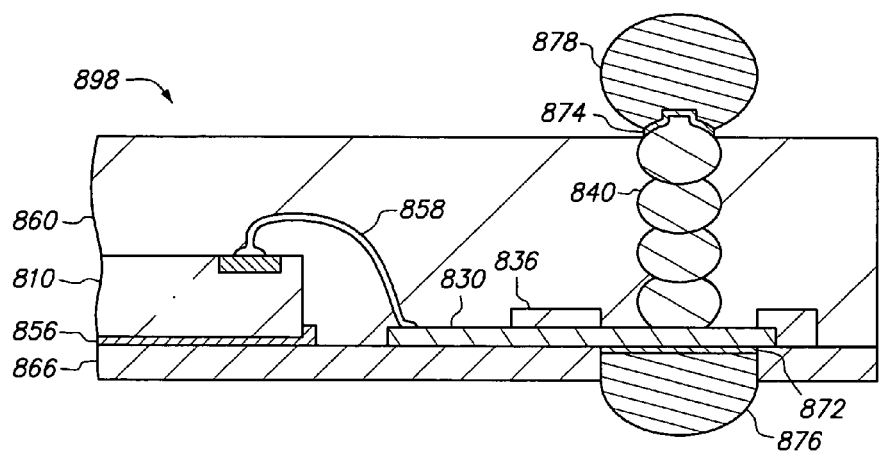
FIGS. 25A, 25B and 25C are cross-sectional, top and bottom views, respectively, of a semiconductor chip assembly in accordance with an eighth embodiment of the present invention.
Figure 25B:
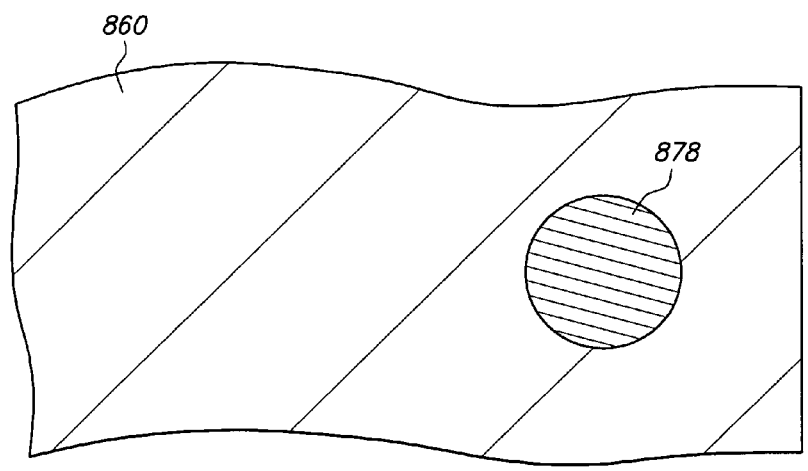
Figure 25C:
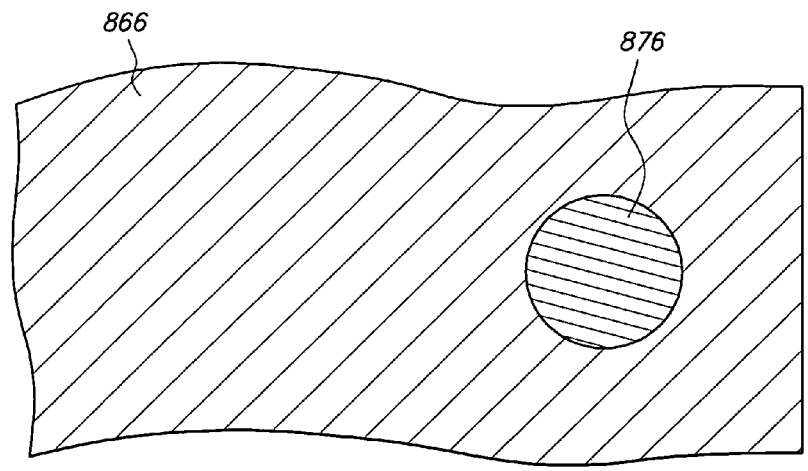

FIGS. 25A, 25B and 25C are cross-sectional, top and bottom views, respectively, of a semiconductor chip assembly in accordance with an eighth embodiment of the present invention. In the eighth embodiment, the encapsulant is formed to not cover the metal pillar. For purposes of brevity, any description in the first embodiment is incorporated herein insofar as the same is applicable, and the same description need not be repeated. Likewise, elements of the eighth embodiment similar to those in the first embodiment have corresponding reference numerals indexed at eight-hundred rather than one-hundred. For instance, chip 810 corresponds to chip 110, routing line 830 corresponds to routing line 130, etc.

Encapsulant 860 is deposited on chip 810, routing line 830, solder mask 836, metal pillar 840, adhesive 856 and connection joint 858 by transfer molding. However, encapsulant 860 does not cover metal pillar 840. Instead, metal pillar 840 is exposed. This is accomplished by providing the upper mold section with a recess and inserting an upper portion of metal pillar 840 into the recess while a lower portion of metal pillar 840 is outside the recess such that a small gap (less than 20 microns) arises between the upper mold portion and the upper portion of metal pillar 840 in the recess. The gap is large enough to prevent the upper mold section from striking metal pillar 840 despite minor registration and alignment inaccuracies, and metal pillar 840 remains spaced and separated from the upper mold section. However, the recess is generally shaped like and only slightly larger than the upper portion of metal pillar 840, and the upper mold section contours to and shrouds the upper portion of metal pillar 840. The molding compound does not flow through the small gap during transfer molding. As a result, encapsulant 860 does not contact or cover the upper portion of metal pillar 840. Furthermore, metal pillar 840 extends upwardly beyond encapsulant 860.

The upper portion of encapsulant 860 is not removed since metal pillar 840 is never covered by encapsulant 860. In addition, metal pillar 840 is not grinded. As a result, metal pillar 840 consists of a stud bump and three ball bonds.

Semiconductor chip assembly 898 includes chip 810, routing line 830, solder mask 836, metal pillar 840, adhesive 856, connection joint 858, encapsulant 860, insulative base 866, plated terminals 872 and 874 and solder terminals 876 and 878.

Figure 26A:
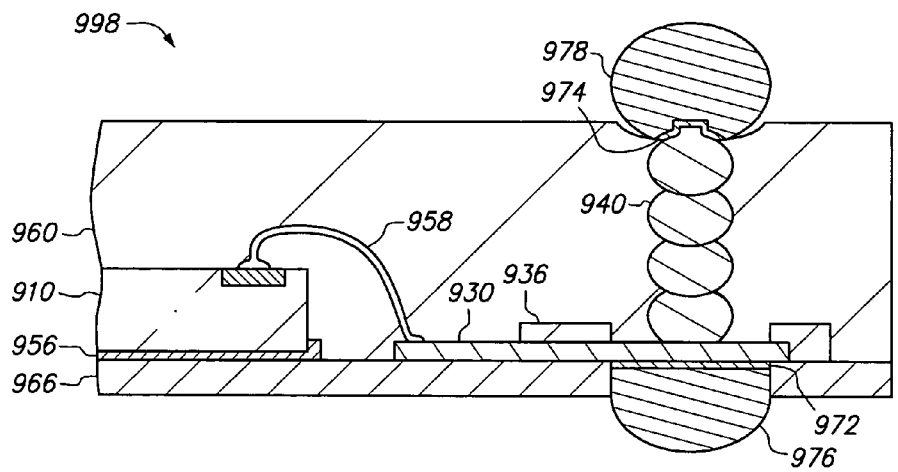
FIGS. 26A, 26B and 26C are cross-sectional, top and bottom views, respectively, of a semiconductor chip assembly in accordance with a ninth embodiment of the present invention.
Figure 26B:
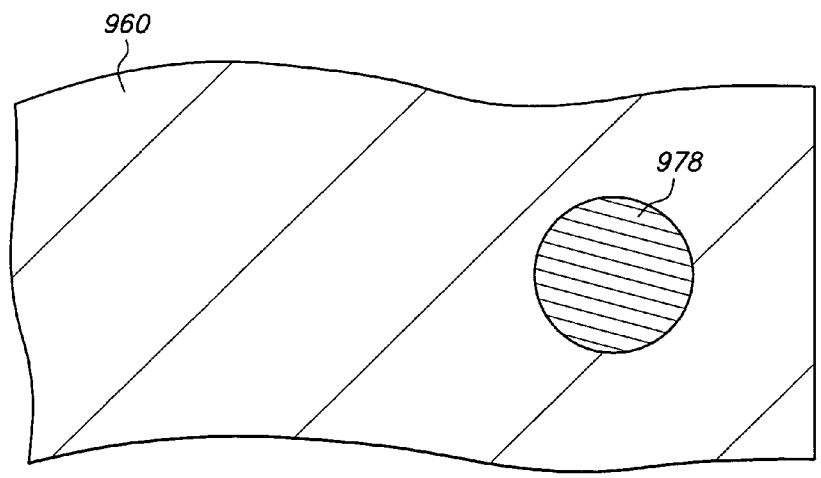
Figure 26C:
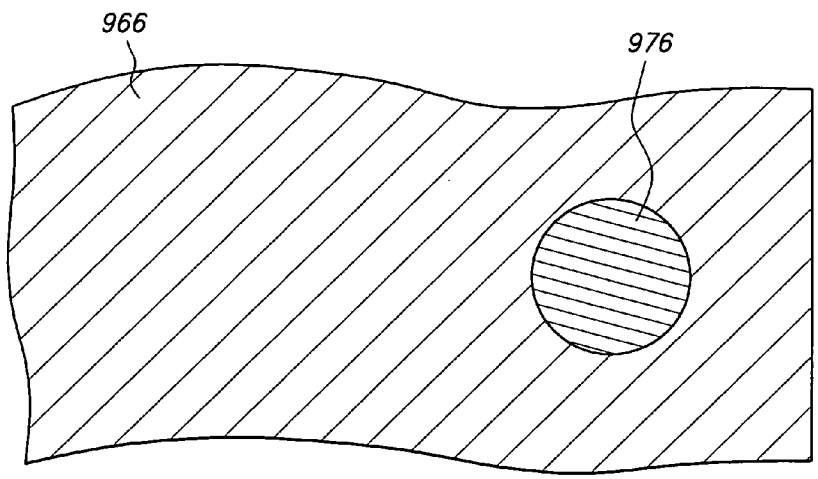

FIGS. 26A, 26B and 26C are cross-sectional, top and bottom views, respectively, of a semiconductor chip assembly in accordance with a ninth embodiment of the present invention. In the ninth embodiment, the encapsulant is formed to not cover the metal pillar. For purposes of brevity, any description in the first embodiment is incorporated herein insofar as the same is applicable, and the same description need not be repeated. Likewise, elements of the ninth embodiment similar to those in the first embodiment have corresponding reference numerals indexed at nine-hundred rather than one-hundred. For instance, chip 910 corresponds to chip 110, routing line 930 corresponds to routing line 130, etc.

Encapsulant 960 is deposited on chip 910, routing line 930, solder mask 936, metal pillar 940, adhesive 956 and connection joint 958 by transfer molding. However, encapsulant 960 does not cover metal pillar 940. Instead, metal pillar 940 is exposed. This is accomplished by positioning metal pillar 940 in close proximity to the upper mold section such that a small gap (less than 20 microns) arises between the upper mold section and metal pillar 940. The gap is large enough to prevent the upper mold section from striking metal pillar 940 despite minor registration and alignment inaccuracies, and metal pillar 940 remains spaced and separated from the upper mold section. The molding compound does not flow through the small gap during transfer molding. As a result, encapsulant 960 does not contact or cover an upper portion of metal pillar 940. Furthermore, encapsulant 960 extends upwardly beyond metal pillar 940.

The upper portion of encapsulant 960 is not removed since metal pillar 940 is never covered by encapsulant 960. In addition, metal pillar 940 is not grinded. As a result, metal pillar 940 consists of a stud bump and three ball bonds. Moreover, encapsulant 960 extends upwardly beyond plated terminal 974, and solder terminal 978 extends upwardly beyond metal pillar 940 and encapsulant 960.

Semiconductor chip assembly 998 includes chip 910, routing line 930, solder mask 936, metal pillar 940, adhesive 956, connection joint 958, encapsulant 960, insulative base 966, plated terminals 972 and 974 and solder terminals 976 and 978.

Figure 27A:
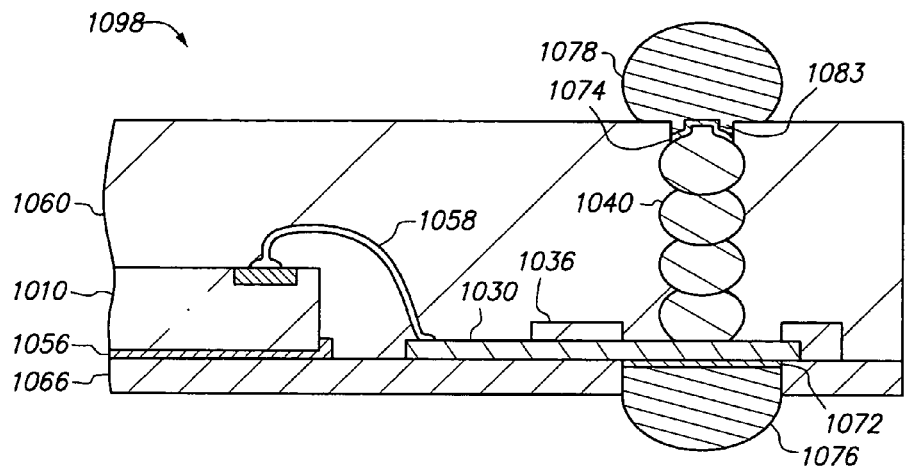
FIGS. 27A, 27B and 27C are cross-sectional, top and bottom views, respectively, of a semiconductor chip assembly in accordance with a tenth embodiment of the present invention.
Figure 27B:
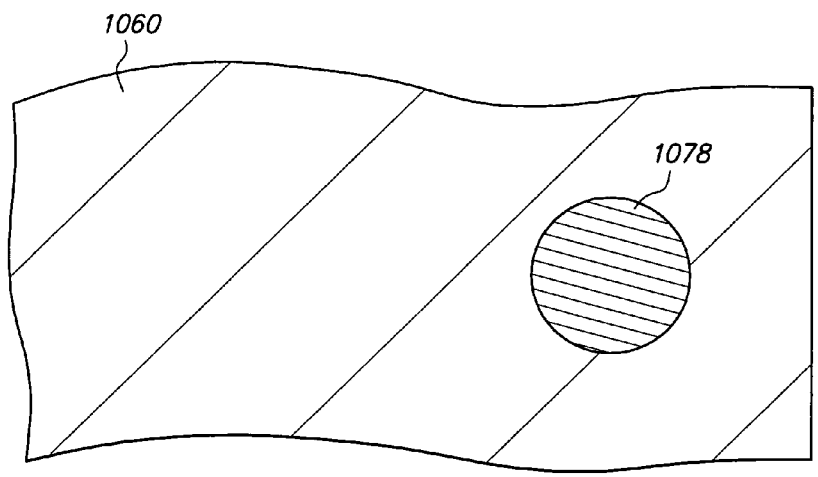
Figure 27C:
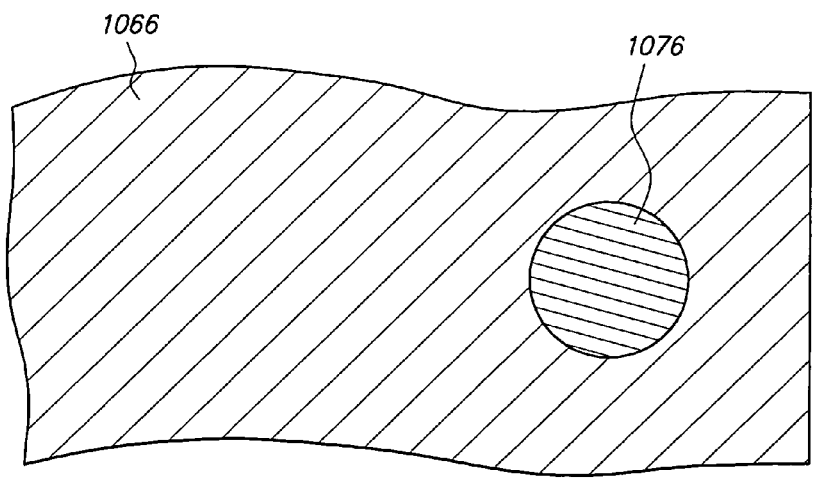

FIGS. 27A, 27B and 27C are cross-sectional, top and bottom views, respectively, of a semiconductor chip assembly in accordance with a tenth embodiment of the present invention. In the tenth embodiment, the encapsulant is selectively etched to expose the metal pillar. For purposes of brevity, any description in the first embodiment is incorporated herein insofar as the same is applicable, and the same description need not be repeated. Likewise, elements of the tenth embodiment similar to those in the first embodiment have corresponding reference numerals indexed at one-thousand rather than one-hundred. For instance, chip 1010 corresponds to chip 110, routing line 1030 corresponds to routing line 130, etc.

Encapsulant 1060 is initially an epoxy in paste form that includes an epoxy resin, a curing agent and an accelerator. The epoxy paste is deposited over the structure using stencil printing, then the epoxy paste is cured or hardened at a relatively low temperature in the range of 100 to 250° C. to form a solid adherent insulator. Encapsulant 1060 extends vertically beyond metal pillar 1040 by 20 microns. Furthermore, encapsulant 1060 is more susceptible to laser ablation than encapsulant 160 since encapsulant 1060 is composed of epoxy without a filler whereas encapsulant 160 is composed of molding compound with a filler.

Thereafter, instead of removing the upper portion of encapsulant 1060 by grinding, a portion of encapsulant 1060 is selectively removed to form opening 1083 that exposes metal pillar 1040.

Opening 1083 is formed by applying a suitable etch that is highly selective of encapsulant 1060 with respect to metal pillar 1040. In this instance, a selective TEA $CO_2$ laser etch is applied using multiple laser direct writes. The laser is directed at metal pillar 1040. The laser has a spot size of 70 microns. Furthermore, the laser direct writes are offset relative to one another yet overlap so that the laser scans a central portion of metal pillar 1040 with a diameter of 100 microns. In this manner, the laser direct writes in combination are vertically aligned with and centered relative to metal pillar 1040. As a result, the laser strikes metal pillar 1040, a portion of encapsulant 1060 that covers metal pillar 1040, and ablates encapsulant 1060.

The laser drills through and removes a portion of encapsulant 1060. However, a portion of encapsulant 1060 that extends across the periphery of metal pillar 1040 is outside the scope of the laser and remains intact. Thus, encapsulant 1060 continues to contact but no longer covers metal pillar 1040.

Thereafter, a brief cleaning step can be applied to remove oxides and debris that may be present on the exposed portion of metal pillar 1040. For instance, a brief oxygen plasma cleaning step can be applied to the structure. Alternatively, a brief wet chemical cleaning step using a solution containing potassium permanganate can be applied to the structure. In either case, the cleaning step cleans the exposed portion of metal pillar 1040 without damaging the structure.

Opening 1083 is formed in and extends vertically into but not through encapsulant 1060, is disposed outside the periphery of chip 1010, is vertically aligned with and exposes metal pillar 1040, is spaced from routing line 1030, solder mask 1036, adhesive 1056 and connection joint 1058 and has a diameter of 100 microns. Opening 1083 is formed without damaging or extending into metal pillar 1040. In addition, metal pillar 1040 is not grinded. As a result, metal pillar 1040 consists of a stud bump and three ball bonds.

Opening 1083 may have a diameter that is slightly larger than 100 microns due to the beam angle of the laser, the thermal effects of the laser, and/or the isotropic nature of an oxygen plasma or wet chemical cleaning step. For convenience of explanation, this slight enlargement is ignored.

Thereafter, plated terminals 1072 and 1074 are formed, and solder terminals 1076 and 1078 are formed. Plated terminal 1074 is disposed within opening 1083, and solder terminal 1078 extends within and outside opening 1083 and extends upwardly beyond metal pillar 1040 and encapsulant 1060.

Semiconductor chip assembly 1098 includes chip 1010, routing line 1030, solder mask 1036, metal pillar 1040, adhesive 1056, connection joint 1058, encapsulant 1060, insulative base 1066, plated terminals 1072 and 1074 and solder terminals 1076 and 1078.

Figure 28A:
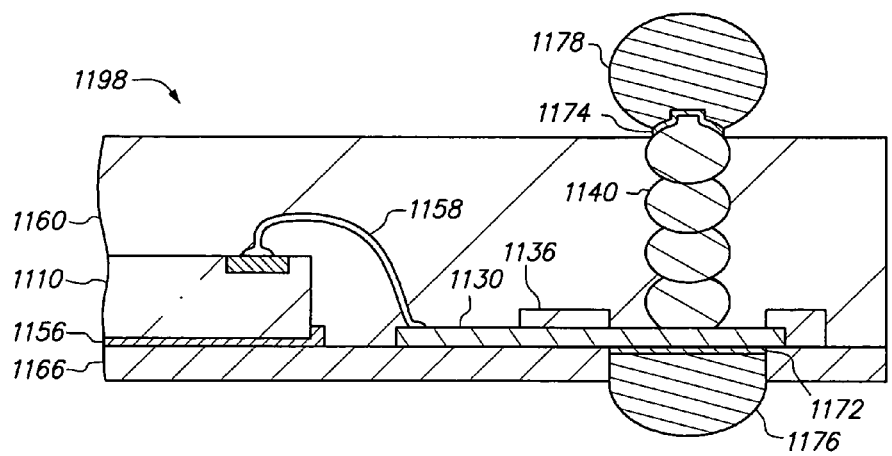
FIGS. 28A, 28B and 28C are cross-sectional, top and bottom views, respectively, of a semiconductor chip assembly in accordance with an eleventh embodiment of the present invention.
Figure 28B:
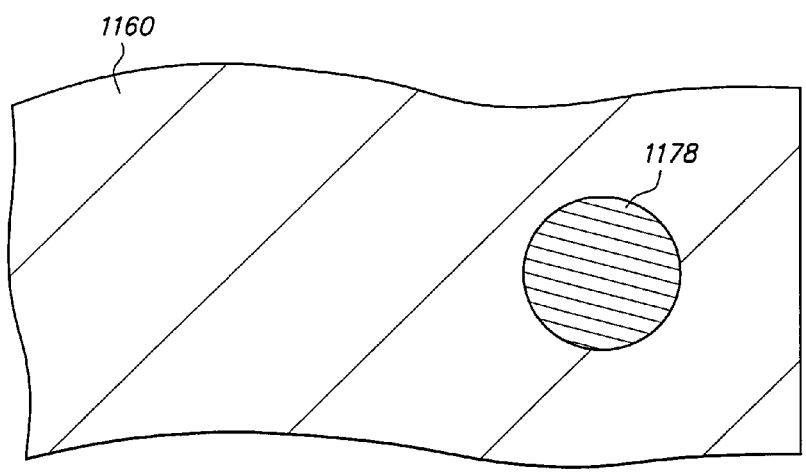
Figure 28C:
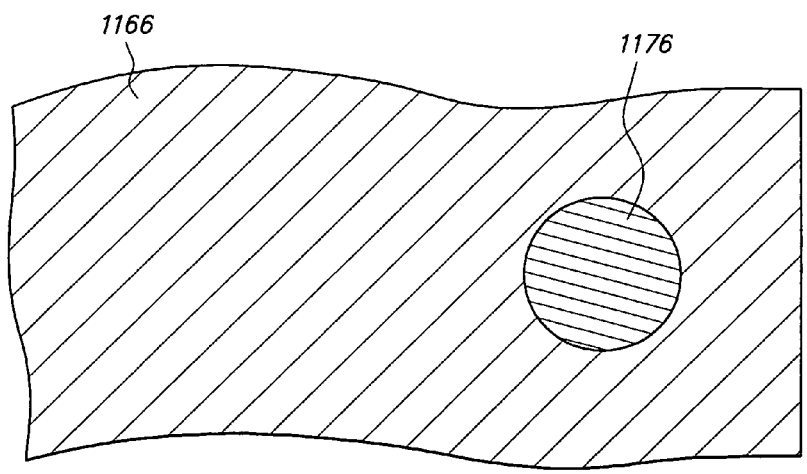

FIGS. 28A, 28B and 28C are cross-sectional, top and bottom views, respectively, of a semiconductor chip assembly in accordance with an eleventh embodiment of the present invention. In the eleventh embodiment, the encapsulant is blanketly etched to expose the metal pillar. For purposes of brevity, any description in the first embodiment is incorporated herein insofar as the same is applicable, and the same description need not be repeated. Likewise, elements of the eleventh embodiment similar to those in the first embodiment have corresponding reference numerals indexed at eleven-hundred rather than one-hundred. For instance, chip 1110 corresponds to chip 110, routing line 1130 corresponds to routing line 130, etc.

Encapsulant 1160 is formed in the same manner as encapsulant 1060. Furthermore, encapsulant 1160 is more susceptible to plasma etching than encapsulant 160 since encapsulant 1160 is composed of epoxy without a filler whereas encapsulant 160 is composed of molding compound with a filler.

Thereafter, instead of removing the upper portion of encapsulant 1160 by grinding, the upper portion of encapsulant 1160 is removed by plasma etching. The plasma etch continues until metal pillar 1140 is exposed, and then halts before it reaches chip 1110, routing line 1130 or connection joint 1158. Metal pillar 1140 extends upwardly beyond encapsulant 1160 by 50 microns. In addition, metal pillar 1140 is not grinded. As a result, metal pillar 1140 consists of a stud bump and three ball bonds.

Semiconductor chip assembly 1198 includes chip 1110, routing line 1130, solder mask 1136, metal pillar 1140, adhesive 1156, connection joint 1158, encapsulant 1160, insulative base 1166, plated terminals 1172 and 1174 and solder terminals 1176 and 1178.

Figure 29A:
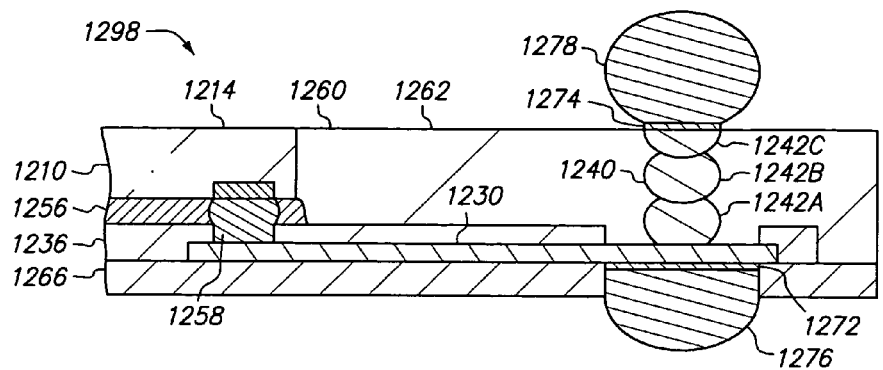
FIGS. 29A, 29B and 29C are cross-sectional, top and bottom views, respectively, of a semiconductor chip assembly in accordance with a twelfth embodiment of the present invention.
Figure 29B:
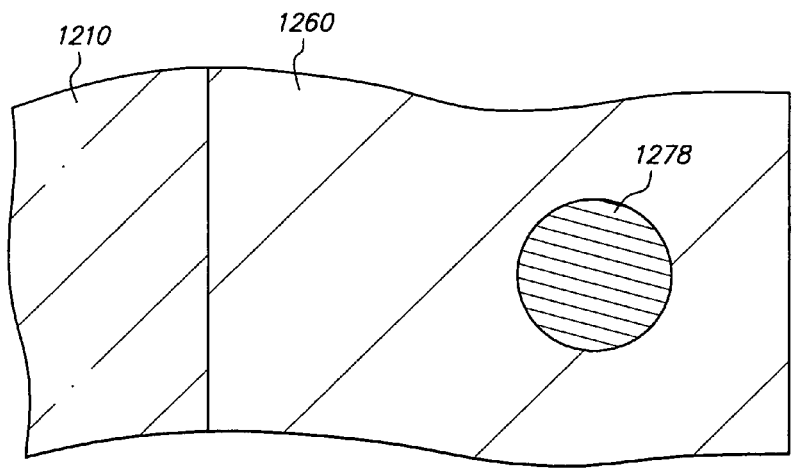
Figure 29C:
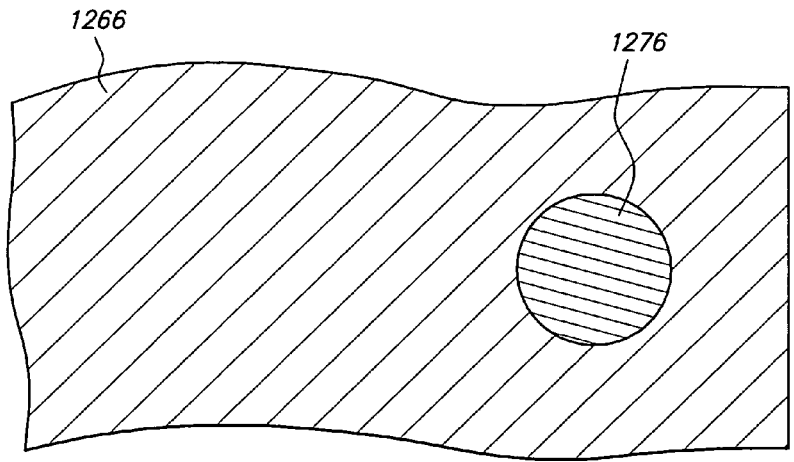

FIGS. 29A, 29B and 29C are cross-sectional, top and bottom views, respectively, of a semiconductor chip assembly in accordance with a twelfth embodiment of the present invention. In the twelfth embodiment, the chip is exposed. For purposes of brevity, any description in the first embodiment is incorporated herein insofar as the same is applicable, and the same description need not be repeated. Likewise, elements of the twelfth embodiment similar to those in the first embodiment have corresponding reference numerals indexed at twelve-hundred rather than one-hundred. For instance, chip 1210 corresponds to chip 110, routing line 1230 corresponds to routing line 130, etc.

The assembly is manufactured in the same manner as assembly 298 in the second embodiment, except that the grinding is applied longer than in the second embodiment and removes portions of chip 1210, metal pillar 1240 and encapsulant 1260. Initially, the diamond sand wheel grinds only encapsulant 1260. As the grinding continues, encapsulant 1260 becomes thinner as its grinded surface migrates downwardly. Eventually the diamond sand wheel contacts metal pillar 1240, and as a result, begins to grind metal pillar 1240 as well. As the grinding continues, metal pillar 1240 and encapsulant 1260 become thinner as their grinded surfaces migrate downwardly. However, the grinding does not halt before it reaches chip 1210. Instead, the grinding continues and eventually the diamond sand wheel contacts chip 1210, and as a result, begins to grind chip 1210 as well. As the grinding continues, chip 1210, metal pillar 1240 and encapsulant 1260 become thinner as their grinded surfaces migrate downwardly. The grinding continues until chip 1210, metal pillar 1240 and encapsulant 1260 have the desired thickness, and then halts before it reaches active circuitry in chip 1210, routing line 1230, solder mask 1236 or adhesive 1256. Thereafter, the structure is rinsed in distilled water to remove contaminants.

The grinding removes a 50 micron thick upper portion of chip 1210 (at the back-side of the inverted chip 1210), a 250 micron thick upper portion of metal pillar 1240 and a 400 micron thick upper portion of encapsulant 1260. The grinding also removes the fourth metal ball (corresponding to metal ball 142D) and an upper portion of metal ball 1242C but does not reach metal balls 1242A and 1242B.

Chip 1210 and metal pillar 1240 remain embedded in encapsulant 1260. Surface 1214 of chip 1210, the upper surface of metal pillar 1240 and surface 1262 of encapsulant 1260 are laterally aligned with one another and exposed. Thus, an exposed planarized horizontal surface that faces upwardly includes surfaces 1214 and 1262 and metal pillar 1240. Furthermore, chip 1210 and metal pillar 1240 extend through surface 1262 of encapsulant 1260, and encapsulant 1260 no longer contacts or covers surface 1214 of chip 1210. Thus, surface 1214 of chip 1210 is not covered in the upward direction by another material of the assembly.

Semiconductor chip assembly 1298 includes chip 1210, routing line 1230, solder mask 1236, metal pillar 1240, adhesive 1256, connection joint 1258, encapsulant 1260, insulative base 1266, plated terminals 1272 and 1274 and solder terminals 1276 and 1278.

Figure 30A:
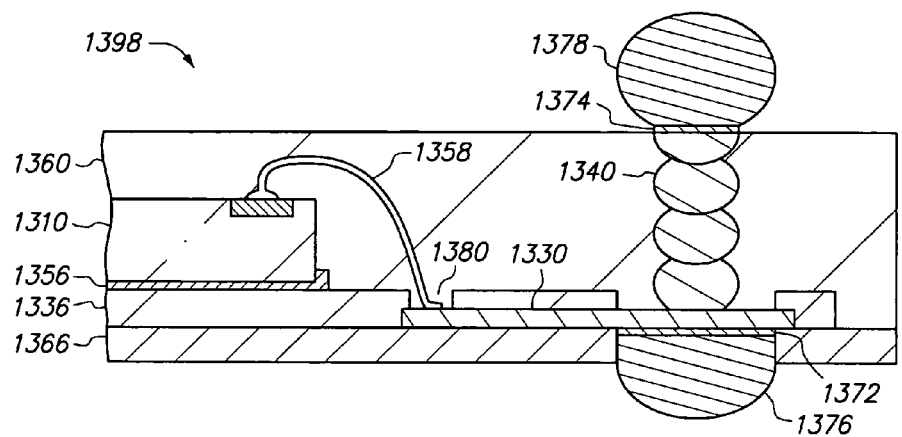
FIGS. 30A, 30B and 30C are cross-sectional, top and bottom views, respectively, of a semiconductor chip assembly in accordance with a thirteenth embodiment of the present invention.
Figure 30B:
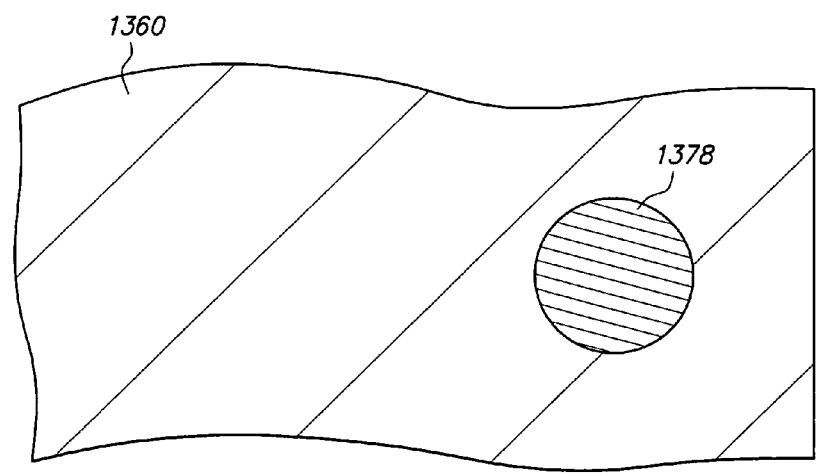
Figure 30C:
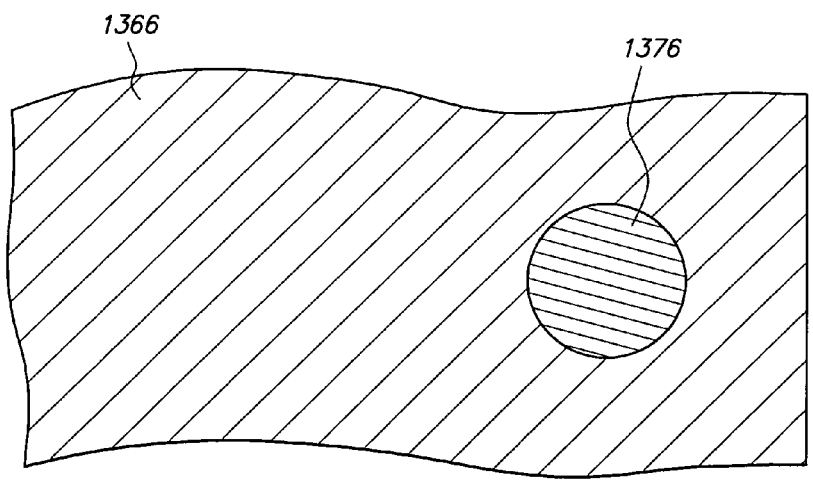

FIGS. 30A, 30B and 30C are cross-sectional, top and bottom views, respectively, of a semiconductor chip assembly in accordance with a thirteenth embodiment of the present invention. In the thirteenth embodiment, the solder mask extends beneath the chip. For purposes of brevity, any description in the first embodiment is incorporated herein insofar as the same is applicable, and the same description need not be repeated. Likewise, elements of the thirteenth embodiment similar to those in the first embodiment have corresponding reference numerals indexed at thirteen-hundred rather than one-hundred. For instance, chip 1310 corresponds to chip 110, routing line 1330 corresponds to routing line 130, etc.

Solder mask 1336 extends laterally beyond routing line 1330 in the direction away from metal pillar 1340, and includes opening 1380 that selectively exposes a portion of routing line 1330 near the distal end of routing line 1330 opposite metal pillar 1340. Adhesive 1356 contacts and is sandwiched between chip 1310 and solder mask 1336, and connection joint 1358 extends into opening 1380.

Semiconductor chip assembly 1398 includes chip 1310, routing line 1330, solder mask 1336, metal pillar 1340, adhesive 1356, connection joint 1358, encapsulant 1360, insulative base 1366, plated terminals 1372 and 1374 and solder terminals 1376 and 1378.

Figure 31A:
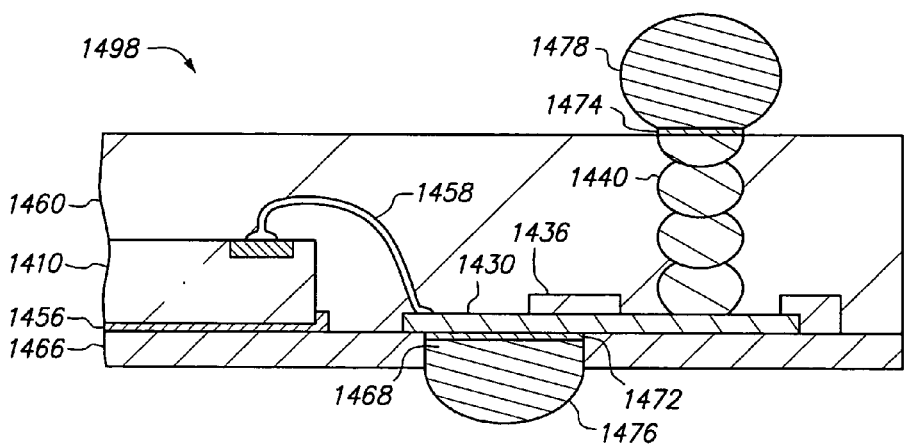
FIGS. 31A, 31B and 31C are cross-sectional, top and bottom views, respectively, of a semiconductor chip assembly in accordance with a fourteenth embodiment of the present invention.
Figure 31B:
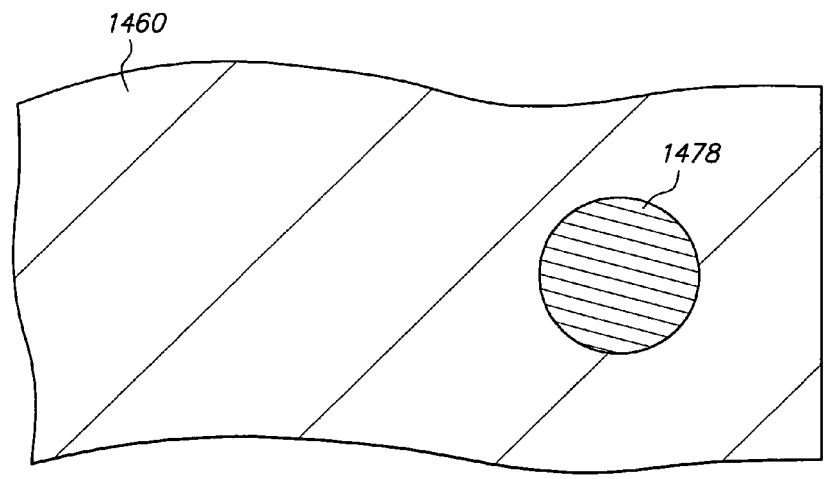
Figure 31C:
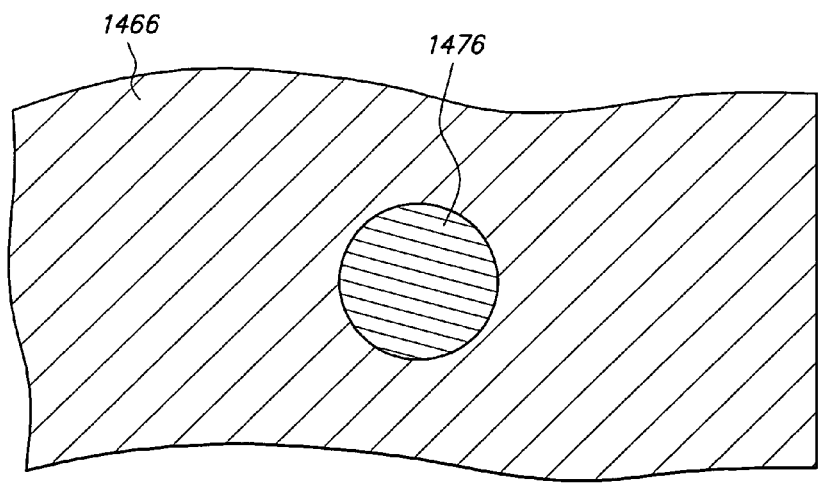

FIGS. 31A, 31B and 31C are cross-sectional, top and bottom views, respectively, of a semiconductor chip assembly in accordance with a fourteenth embodiment of the present invention. In the fourteenth embodiment, the solder terminals are laterally offset. For purposes of brevity, any description in the first embodiment is incorporated herein insofar as the same is applicable, and the same description need not be repeated. Likewise, elements of the fourteenth embodiment similar to those in the first embodiment have corresponding reference numerals indexed at fourteen-hundred rather than one-hundred. For instance, chip 1410 corresponds to chip 110, routing line 1430 corresponds to routing line 130, etc.

Routing line 1430 includes an additional enlarged circular portion (not shown) with a diameter of 400 microns at the side opposite the enlarged circular portion (corresponding to enlarged circular portion 134). This is accomplished by a slight adjustment to the electroplating operation previously described for routing line 130. In particular, the photoresist layer (corresponding to photoresist layer 126) is patterned to reshape the opening for routing line 1430, and therefore routing line 1430 includes the additional enlarged circular portion.

Opening 1468 is vertically aligned with the additional enlarged circular portion and is disposed laterally between chip 1410 and metal pillar 1440. As a result, plated terminal 1472 and solder terminal 1476 are vertically aligned with opening 1468 and laterally offset from metal pillar 1440, plated terminal 1474 and solder terminal 1478.

Semiconductor chip assembly 1498 includes chip 1410, routing line 1430, solder mask 1436, metal pillar 1440, adhesive 1456, connection joint 1458, encapsulant 1460, insulative base 1466, plated terminals 1472 and 1474 and solder terminals 1476 and 1478.

Figure 32A:
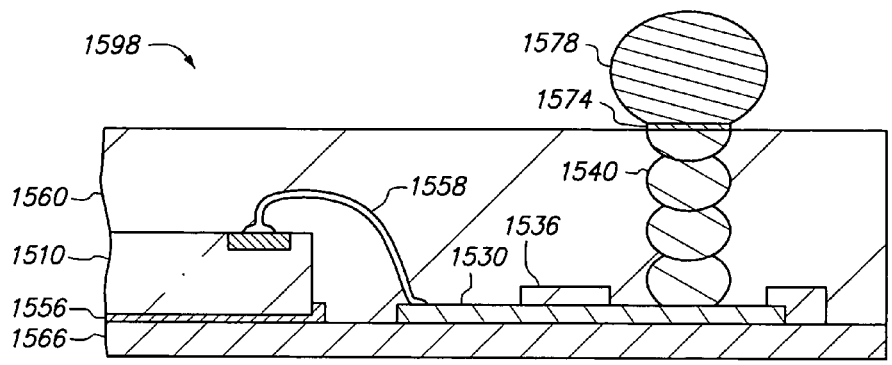
FIGS. 32A, 32B and 32C are cross-sectional, top and bottom views, respectively, of a semiconductor chip assembly in accordance with a fifteenth embodiment of the present invention.
Figure 32B:
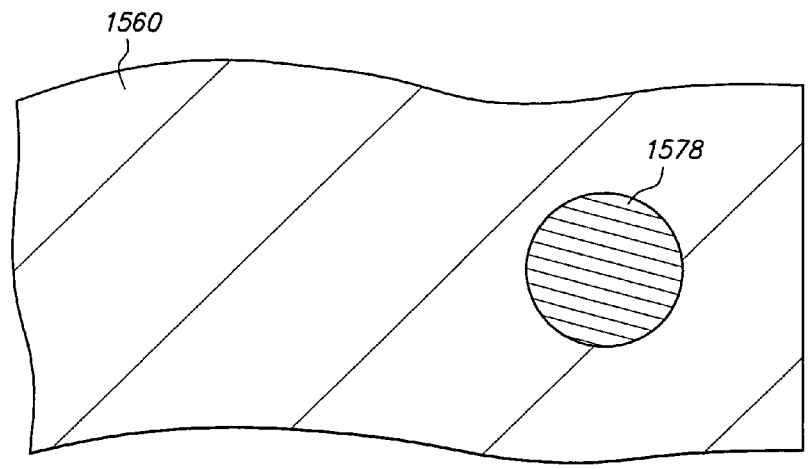
Figure 32C:
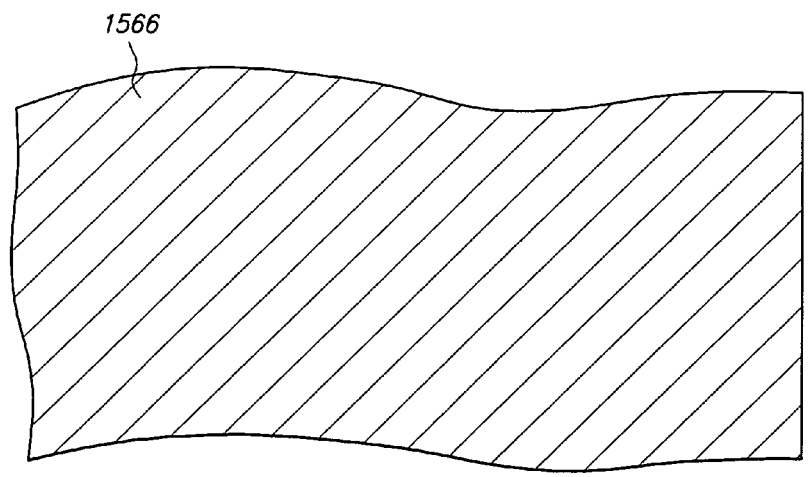

FIGS. 32A, 32B and 32C are cross-sectional, top and bottom views, respectively, of a semiconductor chip assembly in accordance with a fifteenth embodiment of the present invention. In the fifteenth embodiment, the lower solder terminal is omitted. For purposes of brevity, any description in the first embodiment is incorporated herein insofar as the same is applicable, and the same description need not be repeated. Likewise, elements of the fifteenth embodiment similar to those in the first embodiment have corresponding reference numerals indexed at fifteen-hundred rather than one-hundred. For instance, chip 1510 corresponds to chip 110, routing line 1530 corresponds to routing line 130, etc.

The opening (corresponding to opening 168) in insulative base 1566, the plated terminal (corresponding to plated terminal 172) and the solder terminal (corresponding to solder terminal 176) are omitted. Thus, metal pillar 1540 is covered in the downward direction by insulative base 1566.

Semiconductor chip assembly 1598 includes chip 1510, routing line 1530, solder mask 1536, metal pillar 1540, adhesive 1556, connection joint 1558, encapsulant 1560, insulative base 1566, plated terminal 1574 and solder terminal 1578.

Figure 33A:
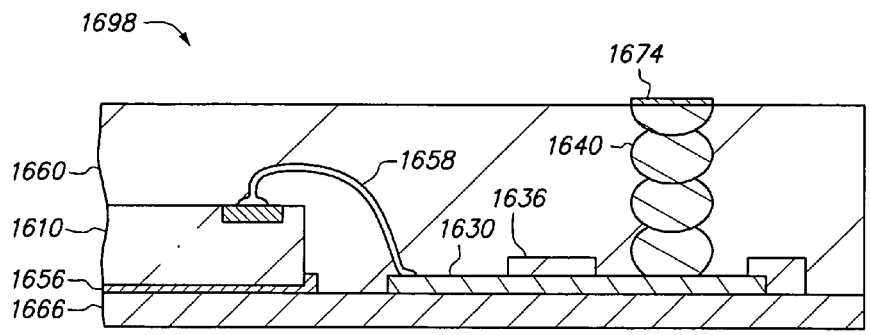
FIGS. 33A, 33B and 33C are cross-sectional, top and bottom views, respectively, of a semiconductor chip assembly in accordance with a sixteenth embodiment of the present invention.
Figure 33B:
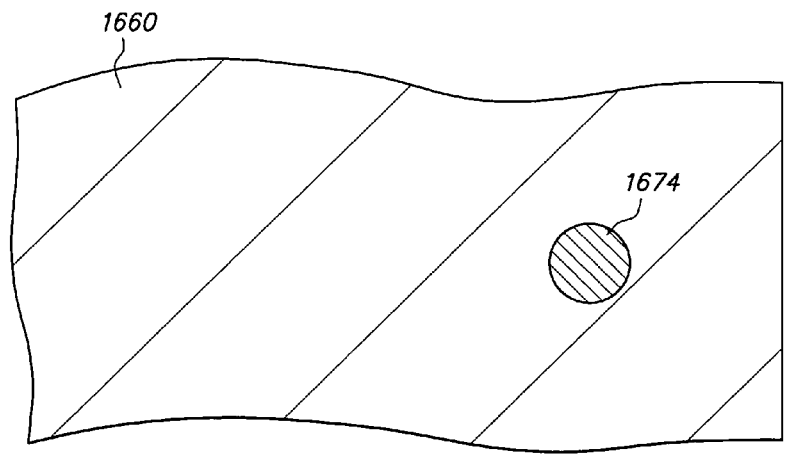
Figure 33C:
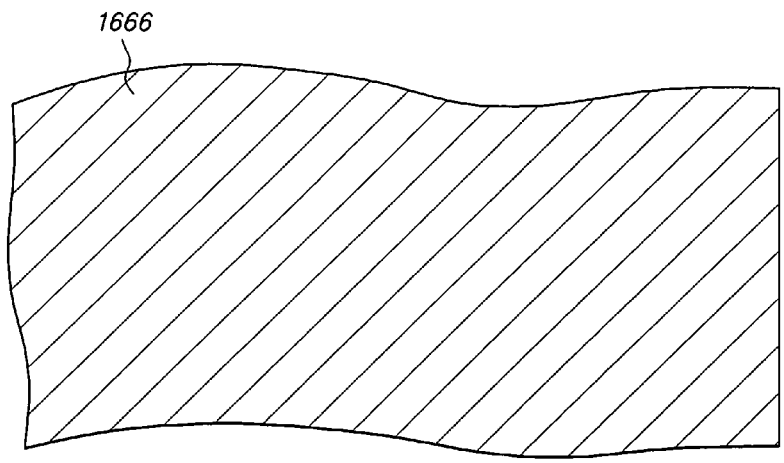

FIGS. 33A, 33B and 33C are cross-sectional, top and bottom views, respectively, of a semiconductor chip assembly in accordance with a sixteenth embodiment of the present invention. In the sixteenth embodiment, the solder terminals are omitted. For purposes of brevity, any description in the first embodiment is incorporated herein insofar as the same is applicable, and the same description need not be repeated. Likewise, elements of the sixteenth embodiment similar to those in the first embodiment have corresponding reference numerals indexed at sixteen-hundred rather than one-hundred. For instance, chip 1610 corresponds to chip 110, routing line 1630 corresponds to routing line 130, etc.

The opening (corresponding to opening 168) in insulative base 1666, the plated terminal (corresponding to plated terminal 172) and the solder terminals (corresponding to solder terminals 176 and 178) are omitted. Thus, metal pillar 1640 is covered in the upward direction by plated terminal 1674 and covered in the downward direction by insulative base 1666.

Semiconductor chip assembly 1698 includes chip 1610, routing line 1630, solder mask 1636, metal pillar 1640, adhesive 1656, connection joint 1658, encapsulant 1660, insulative base 1666 and plated terminal 1674.

Figure 34A:
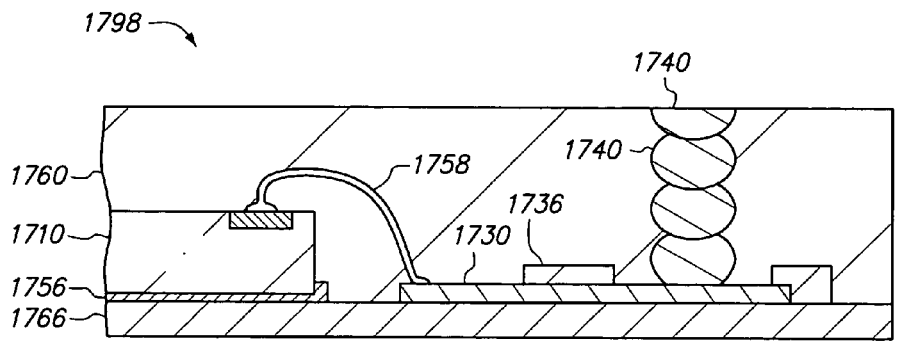
FIGS. 34A, 34B and 34C are cross-sectional, top and bottom views, respectively, of a semiconductor chip assembly in accordance with a seventeenth embodiment of the present invention.
Figure 34B:
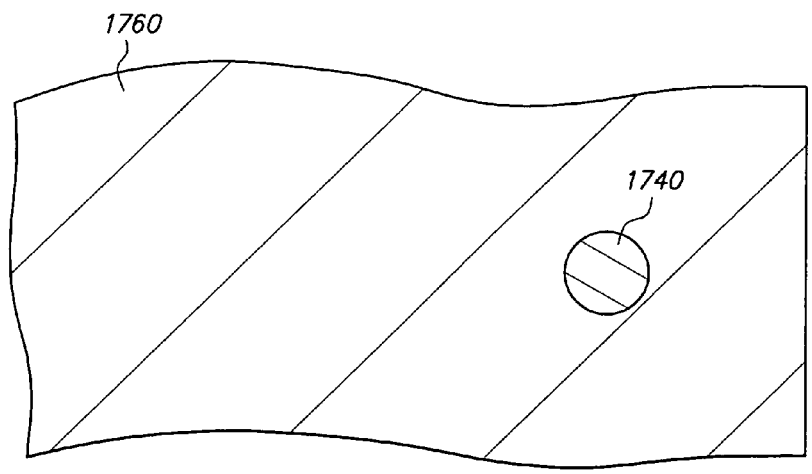
Figure 34C:
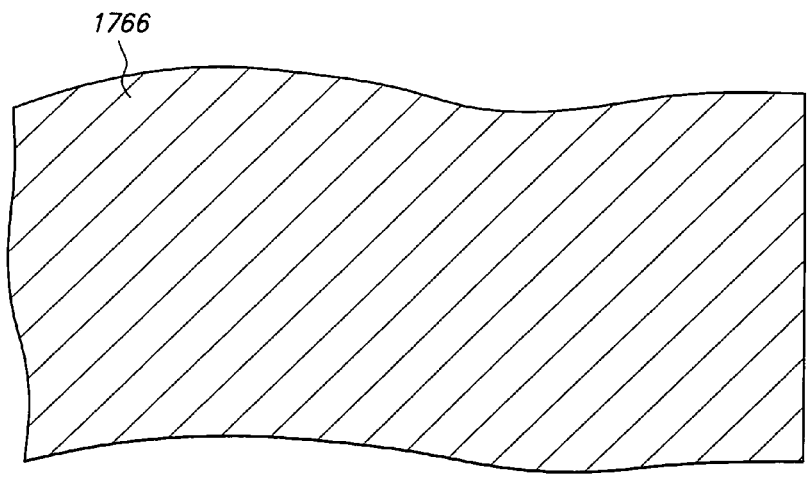

FIGS. 34A, 34B and 34C are cross-sectional, top and bottom views, respectively, of a semiconductor chip assembly in accordance with a seventeenth embodiment of the present invention. In the seventeenth embodiment, the plated terminals and the solder terminals are omitted. For purposes of brevity, any description in the first embodiment is incorporated herein insofar as the same is applicable, and the same description need not be repeated. Likewise, elements of the seventeenth embodiment similar to those in the first embodiment have corresponding reference numerals indexed at seventeen-hundred rather than one-hundred. For instance, chip 1710 corresponds to chip 110, routing line 1730 corresponds to routing line 130, etc.

The opening (corresponding to opening 168) in insulative base 1766, the plated terminals (corresponding to plated terminals 172 and 174) and the solder terminals (corresponding to solder terminals 176 and 178) are omitted. Thus, metal pillar 1740 is exposed in the upward direction and covered in the downward direction by insulative base 1766.

Semiconductor chip assembly 1798 includes chip 1710, routing line 1730, solder mask 1736, metal pillar 1740, adhesive 1756, connection joint 1758, encapsulant 1760 and insulative base 1766.

Figure 35A:
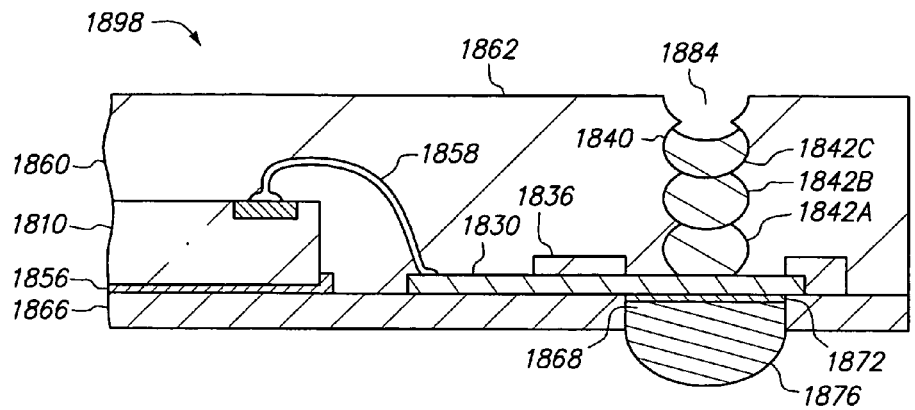
FIGS. 35A, 35B and 35C are cross-sectional, top and bottom views, respectively, of a semiconductor chip assembly in accordance with an eighteenth embodiment of the present invention.
Figure 35B:
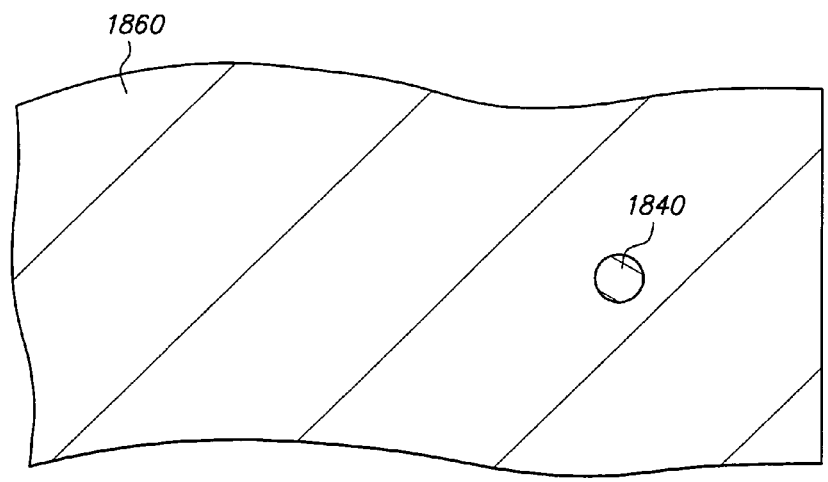
Figure 35C:
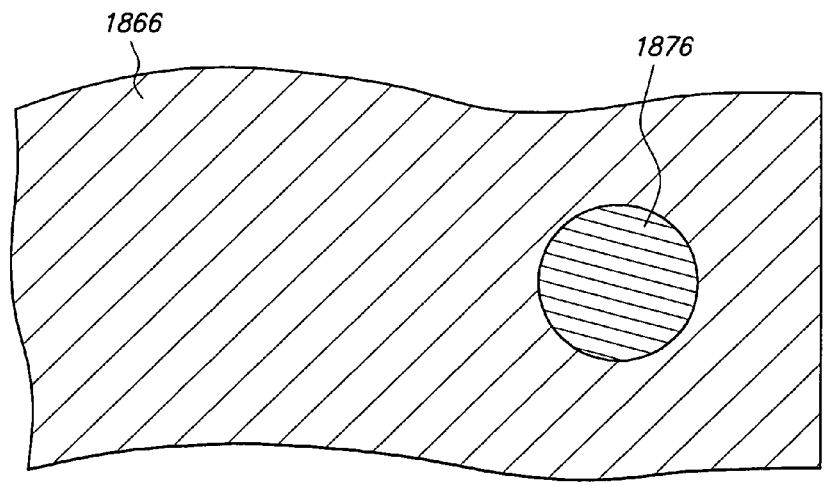

FIGS. 35A, 35B and 35C are cross-sectional, top and bottom views, respectively, of a semiconductor chip assembly in accordance with an eighteenth embodiment of the present invention. In the eighteenth embodiment, the metal pillar is recessed relative to the encapsulant. For purposes of brevity, any description in the first embodiment is incorporated herein insofar as the same is applicable, and the same description need not be repeated. Likewise, elements of the eighteenth embodiment similar to those in the first embodiment have corresponding reference numerals indexed at eighteen-hundred rather than one-hundred. For instance, chip 1810 corresponds to chip 110, routing line 1830 corresponds to routing line 130, etc.

The plated terminal (corresponding to plated terminal 174) and the solder terminal (corresponding to solder terminal 178) are omitted. This can be accomplished by grinding metal pillar 1840 and encapsulant 1860 after forming plated terminal 1872 and solder terminal 1876.

Thereafter, a blanket wet chemical etch is applied to metal pillar 1840. For instance, the top spray nozzle can spray a front-side wet chemical etch on metal pillar 1840 and encapsulant 1860 while the bottom spray nozzle is deactivated, or the structure can be dipped in the wet chemical etch before opening 1868, plated terminal 1872 and solder terminal 1876 are formed. The wet chemical etch is highly selective of gold with respect to epoxy and the molding compound, and therefore, highly selective of metal pillar 1840 with respect to encapsulant 1860 and insulative base 1866. Therefore, no appreciable amount of encapsulant 1860 or insulative base 1866 is removed.

The wet chemical etch etches partially into but not completely through metal pillar 1840, thereby reducing the thickness of metal pillar 1840 and receding metal pillar 1840 relative to surface 1862 of encapsulant 1860. That is, the wet chemical etch removes an upper portion of metal pillar 1840, thereby creating aperture 1884 that extends into encapsulant 1860 and exposes metal pillar 1840. The wet chemical etch removes the fourth metal ball (corresponding to metal ball 142D) and etches partially into but not completely through metal ball 1842C but does not reach metal balls 1842A and 1842B. Aperture 1884 has a maximum depth of 75 microns relative to surface 1862 of encapsulant 1860. In addition, metal pillar 1840 has an exposed upper surface with a concave, crater-like shape.

Metal pillar 1840 is recessed relative to encapsulant 1860, encapsulant 1860 continues to contact and not cover metal pillar 1840, and aperture 1884 extends vertically into but not through encapsulant 1860, is disposed outside the periphery of chip 1810, is vertically aligned with and exposes metal pillar 1840, exposes only metal pillar 1840 and encapsulant 1860 and is spaced from routing line 1830, solder mask 1836, adhesive 1856 and connection joint 1858.

A suitable wet chemical etch can be provided by a solution containing 5% hydrochloric acid in ethanol. The optimal etch time for exposing metal pillar 1840 to the wet chemical etch in order to form metal pillar 1840 with the desired dimensions can be established through trial and error.

Semiconductor chip assembly 1898 includes chip 1810, routing line 1830, solder mask 1836, metal pillar 1840, adhesive 1856, connection joint 1858, encapsulant 1860, insulative base 1866, plated terminal 1872 and solder terminal 1876.

Figure 36A:
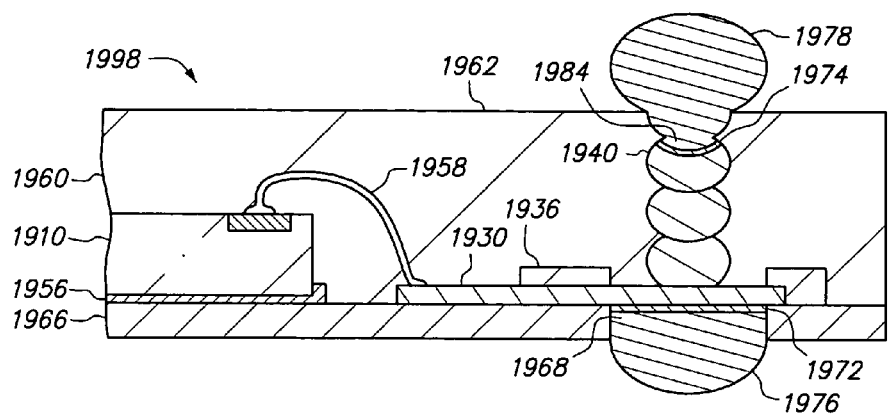
FIGS. 36A, 36B and 36C are cross-sectional, top and bottom views, respectively, of a semiconductor chip assembly in accordance with a nineteenth embodiment of the present invention.
Figure 36B:
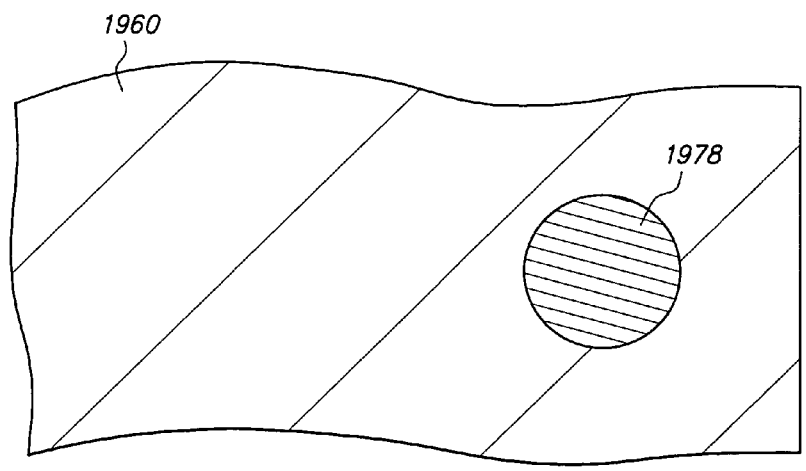
Figure 36C:
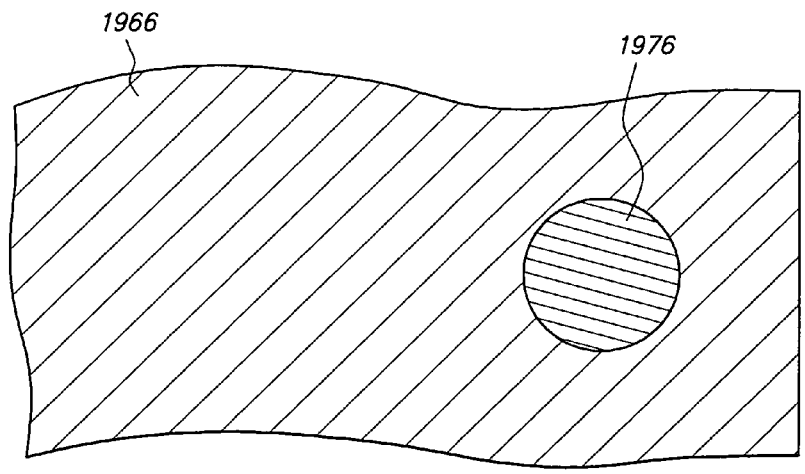

FIGS. 36A, 36B and 36C are cross-sectional, top and bottom views, respectively, of a semiconductor chip assembly in accordance with a nineteenth embodiment of the present invention. In the nineteenth embodiment, the metal pillar is recessed relative to the encapsulant. For purposes of brevity, any description in the first embodiment is incorporated herein insofar as the same is applicable, and the same description need not be repeated. Likewise, elements of the nineteenth embodiment similar to those in the first embodiment have corresponding reference numerals indexed at nineteen-hundred rather than one-hundred. For instance, chip 1910 corresponds to chip 110, routing line 1930 corresponds to routing line 130, etc.

Metal pillar 1940 is etched in the same manner as metal pillar 1840 to form aperture 1984 in the same manner as aperture 1884.

Thereafter, opening 1968, plated terminals 1972 and 1974 and solder terminals 1976 and 1978 are formed. Plated terminal 1974 is disposed within aperture 1984, and solder terminal 1978 extends within and outside aperture 1984 and extends upwardly beyond metal pillar 1940 and encapsulant 1960.

Semiconductor chip assembly 1998 includes chip 1910, routing line 1930, solder mask 1936, metal pillar 1940, adhesive 1956, connection joint 1958, encapsulant 1960, insulative base 1966, plated terminals 1972 and 1974 and solder terminals 1976 and 1978.

Figure 37A:
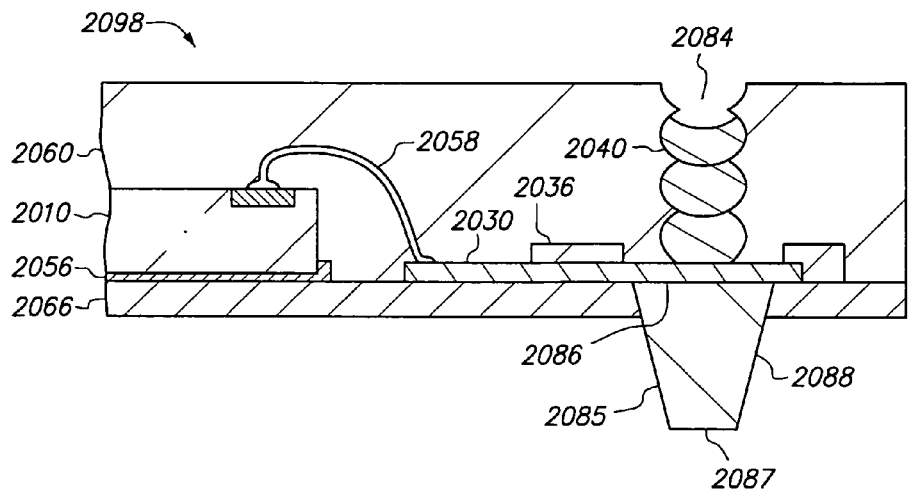
FIGS. 37A, 37B and 37C are cross-sectional, top and bottom views, respectively, of a semiconductor chip assembly in accordance with a twentieth embodiment of the present invention.
Figure 37B:
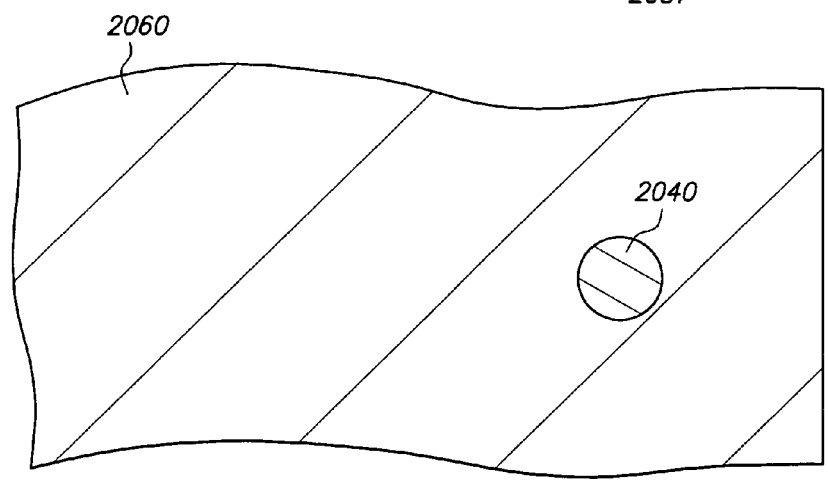
Figure 37C:
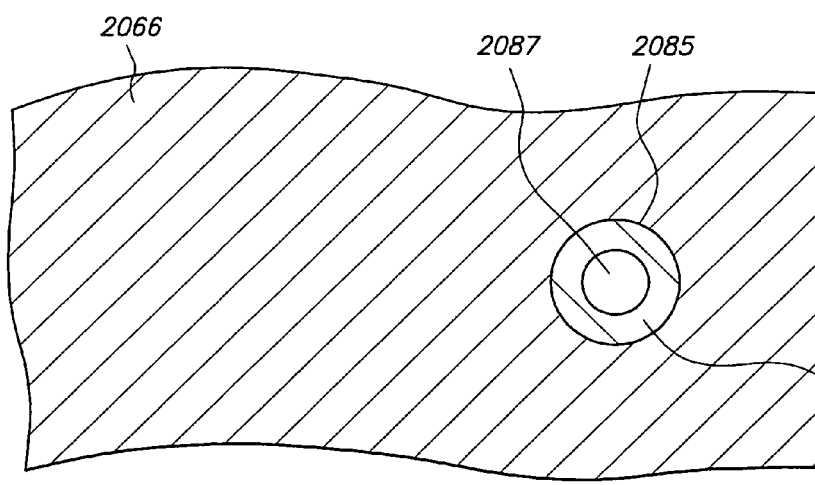

FIGS. 37A, 37B and 37C are cross-sectional, top and bottom views, respectively, of a semiconductor chip assembly in accordance with a twentieth embodiment of the present invention. In the twentieth embodiment, the conductive trace includes a tapered pillar. For purposes of brevity, any description in the first embodiment is incorporated herein insofar as the same is applicable, and the same description need not be repeated. Likewise, elements of the twentieth embodiment similar to those in the first embodiment have corresponding reference numerals indexed at two-thousand rather than one-hundred. For instance, chip 2010 corresponds to chip 110, routing line 2030 corresponds to routing line 130, etc.

Tapered pillar 2085 is formed by etching the metal base (corresponding to metal base 120) using an etch mask (not shown) to selectively protect the metal base. Tapered pillar 2085 is an unetched portion of the metal base defined by the etch mask that is formed subtractively and contacts routing line 2030.

The wet chemical etch etches completely through the metal base, thereby effecting a pattern transfer of the etch mask onto the metal base, removing a portion of the metal base within the periphery of chip 2010 without removing another portion of the metal base outside the periphery of chip 2010, exposing routing line 2030, solder mask 2036 and adhesive 2056, reducing but not eliminating contact area between the metal base and routing line 2030, and reducing and eliminating contact area between the metal base and solder mask 2036 and between the metal base and adhesive 2056. Furthermore, the wet chemical etch electrically isolates routing line 2030 from the other routing lines that are initially electroplated on and electrically connected to one another by the metal base.

The wet chemical etch laterally undercuts the metal base adjacent to the etch mask, causing tapered pillar 2085 to taper inwardly as it extends downwardly. A suitable taper is between 45 and slightly less than 90 degrees, such as approximately 75 degrees.

The optimal etch time for exposing the metal base to the wet chemical etch in order to form tapered pillar 2085 with the desired dimensions without excessively exposing routing line 2030 to the wet chemical etch can be established through trial and error.

Tapered pillar 2085 includes opposing surfaces 2086 and 2087 and tapered sidewalls 2088 therebetween. Surface 2086 of tapered pillar 2085 constitutes an unetched portion of the top surface (corresponding to surface 122) of the metal base, and surface 2087 of tapered pillar 2085 constitutes an unetched portion of the bottom surface (corresponding to surface 124) of the metal base. Surface 2086 contacts and faces towards routing line 2030 and is spaced from and faces away from the etch mask, and surface 2087 contacts and faces towards the etch mask and is spaced from and faces away from routing line 2030. Surfaces 2086 and 2087 are flat and parallel to one another. Tapered sidewalls 2088 are adjacent to surfaces 2086 and 2087 and slant inwardly towards surface 2087.

Tapered pillar 2085 has a conical shape with a height (between surfaces 2086 and 2087) of 200 microns and a diameter that decreases as the height increases (away from surface 2086 and towards surface 2087). Surface 2086 has a circular shape with a diameter of 300 microns, and surface 2087 has a circular shape with a diameter of 150 microns. Thus, surface 2086 provides the base of tapered pillar 2085, and surface 2087 provides the tip of tapered pillar 2085.

Tapered pillar 2085 contacts routing line 2030, is spaced and separated from metal pillar 2040 and connection joint 2058, is overlapped by and vertically aligned with the enlarged circular portion of routing line 2030 and metal pillar 2040, is disposed outside the periphery of chip 2010 and is disposed downwardly beyond chip 2010, routing line 2030, solder mask 2036, metal pillar 2040, adhesive 2056, connection joint 2058 and encapsulant 2060. Routing line 2030 and tapered pillar 2085 contact one another, adhere to one another, are adjacent to one another, and are metallurgically bonded to one another but are not integral with one another and are not metallurgically welded to one another.

Surfaces 2086 and 2087 are vertically aligned with the etch mask, the enlarged circular portion of routing line 2030, metal pillar 2040 and one another. In addition, surface 2087 is concentrically disposed within the surface areas of surface 2086, the etch mask and the enlarged circular portion of routing line 2030.

Thereafter, the etch mask is removed, then insulative base 2066 is formed with a thickness of 250 microns (rather than 50 microns) and covers tapered pillar 2085 in the downward direction, then metal pillar 2040 and encapsulant 2060 are grinded, then metal pillar 2040 is etched in the same manner as metal pillar 1840 to form aperture 2084 in the same manner as aperture 1884, and then a lower portion of insulative base 2066 is removed by plasma etching such that tapered pillar 2085 extends downwardly beyond insulative base 2066 by 150 microns and is exposed.

The opening (corresponding to opening 168) in insulative base 2066, the plated terminals (corresponding to plated terminals 172 and 174) and the solder terminals (corresponding to solder terminals 176 and 178) are omitted.

Semiconductor chip assembly 2098 includes chip 2010, routing line 2030, solder mask 2036, metal pillar 2040, adhesive 2056, connection joint 2058, encapsulant 2060, insulative base 2066 and tapered pillar 2085.

Figure 38A:
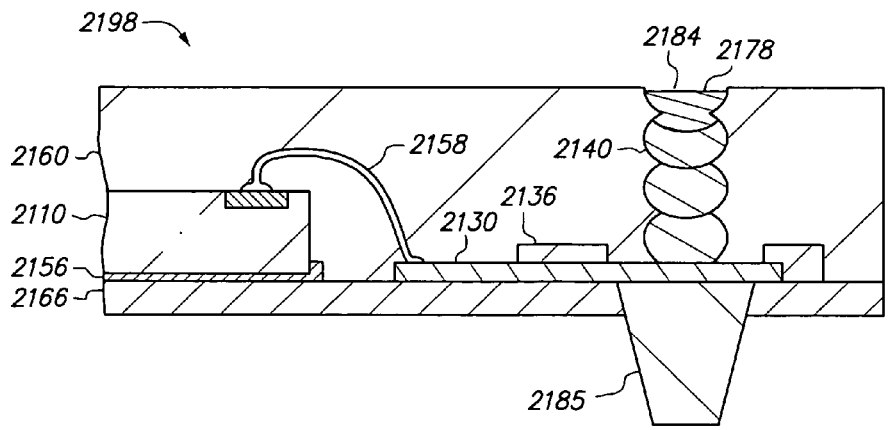
FIGS. 38A, 38B and 38C are cross-sectional, top and bottom views, respectively, of a semiconductor chip assembly in accordance with a twenty-first embodiment of the present invention.
Figure 38B:
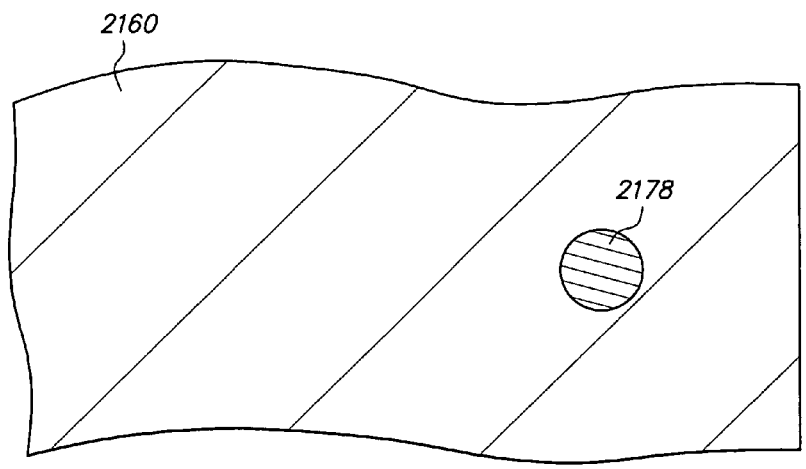
Figure 38C:
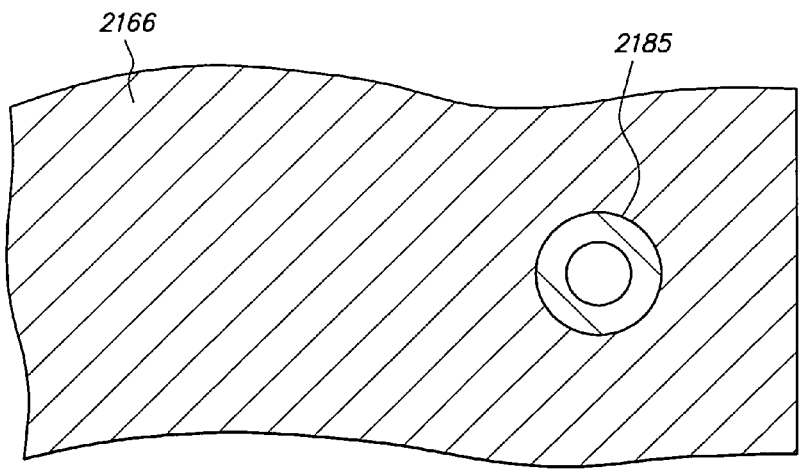

FIGS. 38A, 38B and 38C are cross-sectional, top and bottom views, respectively, of a semiconductor chip assembly in accordance with a twenty-first embodiment of the present invention. In the twenty-first embodiment, the conductive trace includes a tapered pillar. For purposes of brevity, any description in the first embodiment is incorporated herein insofar as the same is applicable, and the same description need not be repeated. Likewise, elements of the twenty-first embodiment similar to those in the first embodiment have corresponding reference numerals indexed at twenty-one-hundred rather than one-hundred. For instance, chip 2110 corresponds to chip 110, routing line 2130 corresponds to routing line 130, etc.

Semiconductor chip assembly 2198 is formed in the same manner as semiconductor chip assembly 2098, except that metal pillar 2140 is formed in the same manner as metal pillar 640, and therefore is copper, and solder terminal 2178 is formed in the same manner as solder terminal 678 and is disposed within aperture 2184.

Semiconductor chip assembly 2198 includes chip 2110, routing line 2130, solder mask 2136, metal pillar 2140, adhesive 2156, connection joint 2158, encapsulant 2160, insulative base 2166, solder terminal 2178 and tapered pillar 2185.

Figure 39A:
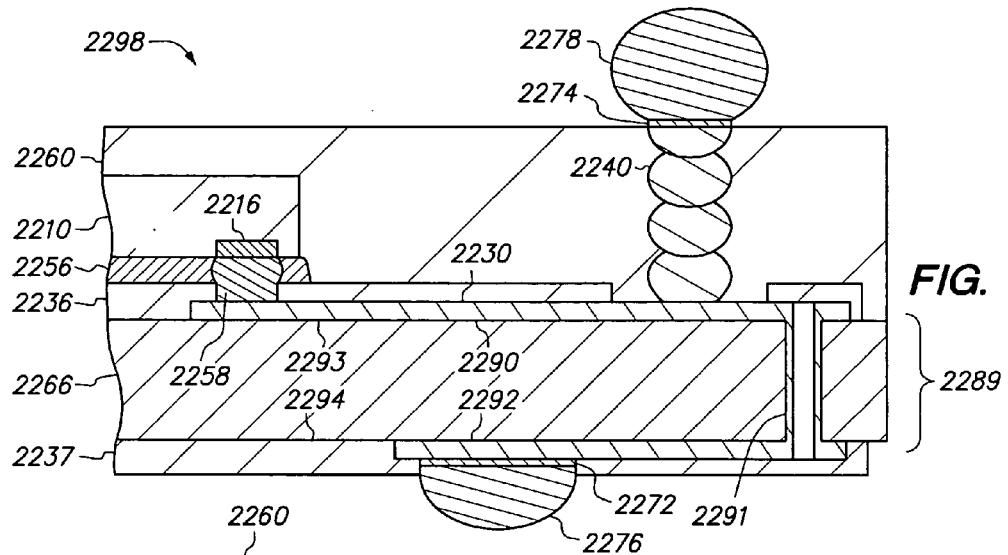
FIGS. 39A, 39B and 39C are cross-sectional, top and bottom views, respectively, of a semiconductor chip assembly in accordance with a twenty-second embodiment of the present invention.
Figure 39B:
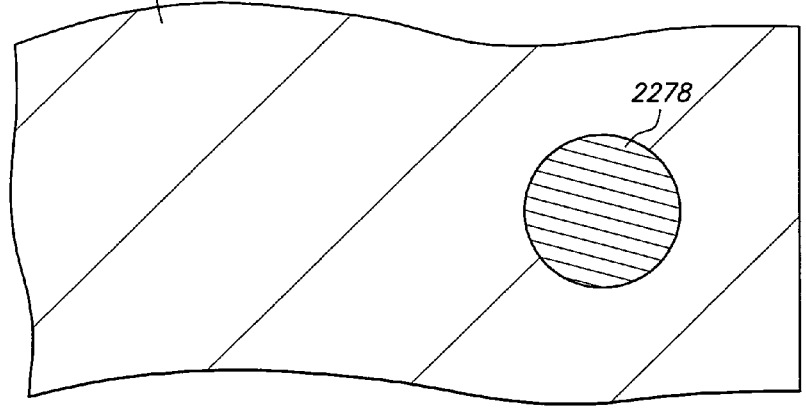
Figure 39C:
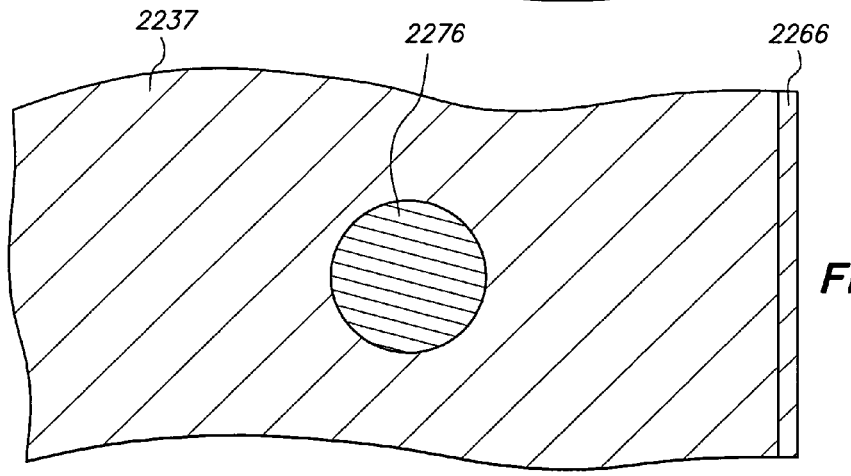

FIGS. 39A, 39B and 39C are cross-sectional, top and bottom views, respectively, of a semiconductor chip assembly in accordance with a twenty-second embodiment of the present invention. In the twenty-second embodiment, the routing line is formed on the insulative base and the metal base is omitted. For purposes of brevity, any description in the first embodiment is incorporated herein insofar as the same is applicable, and the same description need not be repeated. Likewise, elements of the twenty-second embodiment similar to those in the first embodiment have corresponding reference numerals indexed at twenty-two-hundred rather than one-hundred. For instance, chip 2210 corresponds to chip 110, routing line 2230 corresponds to routing line 130, etc.

The metal base (corresponding to metal base 120) is omitted, and thus the metal base etch and removal are omitted.

Substrate 2289 includes routing line 2230 and insulative base 2266. Substrate 2289 is provided before chip 2210 or metal pillar 2240 is attached to routing line 2230. Routing line 2230 is composed of copper, and insulative base 2266 is composed of insulative glass-reinforced FR-4 epoxy. Routing line 2230 includes front-side routing portion 2290, vertical connection 2291 and back-side routing portion 2292. Insulative base 2266 includes opposing major surfaces 2293 and 2294.

Front-side routing portion 2290 is disposed at surface 2293, back-side routing portion 2292 is disposed at surface 2294, and vertical connection 2291 is contiguous with front-side routing portion 2290 at surface 2293 and back-side routing portion 2292 at surface 2294 and extends through insulative base 2266 to surfaces 2293 and 2294. Thus, routing line 2230 provides horizontal routing at surfaces 2293 and 2294 and vertical routing between surfaces 2293 and 2294. In addition, front-side routing portion 2290 is flat and protrudes from insulative base 2266 at surface 2293, and back-side routing portion 2292 is flat and protrudes from insulative base 2266 at surface 2294.

Front-side routing portion 2290 includes an elongated routing portion with a width (orthogonal to its elongated length) of 100 microns and an enlarged circular portion with a diameter of 400 microns, back-side routing portion 2292 includes an elongated routing portion with a width (orthogonal to its elongated length) of 100 microns and an enlarged circular portion with a diameter of 400 microns, and vertical connection 2291 is an enlarged annular region with a diameter of 200 microns. Front-side routing portion 2290 and back-side routing portion 2292 have a thickness of 18 microns, and insulative base 2266 has a thickness of 400 microns.

Substrate 2289 is manufactured by providing insulative base 2266, laminating first and second copper layers on surfaces 2293 and 2294, respectively, of insulative base 2266, mechanically drilling a through-hole through the metal layers and insulative base 2266, performing a plating operation to form a plated through-hole (PTH) that provides vertical connection 2291, depositing first and second etch masks on the first and second metal layers, respectively, providing a wet chemical etch that selectively etches an exposed portion of the first copper layer through an opening in the first etch mask to form front-side routing portion 2290 from an unetched portion of the first metal layer and that selectively etches an exposed portion of the second copper layer through an opening in the second etch mask to form back-side routing portion 2292 from an unetched portion of the second metal layer, and then stripping the etch masks.

Solder mask 2236 is formed on front-side routing portion 2290 and surface 2293 of insulative base 2266 in the same manner that solder mask 236 is formed on routing line 230 and the metal base (corresponding to metal base 120), and solder mask 2237 is formed on back-side routing portion 2292 and surface 2294 of insulative base 2266 in the same manner as solder mask 2236. Solder mask 2236 includes an opening (corresponding to opening 138) that exposes the enlarged circular portion of front-side routing portion 2290 and another opening (corresponding to opening 280) that exposes a portion of front-side routing portion 2290 near the distal end of front-side routing portion 2290, and likewise, solder mask 2237 includes an opening that exposes the enlarged circular portion of back-side routing portion 2292.

Connection joint 2258 is formed as a solder bump on chip 2210 in the same manner that connection joint 258 is formed on chip 210. Thereafter, chip 2210 is flip-chip mounted on routing line 2230 such that connection joint 2258 contacts and mechanically attaches and electrically connects pad 2216 and routing line 2230 in the same manner that chip 210 is flip-chip mounted on routing line 230, then adhesive 2256 is dispensed into and underfills the open gap between chip 2210 and solder mask 2236 and is cured in the same manner as adhesive 256 is dispensed and cured, then metal pillar 2240 and encapsulant 2260 are formed, then metal pillar 2240 and encapsulant 2260 are grinded, and then plated terminals 2272 and 2274 and solder terminals 2276 and 2278 are formed.

Semiconductor chip assembly 2298 includes chip 2210, routing line 2230, solder masks 2236 and 2237, metal pillar 2240, adhesive 2256, connection joint 2258, encapsulant 2260, insulative base 2266, plated terminals 2272 and 2274 and solder terminals 2276 and 2278.

Figure 40A:
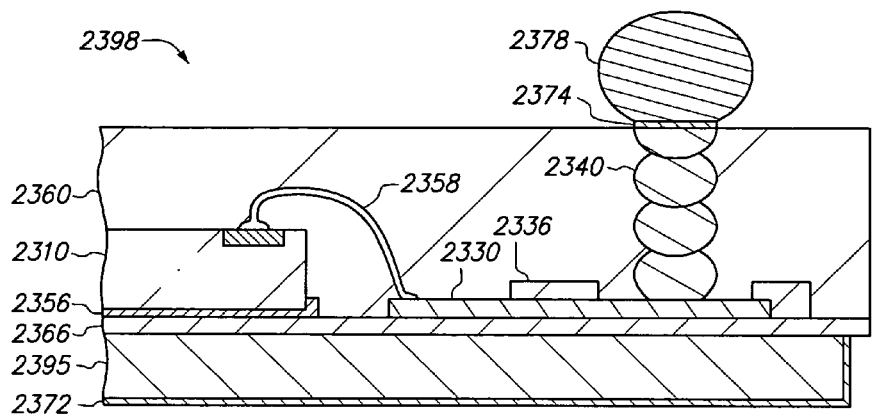
FIGS. 40A, 40B and 40C are cross-sectional, top and bottom views, respectively, of a semiconductor chip assembly in accordance with a twenty-third embodiment of the present invention.
Figure 40B:
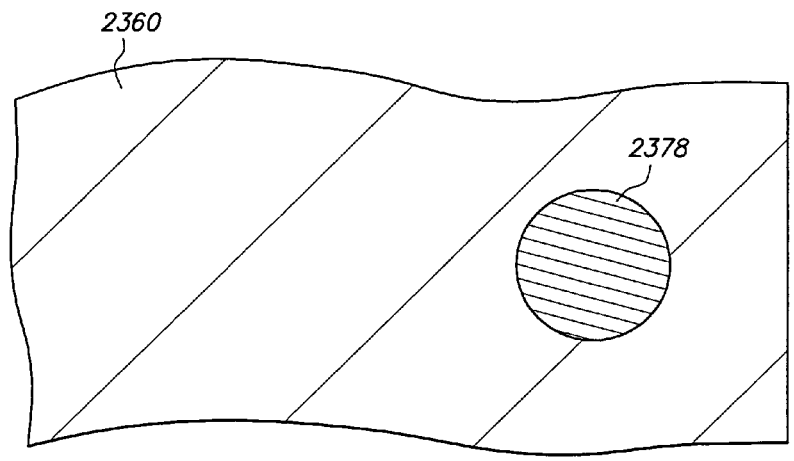
Figure 40C:
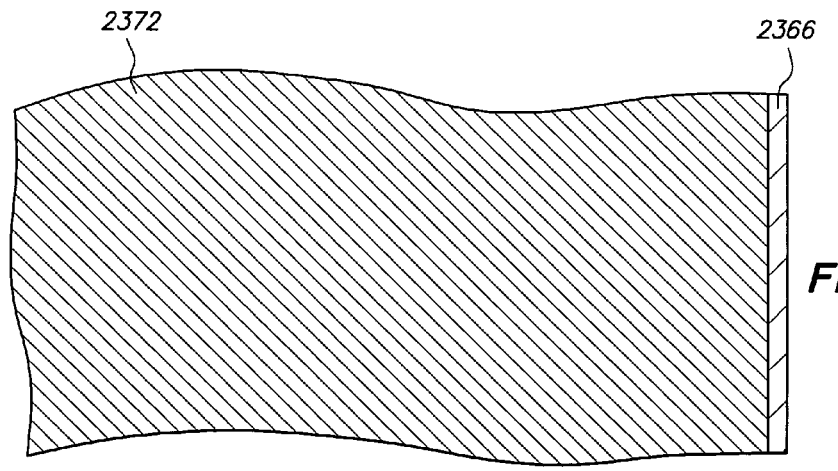

FIGS. 40A, 40B and 40C are cross-sectional, top and bottom views, respectively, of a semiconductor chip assembly in accordance with a twenty-third embodiment of the present invention. In the twenty-third embodiment, the assembly includes a heat sink. For purposes of brevity, any description in the first embodiment is incorporated herein insofar as the same is applicable, and the same description need not be repeated. Likewise, elements of the twenty-third embodiment similar to those in the first embodiment have corresponding reference numerals indexed at twenty-three-hundred rather than one-hundred. For instance, chip 2310 corresponds to chip 110, routing line 2330 corresponds to routing line 130, etc.

Insulative base 2366 is a high thermal conductivity adhesive such as Hysol QMI 536HT and has a thickness of 25 microns (rather than 50 microns). Heat sink 2395 is a copper plate with a thickness of 150 microns.

Insulative base 2366 is initially a liquid resin (A stage) such as polyamic acid that is deposited on routing line 2330, solder mask 2336, adhesive 2356 and encapsulant 2360 using stencil printing. Thereafter, the structure is placed in an oven and insulative base 2366 is heated to a relatively low temperature such as 100° C. As a result, insulative base 2366 is partially polymerized (B stage) and forms a gel but is not fully cured. Thereafter, heat sink 2395 is placed on insulative base 2366, and insulative base 2366 contacts and is sandwiched between routing line 2330 and heat sink 2395, between solder mask 2336 and heat sink 2395, between adhesive 2356 and heat sink 2395, and between encapsulant 2360 and heat sink 2395 while insulative base 2366 is a gel. As a result, insulative base 2366 provides a loose mechanical bond between routing line 2330 and heat sink 2395, between solder mask 2336 and heat sink 2395, between adhesive 2356 and heat sink 2395, and between encapsulant 2360 and heat sink 2395. Chip 2310 and heat sink 2395 are positioned relative to one another so that chip 2310 is disposed within the periphery of heat sink 2395. Chip 2310 and heat sink 2395 can be aligned using an automated pattern recognition system.

Thereafter, the structure is placed in an oven and insulative base 2366 is fully cured (C stage) at relatively low temperature in the range of 200 to 250° C. to form a solid adhesive insulative thermosetting polyimide layer that mechanically attaches heat sink 2395 to the structure.

Thereafter, the structure is dipped in an activator solution such as dilute palladium chloride of approximately 0.1 grams of palladium chloride and 5 cubic centimeters of hydrochloric acid per liter of water to render heat sink 2395 catalytic to electroless nickel, and then the structure is rinsed in distilled water to remove the palladium from encapsulant 2360 and insulative base 2366.

Thereafter, plated terminals 2372 and 2374 and solder terminal 2378 are formed. Plated terminal 2372 contacts and coats heat sink 2395 and covers heat sink 2395 in the downward direction. As a result, plated terminal 2372 reduces corrosion.

Heat sink 2395 is spaced and separated from, electrically isolated from, overlapped by and disposed downwardly beyond chip 2310, routing line 2330, solder mask 2336, metal pillar 2340, adhesive 2356, connection joint 2358, encapsulant 2360, plated terminal 2374 and solder terminal 2378. The opening (corresponding to opening 168) in insulative base 2366 and the solder terminal (corresponding to solder terminal 176) are omitted.

Semiconductor chip assembly 2398 includes chip 2310, routing line 2330, solder mask 2336, metal pillar 2340, adhesive 2356, connection joint 2358, encapsulant 2360, insulative base 2366, plated terminals 2372 and 2374, solder terminal 2378 and heat sink 2395.

Figure 41A:
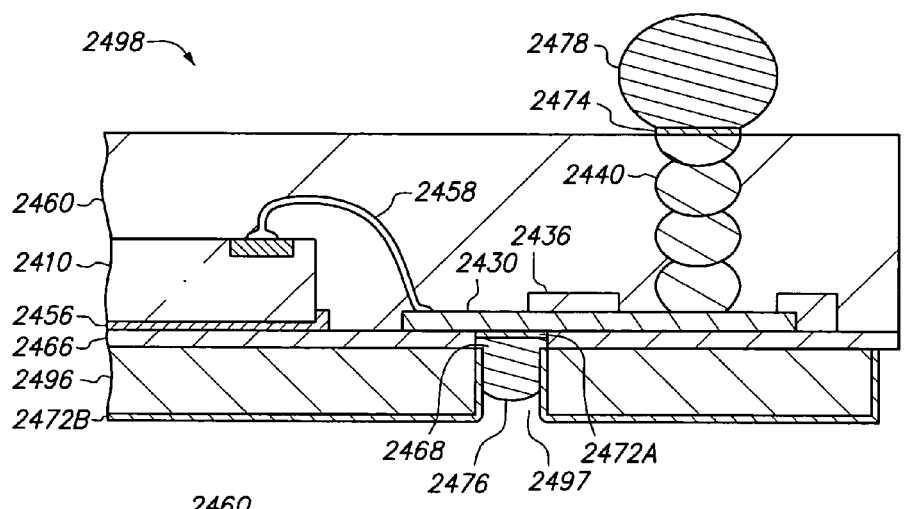
FIGS. 41A, 41B and 41C are cross-sectional, top and bottom views, respectively, of a semiconductor chip assembly in accordance with a twenty-fourth embodiment of the present invention.
Figure 41B:
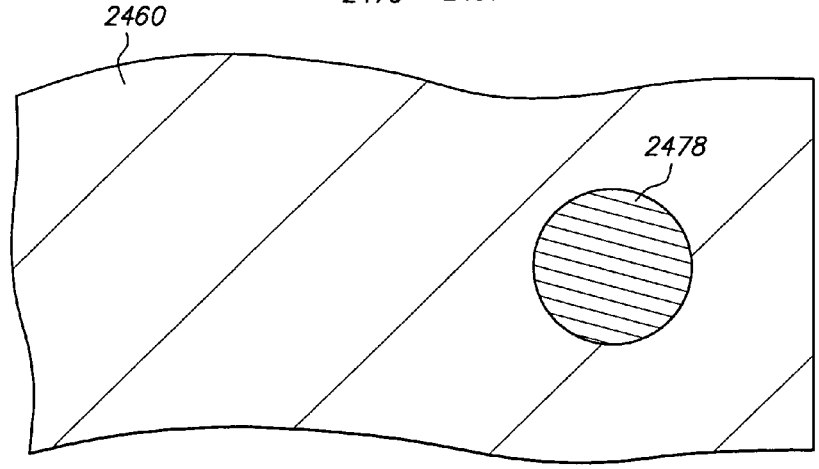
Figure 41C:
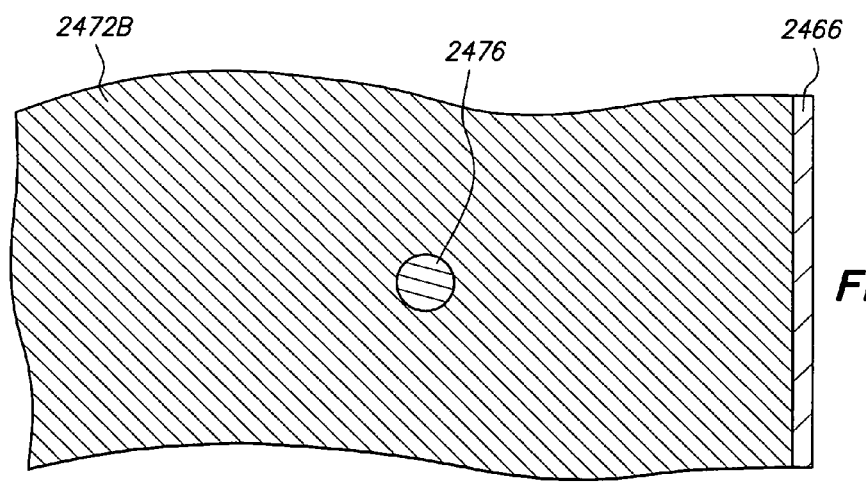

FIGS. 41A, 41B and 41C are cross-sectional, top and bottom views, respectively, of a semiconductor chip assembly in accordance with a twenty-fourth embodiment of the present invention. In the twenty-fourth embodiment, the assembly includes a ground plane. For purposes of brevity, any description in the first embodiment is incorporated herein insofar as the same is applicable, and the same description need not be repeated. Likewise, elements of the twenty-fourth embodiment similar to those in the first embodiment have corresponding reference numerals indexed at twenty-four-hundred rather than one-hundred. For instance, chip 2410 corresponds to chip 110, routing line 2430 corresponds to routing line 130, etc.

Routing line 2430 is formed in the same manner as routing line 1430, and therefore includes an additional enlarged circular portion (not shown) with a diameter of 400 microns at the side opposite the enlarged circular portion (corresponding to enlarged circular portion 134).

Insulative base 2466 and ground plane 2496 are formed and attached to the structure in the same manner as insulative base 2366 and heat sink 2395, respectively, except that ground plane 2496 includes opening 2497 with a diameter of 200 microns that is vertically aligned with the additional enlarged circular portion of routing line 2430.

Opening 2468 is formed through insulative base 2466 in essentially the same manner as opening 1468. Namely, the laser drills through and removes portions of insulative base 2466 within the surface area of opening 2497, thereby effecting a pattern transfer of opening 2497 through insulative base 2466 to routing line 2430. A brief cleaning step can then be applied to remove oxides and debris that may be present on the exposed portion of routing line 2430.

Thereafter, the structure is dipped in an activator solution such as dilute palladium chloride of approximately 0.1 grams of palladium chloride and 5 cubic centimeters of hydrochloric acid per liter of water to render ground plane 2496 catalytic to electroless nickel, and then the structure is rinsed in distilled water to remove the palladium from encapsulant 2460 and insulative base 2466.

Thereafter, plated terminals 2472A, 2472B and 2474 are formed in the same manner as plated terminals 1472, 2372 and 2374, respectively. Plated terminal 2472A contacts routing line 2430 in opening 2468 and is spaced from ground plane 2496, plated terminal 2472B contacts and coats ground plane 2496 and extends into and forms a plated through-hole (PTH) in opening 2497, and plated terminal 2474 contacts metal pillar 2440. Furthermore, plated terminals 2472A, 2472B and 2474 are spaced and separated from one another.

Thereafter, solder paste is deposited on plated terminals 2472A and 2472B in openings 2468 and 2497, respectively, and on plated terminal 2474, and then the solder paste is heated and reflowed. The solder paste cools and solidifies into solder terminals 2476 and 2478. Solder terminal 2476 contacts and electrically connects plated terminals 2472A and 2472B, thereby electrically connecting routing line 2430 and ground plane 2496.

Ground plane 2496 is electrically connected to routing line 2430, metal pillar 2440, connection joint 2458 and plated terminals 2472A, 2472B and 2474, and is spaced and separated from, overlapped by and disposed downwardly beyond chip 2410, routing line 2430, solder mask 2436, metal pillar 2440, adhesive 2456, connection joint 2458, encapsulant 2460, plated terminals 2472A and 2474 and solder terminal 2478. Furthermore, solder terminal 2476 does not protrude downwardly beyond ground plane 2496, and serves as an interconnect rather than a contact terminal.

Semiconductor chip assembly 2498 includes chip 2410, routing line 2430, solder mask 2436, metal pillar 2440, adhesive 2456, connection joint 2458, encapsulant 2460, insulative base 2466, plated terminals 2472A, 2472B and 2474, solder terminals 2476 and 2478 and ground plane 2496.

Figure 42A:
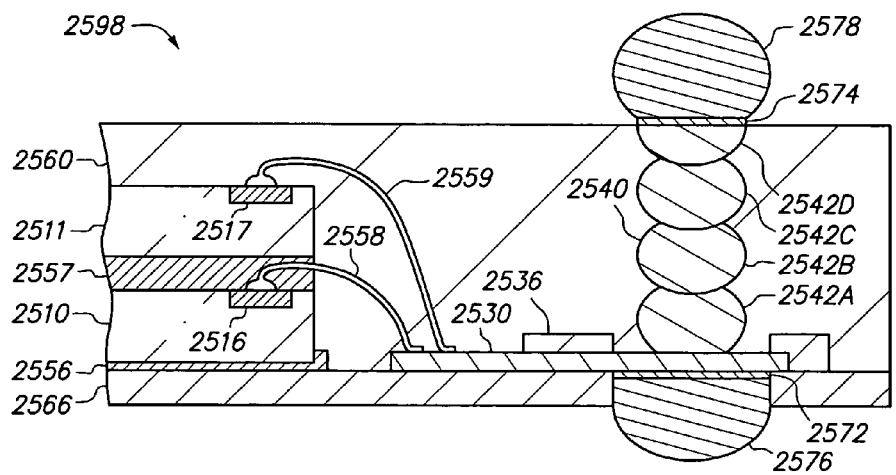
FIGS. 42A, 42B and 42C are cross-sectional, top and bottom views, respectively, of a semiconductor chip assembly in accordance with a twenty-fifth embodiment of the present invention.
Figure 42B:
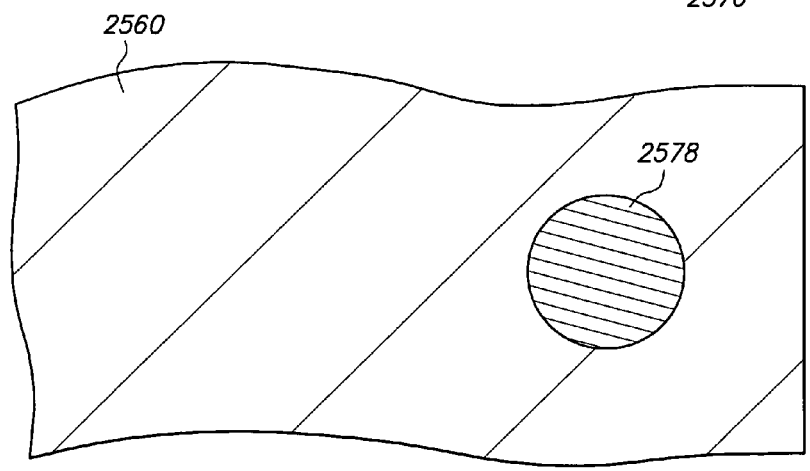
Figure 42C:
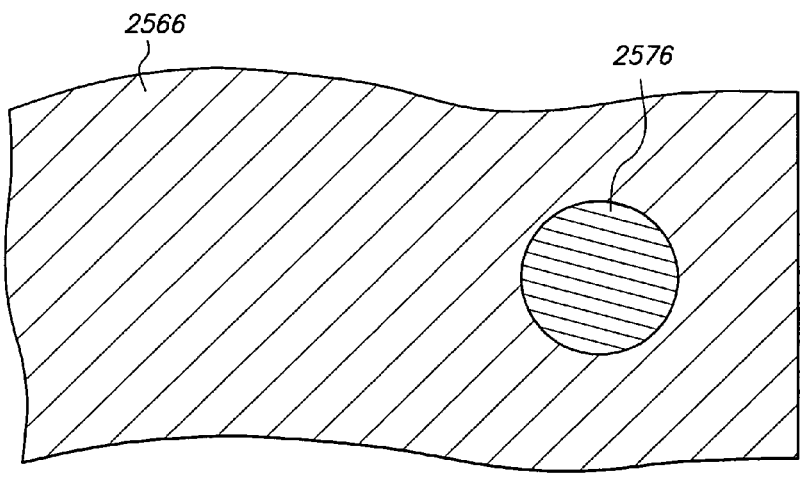

FIGS. 42A, 42B and 42C are cross-sectional, top and bottom views, respectively, of a semiconductor chip assembly in accordance with a twenty-fifth embodiment of the present invention. In the twenty-fifth embodiment, the assembly is a multi-chip package. For purposes of brevity, any description in the first embodiment is incorporated herein insofar as the same is applicable, and the same description need not be repeated. Likewise, elements of the twenty-fifth embodiment similar to those in the first embodiment have corresponding reference numerals indexed at twenty-five-hundred rather than one-hundred. For instance, chip 2510 corresponds to chip 110, routing line 2530 corresponds to routing line 130, etc.

Chip 2510 is mechanically attached to routing line 2530, solder mask 2536 and metal pillar 2540 by adhesive 2556 and electrically connected to routing line 2530 by connection joint 2558. Furthermore, metal pillar 2540 is formed with a height of 700 microns (rather than 425 microns). This is accomplished by a slight adjustment to the welding operation previously described for metal pillar 140. In particular, metal pillar 2540 is formed from a gold wire with a diameter of 70 microns (rather than 50 microns) and wire balls which each have a diameter of 175 microns (rather than 125 microns), and metal balls 2542A, 2542B, 2542C and 2542D each have a diameter of 200 microns (rather than 150 microns).

Thereafter, adhesive 2557 is deposited as a spacer paste that includes silicon spacers on chip 2510, then chip 2511 (which includes pad 2517 and is essentially identical to chip 2510) is placed on adhesive 2557 such that adhesive 2557 contacts and is sandwiched between chips 2510 and 2511, and then the structure is placed in an oven and adhesive 2557 is fully cured (C stage) at relatively low temperature in the range of 200 to 250° C. to form a solid adhesive insulative layer that mechanically attaches chips 2510 and 2511. Adhesive 2557 is 100 microns thick between chips 2510 and 2511, and chips 2510 and 2511 are spaced and separated from and vertically aligned with one another. A suitable spacer paste is Hysol QMI 500.

Thereafter, chip 2511 is wire bonded to routing line 2530 by connection joint 2559 in the same manner that chip 2510 is wire bonded to routing line 2530 by connection joint 2558.

Thereafter, encapsulant 2560 with a thickness of 900 microns (rather than 600 microns) is formed so that encapsulant 2560 contacts and covers chips 2510 and 2511, solder mask 2536, metal pillar 2540, adhesives 2556 and 2557 and connection joints 2558 and 2559, then metal pillar 2540 and encapsulant 2560 are grinded and then insulative base 2566, plated terminals 2572 and 2574 and solder terminals 2576 and 2578 are formed.

The semiconductor chip assembly is a multi-chip first-level package. Chips 2510 and 2511 are embedded in encapsulant 2560. Metal pillar 2540 extends across most of the thickness of chip 2510 and all of the thickness of chip 2511. Furthermore, an electrically conductive path between pad 2516 and metal pillar 2540 not only includes but also requires routing line 2530, and an electrically conductive path between pad 2517 and metal pillar 2540 not only includes but also requires routing line 2530. Thus, chips 2510 and 2511 are both embedded in encapsulant 2560 and electrically connected to metal pillar 2540 by an electrically conductive path that includes routing line 2530.

Semiconductor chip assembly 2598 includes chips 2510 and 2511, routing line 2530, solder mask 2536, metal pillar 2540, adhesives 2556 and 2557, connection joints 2558 and 2559, encapsulant 2560, insulative base 2566, plated terminals 2572 and 2574 and solder terminals 2576 and 2578.

The semiconductor chip assemblies described above are merely exemplary.

Numerous other embodiments are contemplated. For instance, the solder mask, adhesive, insulative base, metal base, plated terminals and/or solder terminals can be omitted. In addition, the embodiments described above can generally be combined with one another. For instance, the flip-chip in the second embodiment and the connection joints in the third and fourth embodiments can be used in the other embodiments except for the multi-chip assembly in the twenty-fifth embodiment since the chips are not inverted. Likewise, the metal pillars in the fifth, sixth and seventh embodiments can be used in the other embodiments. Likewise, the encapsulants in the eighth to eleventh embodiments can be used in the other embodiments. Likewise, the encapsulant in the twelfth embodiment can be used in the other embodiments except for the multi-chip assembly in the twenty-fifth embodiment since the chips are not inverted. Likewise, the solder mask in the thirteenth embodiment can be used in the other embodiments. Likewise, the solder terminal in the fourteen embodiment can be used in the other embodiments except for the fifteenth to seventeenth, twenty-third and twenty-fourth embodiments since the conductive trace is not exposed in the downward direction. Likewise, the omission of the plated terminals and the solder terminals in the fourteenth to seventeenth embodiments can be used in the other embodiments. Likewise, the aperture in the eighteenth and nineteenth embodiments can be used in the other embodiments. Likewise, the tapered pillar in the twentieth and twenty-first embodiments can be used in the other embodiments except for the fifteenth to seventeenth, twenty-third and twenty-fourth embodiments since the conductive trace is not exposed in the downward direction. Likewise, the substrate in the twenty-second embodiment can be used in the other embodiments. Likewise, the heat sink and the ground plane in the twenty-third and twenty-fourth embodiments can be used the other embodiments except for the fourteenth, twentieth and twenty-first embodiments since the conductive trace is exposed in the downward direction. Finally, the multi-chip assembly in the twenty-fifth embodiment can be used in the other embodiments except for the second to fourth and twelfth embodiments since the chips are inverted. The embodiments described above can be mixed-and-matched with one another and with other embodiments depending on design and reliability considerations.

The metal base can be various metals such as copper, copper alloys, nickel, iron-nickel alloys, aluminum, and so on, and can be a single layer or multiple layers.

The metal base need not necessarily be removed. For instance, a portion of the metal base that extends across the pad can be selectively etched to permit formation of the through-hole, and another portion of the metal base that is disposed within the periphery of the chip can remain intact and provide a heat sink. Likewise, a portion of the metal base within the periphery of the chip can be selectively etched, and another portion of the metal base that is disposed outside the periphery of the chip can remain intact and provide the tapered pillar.

The etch mask that defines the tapered pillar can be a wide variety of materials including copper, gold, nickel, palladium, tin, solder, photoresist and epoxy, can be formed by a wide variety of processes including electroplating, electroless plating, printing, reflowing and curing, and can have a wide variety of shapes and sizes. The etch mask can be deposited on the metal base before, during or after the routing line is deposited on the metal base and before or after the encapsulant is formed, can be disposed on a planar surface of the metal base or in a recess in the metal base, and if disposed in a recess need not necessarily fill the recess. Furthermore, the etch mask can remain permanently attached to the tapered pillar or be removed after the tapered pillar is formed.

The etch mask that defines the tapered pillar is undercut by a wet chemical etch that forms the tapered pillar but can subsequently be confined to the tip of the tapered pillar, for instance by dislodging a portion of the etch mask outside the tip of the tapered pillar by mechanical brushing, sand blasting, air blowing or water rinsing, or by reflowing a solder etch mask when the tapered pillar does not provide a wettable surface. Alternatively, a solder etch mask can be reflowed to conformally coat the tapered pillar, for instance by depositing flux on the tapered pillar so that the tapered pillar provides a wettable surface before the solder reflow operation.

Further details regarding a tapered pillar that is etched from a metal base and contacts a routing line are disclosed in U.S. application Ser. No. 10/714,794 filed Nov. 17, 2003 by Chuen Rong Leu et al. entitled "Semiconductor Chip Assembly with Embedded Metal Pillar" which is incorporated by reference.

The routing line can be various conductive metals including copper, gold, nickel, silver, palladium, tin, combinations thereof, and alloys thereof. The preferred composition of the routing line will depend on the nature of the connection joint as well as design and reliability factors. Furthermore, those skilled in the art will understand that in the context of a semiconductor chip assembly, a copper material is typically a copper alloy that is mostly copper but not pure elemental copper, such copper-zirconium (99.9% copper), copper-silver-phosphorus-magnesium (99.7% copper), or copper-tin-iron-phosphorus (99.7% copper). Likewise, the routing line can fan-in as well as fan-out.

The routing line can be formed on the metal base by numerous deposition techniques including electroplating and electroless plating. In addition, the routing line can be deposited on the metal base as a single layer or multiple layers. For instance, the routing line can be a 10 micron layer of gold, or alternatively, a 9.5 micron layer of nickel electroplated on a 0.5 micron layer of gold electroplated on a copper base to reduce costs, or alternatively, a 9 micron layer of nickel electroplated on a 0.5 micron layer of gold electroplated on a 0.5 micron layer of tin electroplated on a copper base to reduce costs and avoid gold-copper alloys that may be difficult to remove when the copper base is etched. As another example, the routing line can consist of a non-copper layer electroplated on a copper base and a copper layer electroplated on the non-copper layer. Suitable non-copper layers include nickel, gold, palladium and silver. After the routing line is formed, a wet chemical etch can be applied that is highly selective of copper with respect to the non-copper layer to etch the copper base and expose the routing line without removing the copper or non-copper layers. The non-copper layer provides an etch stop that prevents the wet chemical etch from removing the copper layer. Furthermore, it is understood that in the context of the present invention, the routing line and the metal base are different metals (or metallic materials) even if a multi-layer routing line includes a single layer that is similar to the metal base (such as the example described above) or a single layer of a multi-layer metal base.

The routing line can also be formed by etching a metal layer attached to the metal base. For instance, a photoresist layer can be formed on the metal layer, the metal layer can be etched using the photoresist layer as an etch mask, and then the photoresist layer can be stripped. Alternatively, a photoresist layer can be formed on the metal layer, a plated metal can be selectively electroplated on the metal layer using the photoresist layer as a plating mask, the photoresist layer can be stripped, and then the metal layer can be etched using the plated metal as an etch mask. In this manner, the routing line can be formed semi-additively and include unetched portions of the metal layer and the plated metal. Likewise, the routing line can be formed subtractively from the metal layer, regardless of whether the plated metal etch mask remains attached to the routing line.

The routing line can be spot plated near the pad to make it compatible with receiving the connection joint. For instance, a copper routing line can be spot plated with nickel and then silver to make it compatible with a gold ball bond connection joint and avoid the formation of brittle silver-copper intermetallic compounds. The routing line can also be spot plated away from the pad to make it compatible with receiving the metal pillar. For instance, a copper routing line can be spot plated with nickel and then gold to facilitate welding a gold metal pillar.

The metal pillar can be uncovered in the upward direction by the encapsulant or any other insulative material of the assembly. For instance, the metal pillar can be exposed in the upward direction, or alternatively, the metal pillar can be unexposed in the upward direction and a solder terminal that contacts and overlaps the metal pillar can be exposed in the upward direction, or alternatively, the metal pillar can be unexposed in the upward direction and a plated terminal that contacts and overlaps the metal pillar can be exposed in the upward direction, or alternatively, the metal pillar can be unexposed in the upward direction, a plated terminal that contacts and overlaps the metal pillar can be unexposed in the upward direction, and a solder terminal that contacts and overlaps the plated terminal and overlaps and is spaced and separated from the metal pillar can be exposed in the upward direction, or alternatively, the metal pillar can be covered in the upward direction by an insulative material external to the assembly such as another semiconductor chip assembly in a stacked arrangement.

The metal pillar can be welded to the routing line by ball bonding, wedge bonding, thermocompression bonding, thermosonic bonding, ultrasonic bonding, stud bumping, and other approaches using a combination of heat, pressure and/or vibration without using material other than the materials of the metal pillar and the routing line to provide the weld. Likewise, the metal balls can be welded together by ball bonding, wedge bonding, thermocompression bonding, thermosonic bonding, ultrasonic bonding, stud bumping, and other approaches using a combination of heat, pressure and/or vibration without using material other than the materials of the metal balls to provide the welds. It is understood that incidental amounts of other materials such as surface preparation agents, reaction products and contaminants such as oxide coatings and the like may be present in or around the welds.

The metal balls may be composed of various metals including gold, silver, copper, nickel, aluminum, palladium, indium and alloys thereof as well as solder coated over these metals. For instance, gold alloyed with a small amount of beryllium exhibits grain growth at low temperature which enhances stability and increases strength by precipitation hardening. Gold alloyed with 5 to 10 ppm beryllium by weight or 30 to 100 ppm copper by weight is commonly used for thermocompression and thermosonic wire bonding. Similarly, gold alloyed with 1 percent palladium raises the recrystallization temperature so that the fully annealed area above the ball bond resulting from the thermal source (such as electronic flame-off), called the heat-affected zone (HAZ), is extremely short, resulting in a short tail or stump on the ball bond after the wire is broken from the ball bond with a simple upward vertical movement. Furthermore, aluminum alloyed with small amounts of silicon, magnesium or both has been proposed for thermosonic wire bonding.

The metal balls may be formed by contacting a wire ball to the routing line (when forming the bottom metal ball) and contacting a wire ball to the underlaying metal ball (when forming the remaining metal balls) using a capillary. Furthermore, the capillary can be withdrawn (clamp open) and then reapplied (clamp closed) to supply additional wire to the wire ball.

The metal balls can each contain a stump, or alternatively, the stump can be reduced or eliminated. For instance, the stump can be flattened or "coined" using a secondary operation after fracturing the wire. Alternatively, before moving or after slightly moving the capillary vertically upwards and away from the ball bond, the clamp can be closed and then the capillary can be moved horizontally to shear the wire from the ball bond at or near their juncture. This shearing operation requires that the capillary have adequate clearance for the horizontal motion, which will depend on the dimensions and shapes of the capillary and the ball bond as well as the amount of the upward vertical movement. As another example, the wire bonding equipment may include a blade that creates a notch in the wire to provide a weak point that subsequently breaks. As another example, the stump on the top metal ball can be removed by grinding or etching after the encapsulant is formed, and the stumps on the remaining metal balls can be removed by welding the overlaying metal balls.

The conductive trace can function as a signal, power or ground layer depending on the purpose of the associated chip pad.

The pad can have numerous shapes including a flat rectangular shape and a bumped shape. If desired, the pad can be treated to accommodate the connection joint.

Numerous adhesives can be applied to mechanically attach the chip to the routing line. For instance, the adhesive can be applied as a paste, a laminated layer, or a liquid applied by screen-printing, spin-on, or spray-on. The adhesive can be a single layer that is applied to the metal base or the solder mask and then contacted to the chip or a single layer that is applied to the chip and then contacted to the metal base or the solder mask. Similarly, the adhesive can be multiple layers with a first layer applied to the metal base or the solder mask, a second layer applied to the chip and then the layers contacted to one another. Thermosetting adhesive liquids and pastes such as epoxies are generally suitable. Likewise, thermoplastic adhesives such as an insulative thermoplastic polyimide film with a glass transition temperature (Tg) of 400° C. are also generally suitable. Silicone adhesives are also generally suitable.

The insulative base may be rigid or flexible, and can be various dielectric films or prepregs formed from numerous organic or inorganic insulators such as tape (polyimide), epoxy, silicone, glass, aramid and ceramic. Organic insulators are preferred for low cost, high dielectric applications, whereas inorganic insulators are preferred when high thermal dissipation and a matched thermal coefficient of expansion are important. For instance, the insulative base can initially be an epoxy paste that includes an epoxy resin, a curing agent, an accelerator and a filler, that is subsequently cured or hardened to form a solid adherent insulative layer. The filler can be an inert material such as silica (powdered fused quartz) that improves thermal conductivity, thermal shock resistance and thermal coefficient of expansion matching. Organic fiber reinforcement may also be used in resins such as epoxy, cyanate ester, polyimide, PTFE and combinations thereof. Fibers that may be used include aramid, polyester, polyamide, poly-ether-ether-ketone, polyimide, polyetherimide and polysulfone. The fiber reinforcement can be woven fabric, woven glass, random microfiber glass, woven quartz, woven, aramid, non-woven fabric, non-woven aramid fiber or paper. Commercially available dielectric materials such as SPEEDBOARD C prepreg by W.L. Gore & Associates of Eau Claire, Wis. are suitable.

The insulative base can be deposited in numerous manners, including printing and transfer molding. Furthermore, the insulative base can be formed before or after attaching the chip and the metal pillar to the routing line, before or after forming the encapsulant and before or after removing the upper portion of the encapsulant. For instance, the metal base can be removed and the insulative base can be formed after forming the encapsulant and before removing the upper portion of the encapsulant, or alternatively, after removing the upper portion of the encapsulant.

The encapsulant can be deposited using a wide variety of techniques including printing and transfer molding. For instance, the encapsulant can be printed on the chip and the metal pillar as an epoxy paste and then cured or hardened to form a solid adherent protective layer. The encapsulant can be any of the adhesives mentioned above. Moreover, the encapsulant need not necessarily contact the chip or the metal pillar. For instance, a glob-top coating can be deposited on the chip after attaching the chip to the routing line, and then the encapsulant can be formed on the glob-top coating. Likewise, a coating (such as flux or solder) can be deposited on the metal pillar, and then the encapsulant can be formed on the coating.

The encapsulant can have its upper portion removed using a wide variety of techniques including grinding (including mechanical polishing and chemical-mechanical polishing), blanket laser ablation and blanket plasma etching. Likewise, the encapsulant can have a selected portion above the metal pillar removed using a wide variety of techniques including selective laser ablation, selective plasma etching and photolithography.

The encapsulant can be laterally aligned with the metal pillar along an upwardly facing surface that faces and extends vertically beyond the chip by grinding the encapsulant without grinding the chip or the metal pillar, and then grinding the encapsulant and the metal pillar without grinding the chip, and then discontinuing the grinding before reaching the chip.

The encapsulant can be laterally aligned with the chip and the metal pillar along an upwardly facing surface by grinding the encapsulant without grinding the chip or the metal pillar, then grinding the encapsulant and the metal pillar without grinding the chip, and then grinding the encapsulant, the chip and the metal pillar (if the metal pillar extends upwardly beyond the chip before the grinding occurs), or alternatively, by grinding the encapsulant without grinding the chip or the metal pillar, then grinding the encapsulant and the chip without grinding the metal pillar, and then grinding the encapsulant, the chip and the metal pillar (if the chip extends upwardly beyond the metal pillar before the grinding occurs).

The connection joint can be formed from a wide variety of materials including copper, gold, nickel, palladium, tin, alloys thereof, and combinations thereof, can be formed by a wide variety of processes including electroplating, electroless plating, ball bonding, wire bonding, stud bumping, solder reflowing, conductive adhesive curing, and welding, and can have a wide variety of shapes and sizes. The shape and composition of the connection joint depends on the composition of the routing line as well as design and reliability considerations. Further details regarding an electroplated connection joint are disclosed in U.S. application Ser. No. 09/865,367 filed May 24, 2001 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. application Ser. No. 09/864,555 filed May 24, 2001 by Charles W. C. Lin entitled "Semiconductor Chip Assembly with Simultaneously Electrolessly Plated Contact Terminal and Connection Joint" which is incorporated by reference. Further details regarding a ball bond connection joint are disclosed in U.S. application Ser. No. 09/864,773 filed May 24, 2001 by Charles W. C. Lin entitled "Semiconductor Chip Assembly with Ball Bond Connection Joint" which is incorporated by reference. Further details regarding a solder or conductive adhesive connection joint are disclosed in U.S. application Ser. No. 09/927,216 filed Aug. 10, 2001 by Charles W. C. Lin entitled "Semiconductor Chip Assembly with Hardened Connection Joint" which is incorporated by reference. Further details regarding a welded connection joint are disclosed in U.S. application Ser. No. 10/302,642 filed Nov. 23, 2002 by Cheng-Lien Chiang et al. entitled "Method of Connecting a Conductive Trace to a Semiconductor Chip Using Plasma Undercut Etching" which is incorporated by reference.

After the connection joint is formed, if a plating bus exists then it is disconnected from the conductive trace. The plating bus can be disconnected by mechanical sawing, laser cutting, chemical etching, and combinations thereof. If the plating bus is disposed about the periphery of the assembly but is not integral to the assembly, then the plating bus can be disconnected when the assembly is singulated from other assemblies. However, if the plating bus is integral to the assembly, or singulation has already occurred, then a photolithography step can be added to selectively cut related circuitry on the assembly that is dedicated to the plating bus since this circuitry would otherwise short the conductive traces together. Furthermore, the plating bus can be disconnected by etching the metal base.

A soldering material or solder ball can be deposited on the conductive trace by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly.

Various cleaning steps, such as a brief oxygen plasma cleaning step, or a brief wet chemical cleaning step using a solution containing potassium permanganate, can be applied to the structure at various stages, such as immediately before forming the connection joint to clean the routing line and the pad.

It is understood that, in the context of the present invention, any chip embedded in the encapsulant is electrically connected to the metal pillar by an electrically conductive path that includes the routing line means that the routing line is in an electrically conductive path between the metal pillar and any chip embedded in the encapsulant. This is true regardless of whether a single chip is embedded in the encapsulant (in which case the chip is electrically connected to the metal pillar by an electrically conductive path that includes the routing line) or multiple chips are embedded in the encapsulant (in which case each of the chips is electrically connected to the metal pillar by an electrically conductive path that includes the routing line). This is also true regardless of whether the electrically conductive path includes or requires a connection joint between the routing line and the chip. This is also true regardless of whether the electrically conductive path includes or requires a passive component such as a capacitor or a resistor. This is also true regardless of whether multiple chips are electrically connected to the routing line by multiple connection joints, and the multiple connection joints are electrically connected to one another only by the routing line. This is also true regardless of whether multiple chips are electrically connected to the metal pillar by different electrically conductive paths (such as the multiple connection joint example described above) as long as each of the electrically conductive paths includes the routing line.

It is also understood that, in the context of the present invention, the metal pillar extends across most or all of a thickness of the chip and any other chip embedded in the encapsulant means that the metal pillar extends across most or all of a thickness of any chip embedded in the encapsulant. This is true regardless of whether a single chip is embedded in the encapsulant (in which case the metal pillar extends across most or all of a thickness of the chip) or multiple chips are embedded in the encapsulant (in which case the metal pillar extends across most or all of a thickness of each of the chips).

It is also understood that, in the context of the present invention, the metal pillar consists of metal balls that are welded together means that the metal balls are each welded to another metal ball. This is true regardless of whether the metal pillar consists of two metal balls (in which case the metal balls are each welded to every other metal ball) or three metal balls (in which case the top and bottom metal balls are welded to the middle metal ball and spaced from one another).

It is also understood that, in the context of the present invention, forming the metal pillar by welding the metal pillar only to the routing line and then forming the encapsulant means that the metal pillar is welded only to the routing line before forming the encapsulant. This is true regardless of whether a plated terminal is electrolessly plated on and in contact with the metal pillar after forming the encapsulant (in which case the metal pillar remains welded only to the routing line) or a wire bond is wedge bonded to the metal pillar after forming the encapsulant (in which case the metal pillar is welded to the routing line and the wire bond).

The "upward" and "downward" vertical directions do not depend on the orientation of the assembly, as will be readily apparent to those skilled in the art. For instance, the metal pillar extends vertically beyond the routing line in the "upward" direction, the encapsulant extends vertically beyond the routing line in the "upward" direction, the tapered pillar extends vertically beyond the routing line in the "downward" direction, and the insulative base extends vertically beyond the chip in the "downward" direction, regardless of whether the assembly is inverted and/or mounted on a printed circuit board. Likewise, the routing line extends "laterally" beyond the metal pillar towards the chip regardless of whether the assembly is inverted, rotated or slanted. Thus, the "upward" and "downward" directions are opposite one another and orthogonal to the "lateral" direction, and the "laterally aligned" surfaces are coplanar with one another in a lateral plane orthogonal to the upward and downward directions. Moreover, the metal pillar is shown above the routing line, the chip is shown above the insulative base, and the encapsulant is shown above the routing line and the insulative base with a single orientation throughout the drawings for ease of comparison between the figures, although the assembly and its components may be inverted at various manufacturing stages.

The working format for the semiconductor chip assembly can be a single assembly or multiple assemblies based on the manufacturing design. For instance, a single assembly that includes a single chip can be manufactured individually. Alternatively, numerous assemblies can be simultaneously batch manufactured on a single metal base with a single insulative base and a single encapsulant and then separated from one another. For example, routing lines for multiple assemblies can be simultaneously electroplated on the metal base, then separate spaced solder masks for the respective assemblies can be simultaneously photolithographically patterned on the metal base and the routing lines, then the metal pillars can be welded to the corresponding routing lines, then separate spaced adhesives for the respective assemblies can be selectively disposed on the metal base, then the chips can be disposed on the corresponding adhesives, then the adhesives can be simultaneously fully cured, then the connection joints can be formed on the corresponding routing lines and pads, then the encapsulant can be deposited, then the encapsulant and the metal pillars can be grinded, then the metal base can be etched and removed, then the insulative base can be formed, then the plated terminals can be simultaneously electrolessly plated on the respective assemblies, then the solder terminals can be deposited and simultaneously reflowed on the respective plated terminals, and then the encapsulant and the insulative base can be cut, thereby separating the individual single chip-substrate assemblies.

The semiconductor chip assembly can have a wide variety of packaging formats as required by the next level assembly. For instance, the conductive traces can be configured so that the assembly is a grid array such as a ball grid array (BGA), column grid array (CGA), land grid array (LGA) or pin grid array (PGA).

The semiconductor chip assembly can be a first-level package that is a single-chip package (such as the first to twenty-fourth embodiments) or a multi-chip package (such as the twenty-fifth embodiment). Furthermore, a multi-chip first-level package can include chips that are stacked and vertically aligned with one another or are coplanar and laterally aligned with one another.

Advantageously, the semiconductor chip assembly of the present invention is reliable and inexpensive. The encapsulant and the insulative base can protect the chip from handling damage, provide a known dielectric barrier for the conductive trace and protect the assembly from contaminants and unwanted solder reflow during the next level assembly. The encapsulant can provide mechanical support for the conductive trace after the metal base is removed. The mode of the chip connection can shift from the initial mechanical coupling to metallurgical coupling to assure sufficient metallurgical bond strength. The conductive trace can include a robust, permanent weld between the routing line and the metal pillar that enhances strength and reliability. Furthermore, the conductive trace can be mechanically and metallurgically coupled to the chip without wire bonding, TAB, solder or conductive adhesive, although the process is flexible enough to accommodate these techniques if desired. The process is highly versatile and permits a wide variety of mature connection joint technologies to be used in a unique and improved manner. The metal pillar can extend vertically across most or all of the chip thickness and the conductive trace can extend vertically across the assembly thickness and be exposed in the upward and downward directions to provide vertical routing that facilitates a three-dimensional stacked arrangement. Furthermore, the tapered pillar is particularly well-suited for reducing thermal mismatch related stress in the next level assembly and yields enhanced reliability for the next level assembly that exceeds that of conventional BGA packages. As a result, the assembly of the present invention significantly enhances throughput, yield and performance characteristics compared to conventional packaging techniques. Moreover, the assembly of the present invention is well-suited for use with materials compatible with copper chip requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

We claim:

1. A semiconductor chip assembly, comprising:
   a semiconductor chip that includes first and second opposing surfaces, wherein the first surface of the chip includes a conductive pad;
   a conductive trace that includes a routing line and a metal pillar;
   a connection joint that electrically connects the routing line and the pad; and
   an encapsulant that includes first and second opposing surfaces, wherein the first surface of encapsulant faces in a first direction, the second surface of the encapsulant faces in a second direction opposite the first direction, the chip, the metal pillar and the encapsulant extend vertically beyond the routing line in the first direction, the routing line extends laterally beyond the metal pillar towards the chip and extends vertically beyond the chip and the metal pillar in the second direction, the metal pillar is disposed outside a periphery of the chip, is metallurgically welded to the routing line, extends vertically across most or all of a thickness of the chip between the first and second surfaces of the chip and consists of stacked metal balls that are metallurgically welded together, and the chip and the metal balls are embedded in the encapsulant.

2. The assembly of claim 1, wherein the chip is the only chip embedded in the encapsulant.

3. The assembly of claim 1, wherein the routing line is disposed vertically beyond the chip and the metal pillar in the second direction.

4. The assembly of claim 1, wherein the metal pillar extends vertically beyond the chip in the first direction.

5. The assembly of claim 1, wherein the metal pillar extends vertically beyond the chip in the second direction.

6. The assembly of claim 1, wherein the metal pillar extends vertically beyond the chip in the first and second directions.

7. The assembly of claim 1, wherein the metal pillar is welded only to the routing line.

8. The assembly of claim 1, wherein the metal pillar is disposed within a periphery of the routing line.

9. The assembly of claim 1, wherein the metal pillar is laterally aligned with the first surface of the encapsulant.

10. The assembly of claim 1, wherein the metal pillar is not covered in the first direction by the encapsulant or any other insulative material of the assembly.

11. The assembly of claim 1, wherein the metal pillar is not covered in the second direction by the encapsulant or any other insulative material of the assembly.

12. The assembly of claim 1, wherein the metal pillar has a substantially cylindrical shape.

13. The assembly of claim 1, wherein the metal pillar consists of three or more metal balls.

14. The assembly of claim 1, wherein the metal balls are vertically aligned with one another.

15. The assembly of claim 1, wherein the metal balls have essentially identical peripheries.

16. The assembly of claim 1, wherein the metal balls have substantially spherical shapes.

17. The assembly of claim 1, wherein each metal ball includes a ball bond.

18. The assembly of claim 1, wherein each metal ball consists essentially of a ball bond.

19. The assembly of claim 1, wherein each metal ball is a ball bond.

20. The assembly of claim 1, wherein each metal ball includes a solder coating and a coated metal, the solder coating contacts the encapsulant and the coated metal, and the coated metal is spaced from the encapsulant and is devoid of solder.

21. The assembly of claim 1, wherein each metal ball is metallurgically welded to one or two other metal balls.

22. The assembly of claim 1, wherein the encapsulant covers the chip.

23. The assembly of claim 1, wherein the encapsulant contacts the chip and the metal balls.

24. The assembly of claim 1, wherein the first surface of the encapsulant is laterally aligned with the second surface of the chip.

25. The assembly of claim 1, wherein an aperture extends from the first surface of the encapsulant to the metal pillar.

26. The assembly of claim 25, wherein the aperture is disposed outside the periphery of the chip, is vertically aligned with the metal pillar, extends into but not through the encapsulant and is spaced from the routing line.

27. The assembly of claim 25, wherein a solder terminal extends into the aperture, is electrically connected to the metal pillar in the aperture and extends vertically beyond the metal pillar in the first direction.

28. The assembly of claim 25, wherein the metal pillar does not extend to the first surface of the encapsulant, and the aperture is disposed outside the periphery of the chip, extends into but not through the encapsulant and is spaced from the routing line.

29. The assembly of claim 1, including an insulative base that contacts the routing line, is spaced from and overlapped by the chip and extends vertically beyond the chip, the metal pillar and the encapsulant in the second direction.

30. The assembly of claim 1, including an insulative adhesive that contacts the chip and extends vertically beyond the chip in the second direction.

31. The assembly of claim 1, including a solder terminal that is electrically connected to the metal pillar, extends vertically beyond the metal pillar and the encapsulant in the first direction and is spaced from the routing line and the connection joint.

32. The assembly of claim 1, including a solder terminal that is electrically connected to the routing line, extends vertically beyond the routing line and the encapsulant in the second direction and is spaced from the metal pillar and the connection joint.

33. The assembly of claim 1, including a solder terminal that is electrically connected to the metal pillar, extends vertically beyond the metal pillar and the encapsulant in the first direction and is spaced from the routing line and the connection joint, and another solder terminal that is electrically connected to the routing line, extends vertically beyond the routing line and the encapsulant in the second direction and is spaced from the metal pillar and the connection joint.

34. The assembly of claim 1, including a tapered pillar that contacts and is not metallurgically welded to the routing line, is disposed outside the periphery of the chip, is overlapped by the metal pillar and extends vertically beyond the chip, the routing line, the metal pillar and the encapsulant in the second direction.

35. The assembly of claim 34, wherein the metal pillar and the tapered pillar are vertically aligned with one another.

36. The assembly of claim 34, wherein the tapered pillar includes first and second opposing surfaces that are flat and parallel to one another and tapered sidewalls therebetween, the first surface of the tapered pillar faces towards and contacts the routing line, the second surface of the tapered pillar faces away from and is spaced from the routing line, and the tapered sidewalls slant inwardly towards the second surface of the tapered pillar.

37. The assembly of claim 36, wherein the second surface of the tapered pillar is concentrically disposed within a surface area of the first surface of the tapered pillar, and a surface area of the first surface of the tapered pillar is at least 20 percent larger than a surface area of the second surface of the tapered pillar.

38. The assembly of claim 1, wherein the assembly is a first-level package.

39. The assembly of claim 38, including a heat sink that is mechanically attached to the chip, electrically isolated from the chip, overlapped by the chip and disposed vertically beyond the chip and the conductive trace in the second direction.

40. The assembly of claim 38, including a ground plane that is mechanically attached to the routing line, electrically connected to the routing line, overlapped by the routing line and disposed vertically beyond the chip and the routing line in the second direction.

41. A semiconductor chip assembly, comprising:
a semiconductor chip that includes first and second opposing surfaces, wherein the first surface of the chip includes a conductive pad;
a conductive trace that includes a routing line and a metal pillar;
a connection joint that electrically connects the routing line and the pad; and
an encapsulant that includes first and second opposing surfaces, wherein the first surface of encapsulant faces in a first direction, the second surface of the encapsulant faces in a second direction opposite the first direction, the chip, the metal pillar and the encapsulant extend vertically beyond the routing line in the first direction, the routing line extends laterally beyond the metal pillar towards the chip and extends vertically beyond the chip and the metal pillar in the second direction, the metal pillar is disposed outside a periphery of the chip, is metallurgically welded to the routing line, extends vertically across most or all of a thickness of the chip between the first and second surfaces of the chip and consists of stacked metal balls that are metallurgically welded together, the metal balls each include a ball bond and are each metallurgically welded to one or two other metal balls, one metal ball is metallurgically welded to the routing line and the remaining metal balls are spaced from the routing line, and the chip and the metal balls are embedded in the encapsulant.

42. The assembly of claim 41, wherein the chip is the only chip embedded in the encapsulant.

43. The assembly of claim 41, wherein the routing line is disposed vertically beyond the chip and the metal pillar in the second direction, and the metal pillar is disposed within a periphery of the routing line.

44. The assembly of claim 41, wherein the metal pillar extends vertically beyond the chip in the first and second directions.

45. The assembly of claim 41, wherein the metal pillar is laterally aligned with the first surface of the encapsulant.

46. The assembly of claim 41, wherein the metal pillar is not covered in the first direction by the encapsulant or any other insulative material of the assembly, and the metal pillar is not covered in the second direction by the encapsulant or any other insulative material of the assembly.

47. The assembly of claim 41, wherein the metal pillar has a substantially cylindrical shape.

48. The assembly of claim 41, wherein the metal pillar consists of four or more metal balls.

49. The assembly of claim 41, wherein the metal balls are vertically aligned with one another.

50. The assembly of claim 41, wherein the metal balls have essentially identical peripheries.

51. The assembly of claim 41, wherein the metal balls have substantially spherical shapes.

52. The assembly of claim 41, wherein each metal ball consists essentially of a ball bond.

53. The assembly of claim 41, wherein each metal ball is a ball bond.

54. The assembly of claim 41, wherein each metal ball extends vertically between one-quarter and three-quarters of the thickness of the chip.

55. The assembly of claim 41, wherein the encapsulant contacts and covers the chip and contacts the metal balls.

56. The assembly of claim 41, including a tapered pillar that contacts and is not metallurgically welded to the routing line, is disposed outside the periphery of the chip, is overlapped by the metal pillar and extends vertically beyond the chip, the routing line, the metal pillar and the encapsulant in the second direction.

57. The assembly of claim 56, wherein the metal pillar and the tapered pillar are vertically aligned with and spaced from one another, and the tapered pillar is not embedded in the encapsulant.

58. The assembly of claim 57, wherein the tapered pillar includes first and second opposing surfaces that are flat and parallel to one another and tapered sidewalls therebetween, the first surface of the tapered pillar faces towards and contacts the routing line, the second surface of the tapered pillar faces away from and is spaced from the routing line, and the tapered sidewalls slant inwardly towards the second surface of the tapered pillar.

59. The assembly of claim 58, wherein the second surface of the tapered pillar is concentrically disposed within a surface area of the first surface of the tapered pillar, and a surface area of the first surface of the tapered pillar is at least 20 percent larger than a surface area of the second surface of the tapered pillar.

60. The assembly of claim 41, wherein the assembly is a first-level package.

61. A method of making a semiconductor chip assembly, comprising:
providing a routing line; then
mechanically attaching a semiconductor chip to the routing line, wherein the chip includes first and second opposing surfaces, and the first surface of the chip includes a conductive pad;
forming a connection joint that electrically connects the routing line and the pad;
forming a metal pillar that is metallurgically welded to the routing line, wherein forming the metal pillar includes metallurgically welding a first metal ball to the routing line and then metallurgically welding a second metal ball to the first metal ball without contacting the second metal ball to the routing line, the metal pillar consists of stacked metal balls that include the first and second metal balls and each metal ball is metallurgically welded to another metal ball; and
forming an encapsulant after attaching the chip to the routing line and forming the metal pillar, wherein the encapsulant includes a first surface that faces in a first direction and a second surface that faces in a second direction opposite the first direction, the chip and the metal balls are embedded in the encapsulant, the encapsulant covers the chip and extends vertically beyond the chip and the routing line in the first direction, the routing line extends laterally beyond the metal pillar towards the chip and extends vertically beyond the chip and the metal pillar in the second direction, and the metal pillar is disposed outside a periphery of the chip, extends vertically beyond the routing line in the first direction and extends vertically across most or all of a thickness of the chip between the first and second surfaces of the chip.

62. The method of claim 61, wherein providing the routing line includes selectively depositing the routing line on a metal base, attaching the chip to the routing line includes positioning the chip such that the metal base extends vertically beyond the chip in the second direction, and after forming the encapsulant, etching the metal base thereby reducing contact area between the metal base and the routing line.

63. The method of claim 62, wherein forming the routing line includes:
providing a plating mask on the metal base, wherein the plating mask includes an opening that exposes a portion of the metal base; and then
electroplating the routing line on the exposed portion of the metal base through the opening in the plating mask.

64. The method of claim 62, wherein etching the metal base removes a first portion of the metal base that contacts the routing line without removing a second portion of the metal base that contacts the routing line, thereby reducing but not eliminating contact area between the metal base and the routing line.

65. The method of claim 62, wherein etching the metal base removes a first portion of the metal base within a periphery of the pad without removing a second portion of the metal base outside the periphery of the pad.

66. The method of claim 62, wherein etching the metal base forms a tapered pillar from an unetched portion of the metal base, and the tapered pillar contacts the routing line, is disposed outside the periphery of the chip, is overlapped by the metal pillar and extends vertically beyond the chip, the routing line, the metal pillar and the encapsulant in the second direction.

67. The method of claim 62, wherein etching the metal base eliminates contact area between the metal base and the routing line.

68. The method of claim 62, wherein etching the metal base removes the metal base.

69. The method of claim 62, wherein etching the metal base electrically isolates the routing line from other routing lines formed on the metal base.

70. The method of claim 62, wherein etching the metal base electrically isolates the pad from other conductive pads of the chip.

71. The method of claim 61, wherein welding the first metal ball to the routing line includes ball bonding, and welding the second metal ball to the first metal ball includes ball bonding.

72. The method of claim 61, wherein welding the first metal ball to the routing line includes wedge bonding, and welding the second metal ball to the first metal ball includes wedge bonding.

73. The method of claim 61, wherein welding the first metal ball to the routing line includes thermocompression bonding, and welding the second metal ball to the first metal ball includes thermocompression bonding.

74. The method of claim 61, wherein welding the first metal ball to the routing line includes thermosonic bonding, and welding the second metal ball to the first metal ball includes thermosonic bonding.

75. The method of claim 61, wherein welding the first metal ball to the routing line includes ultrasonic bonding, and welding the second metal ball to the first metal ball includes ultrasonic bonding.

76. The method of claim 61, wherein welding the first metal ball to the routing line includes stud bumping, and welding the second metal ball to the first metal ball includes stud bumping.

77. The method of claim 61, wherein welding the first metal ball to the routing line includes forming a first ball bond on the routing line, and welding the second metal ball to the first metal ball includes forming a second ball bond on the first metal ball.

78. The method of claim 77, wherein forming the first ball bond includes thermocompression bonding, and forming the second ball bond includes thermocompression bonding.

79. The method of claim 77, wherein forming the first ball bond includes thermosonic bonding, and forming the second ball bond includes thermosonic bonding.

80. The method of claim 77, wherein forming the first ball bond includes stud bumping, and forming the second ball bond includes stud bumping.

81. The method of claim 61, wherein forming the encapsulant includes depositing the encapsulant such that the encapsulant covers the metal pillar in the first direction and the metal pillar is not exposed, and after forming the encapsulant, removing a portion of the encapsulant thereby exposing the metal pillar.

82. The method of claim 81, wherein removing the portion of the encapsulant includes applying a laser that ablates the encapsulant.

83. The method of claim 81, wherein removing the portion of the encapsulant includes applying a plasma that etches the encapsulant.

84. The method of claim 81, wherein removing the portion of the encapsulant includes grinding the encapsulant.

85. The method of claim 81, wherein removing the portion of the encapsulant includes grinding the encapsulant without grinding the metal pillar, and then grinding the encapsulant and the metal pillar.

86. The method of claim 81, wherein removing the portion of the encapsulant laterally aligns the first surface of the encapsulant and the metal pillar.

87. The method of claim 81, wherein removing the portion of the encapsulant exposes the chip.

88. The method of claim 81, wherein removing the portion of the encapsulant exposes the second surface of the chip and laterally aligns the first surface of the encapsulant and the second surface of the chip.

89. The method of claim 81, wherein removing the portion of the encapsulant exposes the second surface of the chip and laterally aligns the first surface of the encapsulant, the second surface of the chip and the metal pillar.

90. The method of claim 81, wherein forming the encapsulant includes depositing the encapsulant on the metal pillar such the encapsulant does not cover the metal pillar in the first direction and the metal pillar is exposed.

91. The method of claim 61, wherein forming the connection joint includes electroplating the connection joint on the routing line and the pad.

92. The method of claim 61, wherein forming the connection joint includes electrolessly plating the connection joint on the routing line and the pad.

93. The method of claim 61, wherein forming the connection joint includes depositing a non-solidified material on the routing line and the pad and then hardening the non-solidified material.

94. The method of claim 61, wherein forming the connection joint includes providing a wire bond.

95. The method of claim 61, including attaching the chip to the routing line before forming the metal pillar.

96. The method of claim 61, including attaching the chip to the routing line after forming the metal pillar.

97. The method of claim 61, including forming the connection joint before forming the metal pillar.

98. The method of claim 61, including forming the connection joint after forming the metal pillar.

99. The method of claim 61, including forming the connection joint before forming the encapsulant.

100. The method of claim 61, including forming the connection joint after forming the encapsulant.

101. The method of claim 61, including fracturing a wire after forming the metal pillar and before forming the encapsulant, thereby detaching the wire from the metal pillar.

102. The method of claim 61, including etching the metal pillar after forming the encapsulant, thereby forming an aperture in the encapsulant that extends from the first surface of the encapsulant to the metal pillar.

103. The method of claim 102, wherein the aperture extends into but not through the encapsulant and is spaced from the routing line.

104. The method of claim 61, including providing an insulative base that contacts the routing line, is spaced from and overlapped by the chip and extends vertically beyond the chip, the metal pillar and the encapsulant in the second direction.

105. The method of claim 61, including providing an insulative adhesive that attaches the chip to the routing line before forming the encapsulant.

106. The method of claim 61, including providing a solder terminal that is electrically connected to the metal pillar, extends vertically beyond the metal pillar and the encapsulant in the first direction and is spaced from the routing line and the connection joint.

107. The method of claim 106, including depositing the solder terminal on and in contact with the metal pillar.

108. The method of claim 106, including electrolessly plating a plated terminal on and in contact with the metal pillar, and then depositing the solder terminal on and in contact with the plated terminal and spaced from the metal pillar.

109. The method of claim 61, including providing a solder terminal that is electrically connected to the routing line, extends vertically beyond the routing line and the encapsulant in the second direction and is spaced from the metal pillar and the connection joint.

110. The method of claim 61, wherein the assembly is a first-level package.

111. A method of making a semiconductor chip assembly, comprising:
providing a routing line; then
mechanically attaching a semiconductor chip to the routing line, wherein the chip includes first and second opposing surfaces, and the first surface of the chip includes a conductive pad;
forming a connection joint that electrically connects the routing line and the pad;
forming a metal pillar that is metallurgically welded to and only to the routing line, wherein forming the metal pillar includes metallurgically welding a first metal ball to the routing line by ball bonding using a capillary to press a first wire ball against the routing line and then metallurgically welding a second metal ball to the first metal ball by ball bonding using the capillary to press a second wire ball against the first metal ball without contacting the second metal ball and the routing line, the metal pillar consists of stacked metal balls that include the first and second metal balls and each metal ball is metallurgically welded to another metal ball by ball bonding using the capillary; and
forming an encapsulant after attaching the chip to the routing line and forming the metal pillar, wherein the encapsulant includes a first surface that faces in a first direction and a second surface that faces in a second direction opposite the first direction, the chip and the metal balls are embedded in the encapsulant, the encapsulant covers the chip and extends vertically beyond the chip and the routing line in the first direction, the routing line extends laterally beyond the metal pillar towards the chip and extends vertically beyond the chip and the metal pillar in the second direction, and the metal pillar is disposed outside a periphery of the chip, extends vertically beyond the routing line in the first direction and extends vertically across most or all of a thickness of the chip between the first and second surfaces of the chip.

112. The method of claim 111, wherein providing the routing line includes selectively depositing the routing line on a metal base, attaching the chip to the routing line includes positioning the chip such that the metal base extends vertically beyond the chip in the second direction, and after forming the encapsulant, etching the metal base thereby reducing contact area between the metal base and the routing line.

113. The method of claim 112, wherein etching the metal base forms a tapered pillar from an unetched portion of the metal base, and the tapered pillar contacts the routing line, is disposed outside the periphery of the chip, is overlapped by the metal pillar and extends vertically beyond the chip, the routing line, the metal pillar and the encapsulant in the second direction.

114. The method of claim 112, wherein etching the metal base eliminates contact area between the metal base and the routing line.

115. The method of claim 111, wherein welding the first metal ball to the routing line includes thermosonic bonding, and welding the second metal ball to the first metal ball includes thermosonic bonding.

116. The method of claim 111, wherein welding the first metal ball to the routing line includes stud bumping, and welding the second metal ball to the first metal ball includes stud bumping.

117. The method of claim 111, wherein forming the encapsulant includes depositing the encapsulant such that the encapsulant contacts and covers the chip and the metal pillar in the first direction and the metal pillar is not exposed, and after forming the encapsulant, removing a portion of the encapsulant thereby exposing the metal pillar.

118. The method of claim 117, wherein removing the portion of the encapsulant includes grinding the encapsulant without grinding the metal pillar, and then grinding the encapsulant and the metal pillar.

119. The method of claim 111, including attaching the chip to the routing line after forming the metal pillar.

120. The method of claim 111, including fracturing a wire after forming the metal pillar and before forming the encapsulant, thereby detaching the wire from the metal pillar.

121. The method of claim 120, wherein the metal pillar consists essentially of stacked ball bonds after fracturing the wire and before forming the encapsulant.

122. The method of claim 120, wherein the metal pillar consists of stacked ball bonds and a stud bump stacked on the ball bonds after fracturing the wire and before forming the encapsulant.

123. The method of claim 111, including etching the metal pillar after forming the encapsulant, thereby forming an aperture in the encapsulant that extends from the first surface of the encapsulant to the metal pillar, extends into but not through the encapsulant and is spaced from the routing line.

124. The method of claim 111, including depositing a solder terminal on and in contact with the metal pillar after forming the encapsulant, wherein the solder terminal is electrically connected to the metal pillar, extends vertically beyond the metal pillar and the encapsulant in the first direction and is spaced from the routing line and the connection joint.

125. The method of claim 111, including electrolessly plating a plated terminal on and in contact with the metal pillar after forming the encapsulant, and then depositing a solder terminal on and in contact with the plated terminal, wherein the solder terminal is electrically connected to the metal pillar, extends vertically beyond the metal pillar, the plated terminal and the encapsulant in the first direction and is spaced from the routing line, the metal pillar and the connection joint.

126. The method of claim 111, wherein the metal pillar consists of three or more metal balls.

127. The method of claim 111, wherein the metal balls are vertically aligned with one another and have essentially identical peripheries.

128. The method of claim 111, wherein each metal ball consists essentially of a ball bond.

129. The method of claim 111, wherein the metal pillar consists of three or more metal balls, the metal balls are vertically aligned with one another and have essentially identical peripheries and each metal ball consists essentially of a ball bond.

130. The method of claim 111, wherein the assembly is a first-level package.

131. A method of making a semiconductor chip assembly, comprising:
providing a routing line; then
mechanically attaching a semiconductor chip to the routing line, wherein the chip includes first and second opposing surfaces, and the first surface of the chip includes a conductive pad;
forming a connection joint that electrically connects the routing line and the pad;
forming a metal pillar that is metallurgically welded to and only to the routing line, wherein the metal pillar consists of stacked metal balls that include first and second metal balls, each metal ball is metallurgically welded to another metal ball by ball bonding using a capillary, and forming the metal pillar includes:
metallurgically welding the first metal ball to the routing line, including:
positioning the capillary with a first wire ball extending therefrom over the routing line, wherein the first wire ball is connected to a wire that is fed through the capillary;
moving the capillary towards the routing line so that the first wire ball contacts the routing line and deforms into a first ball bond and remains connected to the wire; and
moving the capillary away from the routing line, disconnecting the first ball bond from the wire, and cooling the first ball bond so that the first ball bond contacts and is welded to and electrically connected to the routing line; and then
metallurgically welding the second metal ball to the first metal ball, including:
positioning the capillary with a second wire ball extending therefrom over the first metal ball, wherein the second wire ball is connected to the wire that is fed through the capillary;
moving the capillary towards the first metal ball so that the second wire ball contacts the first metal ball and deforms into a second ball bond and remains connected to the wire; and
moving the capillary away from the first metal ball, disconnecting the second ball bond from the wire, and cooling the second ball bond so that the second ball bond contacts and is welded to and electrically connected to the first metal ball; and forming an encapsulant after attaching the chip to the routing line and forming the metal pillar, wherein the encapsulant includes a first surface that faces in a first direction and a second surface that faces in a second direction opposite the first direction, the chip and the metal balls are embedded in the encapsulant, the encapsulant covers the chip and extends vertically beyond the chip and the routing line in the first direction, the routing line extends laterally beyond the metal pillar towards the chip and extends vertically beyond the chip and the metal pillar in the second direction, and the metal pillar is disposed outside a periphery of the chip, extends vertically beyond the routing line in the first direction and extends vertically across most or all of a thickness of the chip between the first and second surfaces of the chip.

132. The method of claim 131, wherein providing the routing line includes selectively depositing the routing line on a metal base, attaching the chip to the routing line includes positioning the chip such that the metal base extends vertically beyond the chip in the second direction, and after forming the encapsulant, etching the metal base thereby reducing contact area between the metal base and the routing line.

133. The method of claim 132, wherein etching the metal base forms a tapered pillar from an unetched portion of the metal base, and the tapered pillar contacts the routing line, is disposed outside the periphery of the chip, is overlapped by the metal pillar and extends vertically beyond the chip, the routing line, the metal pillar and the encapsulant in the second direction.

134. The method of claim 132, wherein etching the metal base eliminates contact area between the metal base and the routing line.

135. The method of claim 131, wherein welding the first metal ball to the routing line includes thermosonic bonding, and welding the second metal ball to the first metal ball includes thermosonic bonding.

136. The method of claim 131, wherein welding the first metal ball to the routing line includes stud bumping, and welding the second metal ball to the first metal ball includes stud bumping.

137. The method of claim 131, wherein forming the encapsulant includes depositing the encapsulant such that the encapsulant contacts and covers the chip and the metal pillar in the first direction and the metal pillar is not exposed, and after forming the encapsulant, removing a portion of the encapsulant thereby exposing the metal pillar.

138. The method of claim 137, wherein removing the portion of the encapsulant includes grinding the encapsulant without grinding the metal pillar, and then grinding the encapsulant and the metal pillar.

139. The method of claim 131, including attaching the chip to the routing line after forming the metal pillar.

140. The method of claim 131, including fracturing the wire after forming the metal pillar and before forming the encapsulant, thereby detaching the wire from the metal pillar.

141. The method of claim 140, wherein the metal pillar consists essentially of stacked ball bonds after fracturing the wire and before forming the encapsulant.

142. The method of claim 140, wherein the metal pillar consists of stacked ball bonds and a stud bump stacked on the ball bonds after fracturing the wire and before forming the encapsulant.

143. The method of claim 131, including etching the metal pillar after forming the encapsulant, thereby forming an aperture in the encapsulant that extends from the first surface of the encapsulant to the metal pillar, extends into but not through the encapsulant and is spaced from the routing line.

144. The method of claim 131, including depositing a solder terminal on and in contact with the metal pillar after forming the encapsulant, wherein the solder terminal is electrically connected to the metal pillar, extends vertically beyond the metal pillar and the encapsulant in the first direction and is spaced from the routing line and the connection joint.

145. The method of claim 131, including electrolessly plating a plated terminal on and in contact with the metal pillar after forming the encapsulant, and then depositing a solder terminal on and in contact with the plated terminal, wherein the solder terminal is electrically connected to the metal pillar, extends vertically beyond the metal pillar, the plated terminal and the encapsulant in the first direction and is spaced from the routing line, the metal pillar and the connection joint.

146. The method of claim 131, wherein the metal pillar consists of three or more metal balls.

147. The method of claim 131, wherein the metal balls are vertically aligned with one another and have essentially identical peripheries.

148. The method of claim 131, wherein each metal ball consists essentially of a ball bond.

149. The method of claim 131, wherein the metal pillar consists of three or more metal balls, the metal balls are vertically aligned with one another and have essentially identical peripheries and each metal ball consists essentially of a ball bond.

150. The method of claim 131, wherein the assembly is a first-level package.

* * * * *